(12) United States Patent
Teeter et al.

(10) Patent No.: US 12,484,182 B2
(45) Date of Patent: Nov. 25, 2025

(54) RACK FRONT-TO-REAR CABLE ROUTING SYSTEM

(71) Applicant: Dell Products L.P., Round Rock, TX (US)

(72) Inventors: Victor Teeter, Round Rock, TX (US); Shree Rathinasamy, Round Rock, TX (US); James C. Slaughter, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 195 days.

(21) Appl. No.: 18/471,681

(22) Filed: Sep. 21, 2023

(65) Prior Publication Data

US 2024/0074084 A1 Feb. 29, 2024

Related U.S. Application Data

(63) Continuation-in-part of application No. 17/899,680, filed on Aug. 31, 2022, now Pat. No. 11,924,992.

(51) Int. Cl.
*H05K 7/14* (2006.01)
*H05K 7/18* (2006.01)

(52) U.S. Cl.
CPC ........... *H05K 7/1491* (2013.01); *H05K 7/183* (2013.01)

(58) Field of Classification Search
CPC ..... H05K 7/1491; H05K 5/0247; H05K 7/183
See application file for complete search history.

(56) References Cited

U.S. PATENT DOCUMENTS

| | | | | |
|---|---|---|---|---|
| 9,801,308 | B2 * | 10/2017 | Teeter | H05K 7/20709 |
| 11,785,735 | B2 * | 10/2023 | Nakanelua | H05K 7/1498 |
| | | | | 361/679.01 |
| 2010/0110628 | A1 * | 5/2010 | Barrenechea | H05K 7/1491 |
| | | | | 361/679.48 |
| 2023/0156377 | A1 * | 5/2023 | Schoenfelder | G02B 6/3624 |
| | | | | 385/135 |

* cited by examiner

*Primary Examiner* — Imani N Hayman
*Assistant Examiner* — Hung Q Dang
(74) *Attorney, Agent, or Firm* — Joseph Mencher

(57) ABSTRACT

A rack front-to-rear cable routing system includes a rack that defines a rack entrance and a rack exit, and a plurality of computing device housings between the rack entrance and rack exit. A plurality of computing devices are each positioned in a respective computing device housing. A rack front-to-rear cable routing device is positioned in one of the computing device housings and defines a plurality of protected cable conduits that extend between the rack entrance to the rack exit. A first cable is coupled to each of the plurality of computing devices and extends through a first protected cable conduit.

20 Claims, 38 Drawing Sheets

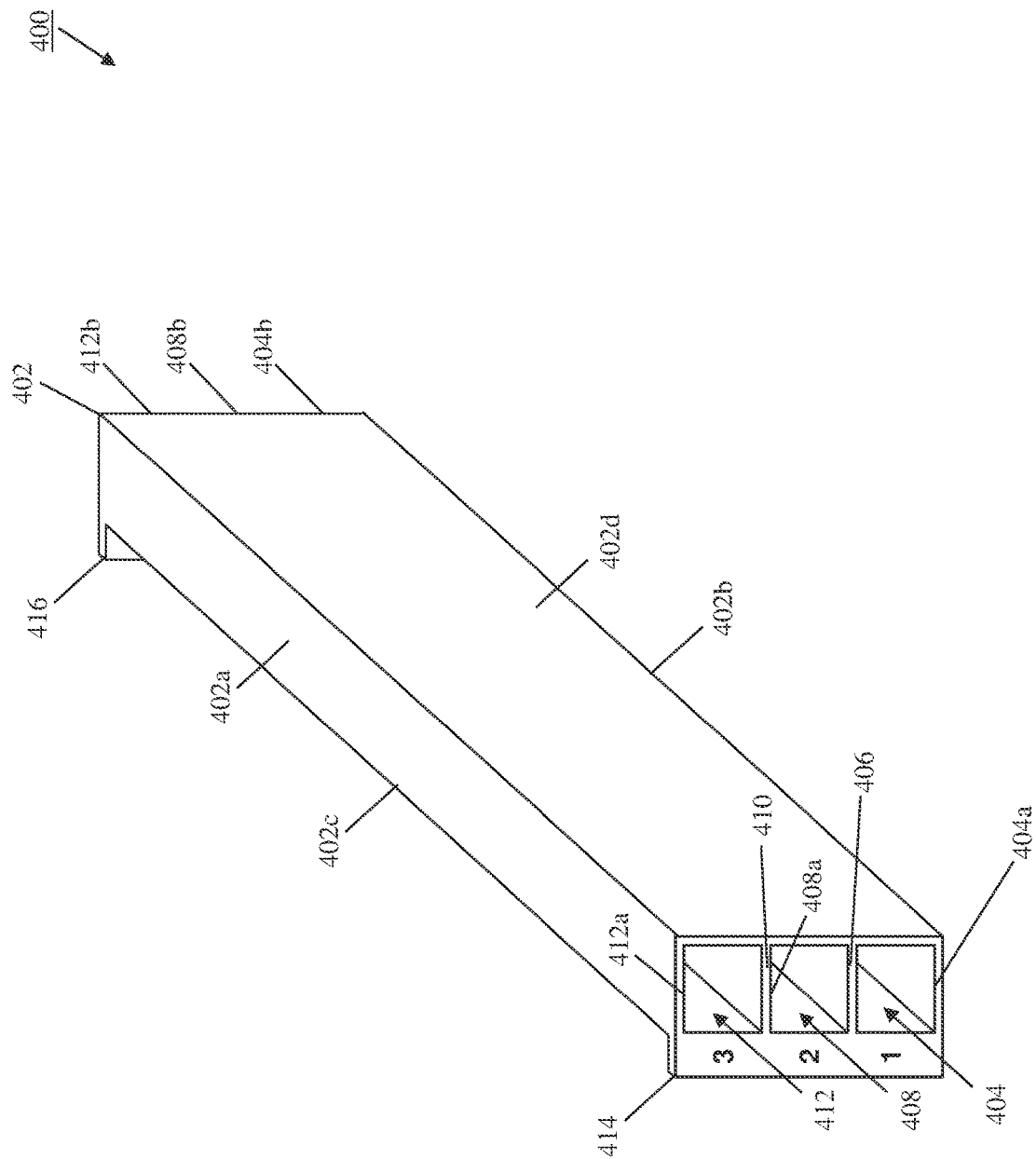

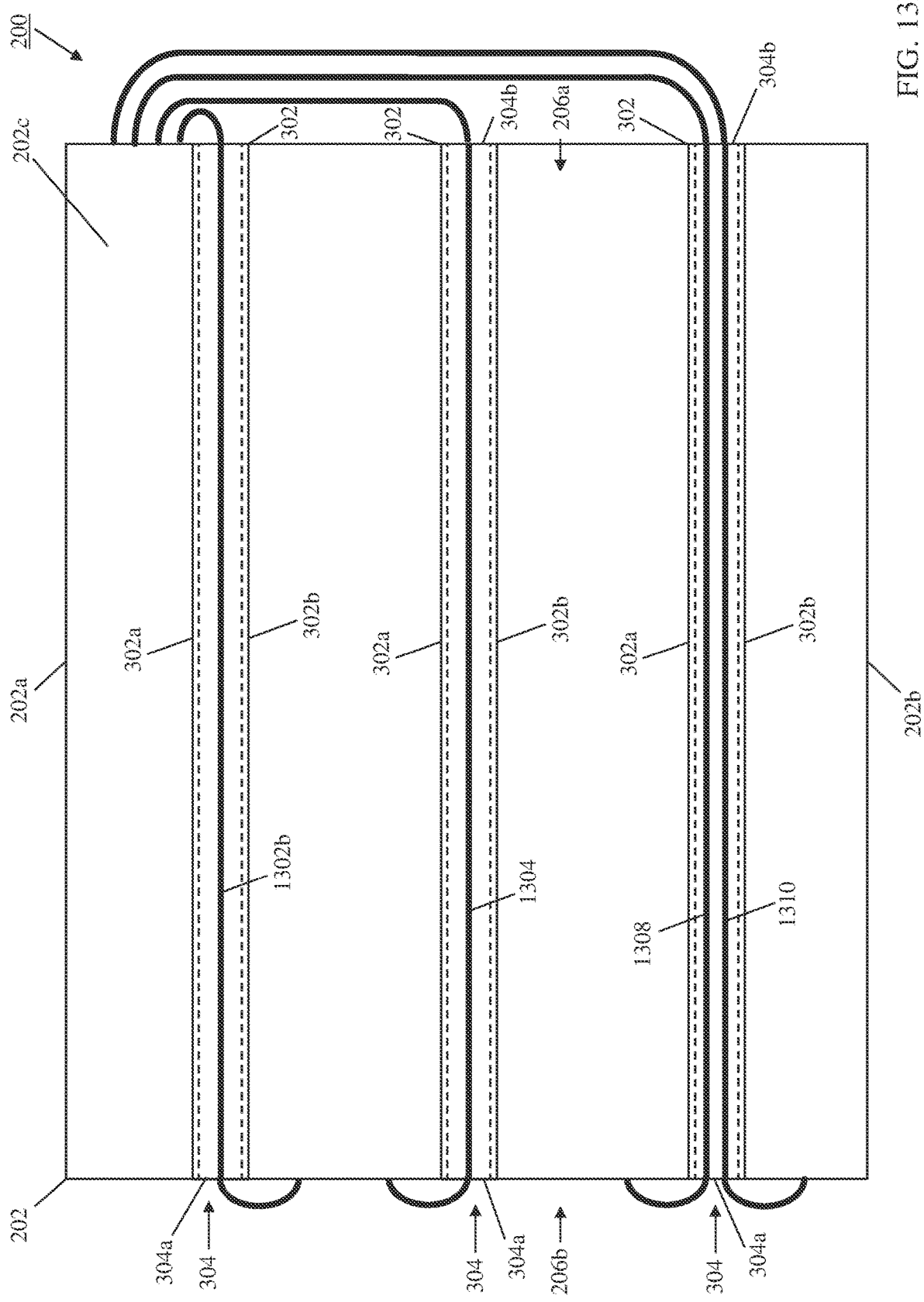

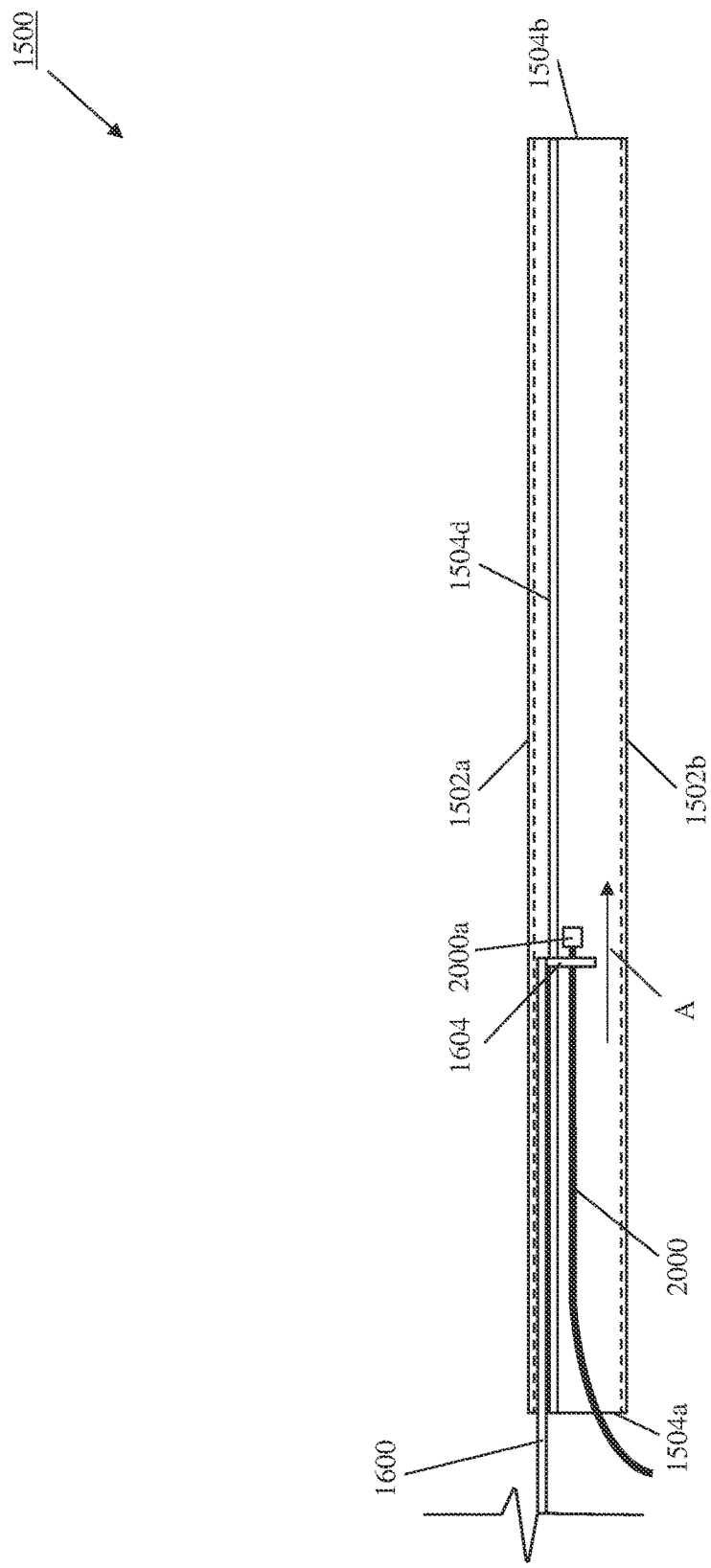

RACK FRONT-TO-REAR CABLE ROUTING SYSTEM

CROSS-REFERENCE TO RELATED APPLICATION

The present disclosure is a continuation-in-part of U.S. patent application Ser. No. 17/899,680, filed Aug. 31, 2022, the disclosure of which is incorporated by reference herein in its entirety.

BACKGROUND

The present disclosure relates generally to information handling systems, and more particularly to the routing of cables between the front and rear of a rack that houses information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, switch devices, storage systems, and/or other computing devices known in the art, are often provided in racks and coupled together in order to enable those computing devices to transmit data between each other. For example, multiple server devices and storage systems may be provided in a rack with a switch device and each cabled to that switch device in order to enable the data transmissions discussed above. The cabling of such computing devices in a rack can raise issues. For example, conventional server devices and storage systems often include networking ports or other connectors on their rear surface that is located adjacent a rear portion of the rack when those server devices and storage systems are positioned in the rack, while conventional switch devices often include networking ports or other connectors on their front surface that is located adjacent a front portion of the rack when those switch devices are positioned in the rack, and thus the cabling of the networking ports on the server devices and storage systems to the networking ports on the switch device may require that cabling extend between the front portion of the rack to the rear portion of the rack.

For example, in a random sampling of thirty racks in a datacenter, the inventors of the present disclosure found that every rack sampled included multiple cables extending from the front portion of the rack to the rear portion of the rack. In some cases, the cables extended over a top wall of the rack, in other cases the cables extended around a side wall of the rack, and in yet other cases the cables extended through computing device housings defined by the rack that currently did not have any computing devices located therein. As will be appreciated by one of skill in the art, the extending of cables around a side wall of a rack will often be limited due to the positioning of racks immediately adjacent each other in a manner that provides no space available in-between them for cabling. Furthermore, the extending of cables through computing device housings defined by the rack can hinder airflow through that rack that could otherwise be used to cool computing devices, while using up those computing device housings that could otherwise house computing devices and often resulting in the premature purchase of additional racks in order to house additional computing devices. Finally, cabling computing devices by extending cables between the front portion and rear portion of a rack is time consuming, presents difficulties when attempting to trace the connection of computing devices via such "front-to-rear" cabling, and can result in "cabling bunches" that present difficulties when moving a cable in the cabling bunch or attempting to position a computing device in a rack adjacent the cabling bunch.

Accordingly, it would be desirable to provide a rack cable routing system that addresses the issues discussed above.

SUMMARY

According to one embodiment, a rack front-to-rear cable routing device includes a rack front-to-rear cable routing device chassis that defines a rack front-to-rear cable routing device chassis entrance and a rack front-to-rear cable routing device chassis exit, and that is configured to be positioned in a first computing device housing defined by a rack; and a plurality of protected cable conduits that are defined by the rack front-to-rear cable routing device chassis and that each extend between the rack front-to-rear cable routing device chassis entrance and the rack front-to-rear cable routing device chassis exit, wherein each of the plurality of protected cable conduits is configured, when the rack front-to-rear cable routing device chassis is positioned in the first computing device housing defined by the rack, to house a cable that is coupled to a plurality of computing devices that are positioned in respective second computing device housings defined by the rack.

BRIEF DESCRIPTION OF THE DRAWINGS

FIG. 4 is a perspective view illustrating an embodiment of a rack front-to-rear cable routing device that may be used to provide the rack front-to-rear cable routing system of the present disclosure.

FIG. 13B is a schematic view illustrating an embodiment of cables routed between the computing devices and through the rack front-to-rear cable routing device in the rack of FIG. 10 during the method of FIG. 9.

FIG. 20C is a schematic side view illustrating an embodiment of the cable routing device of FIG. 20A routing a cable via the rack front-to-rear cable routing system of FIG. 19 during the method of FIG. 18.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
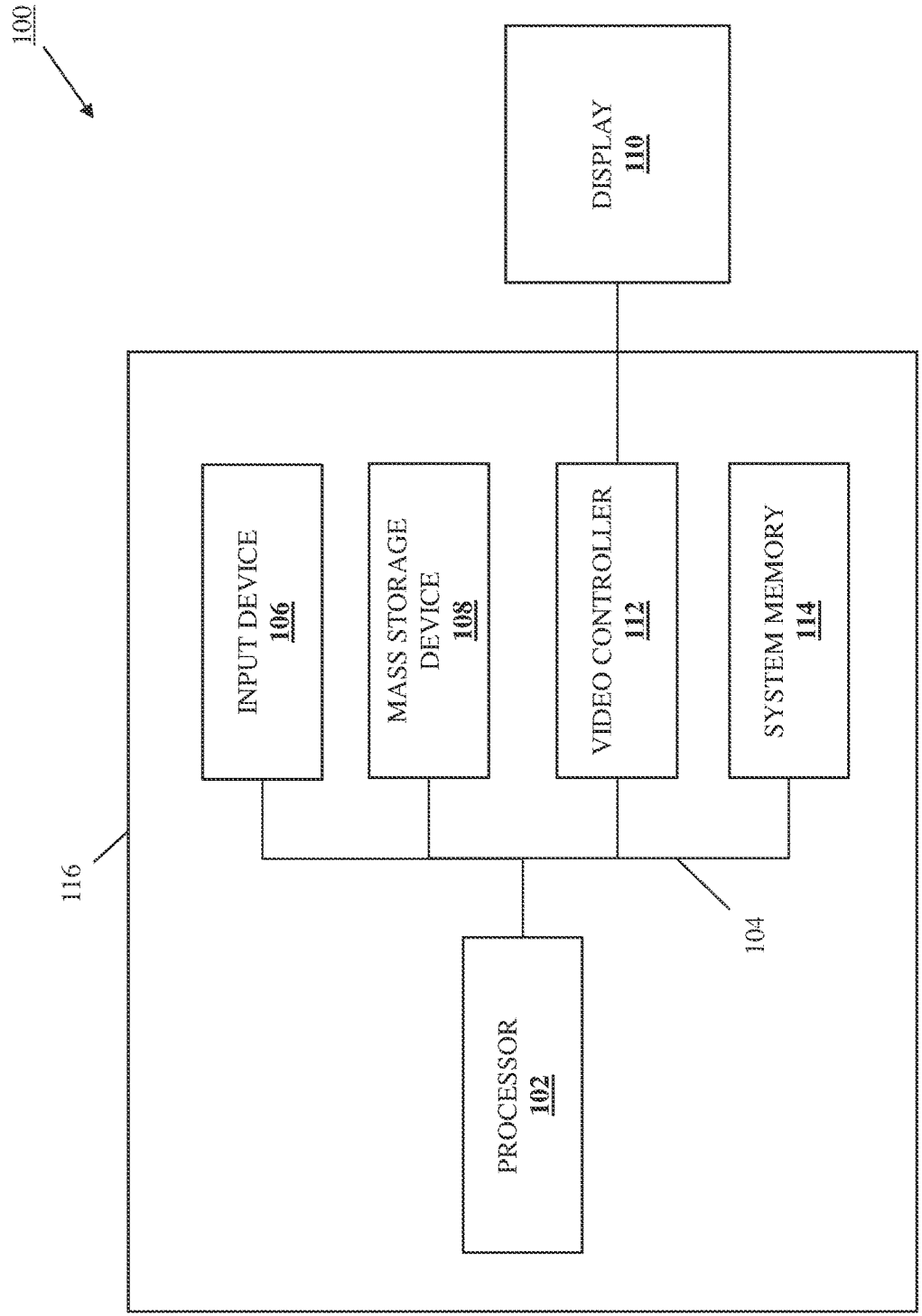
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
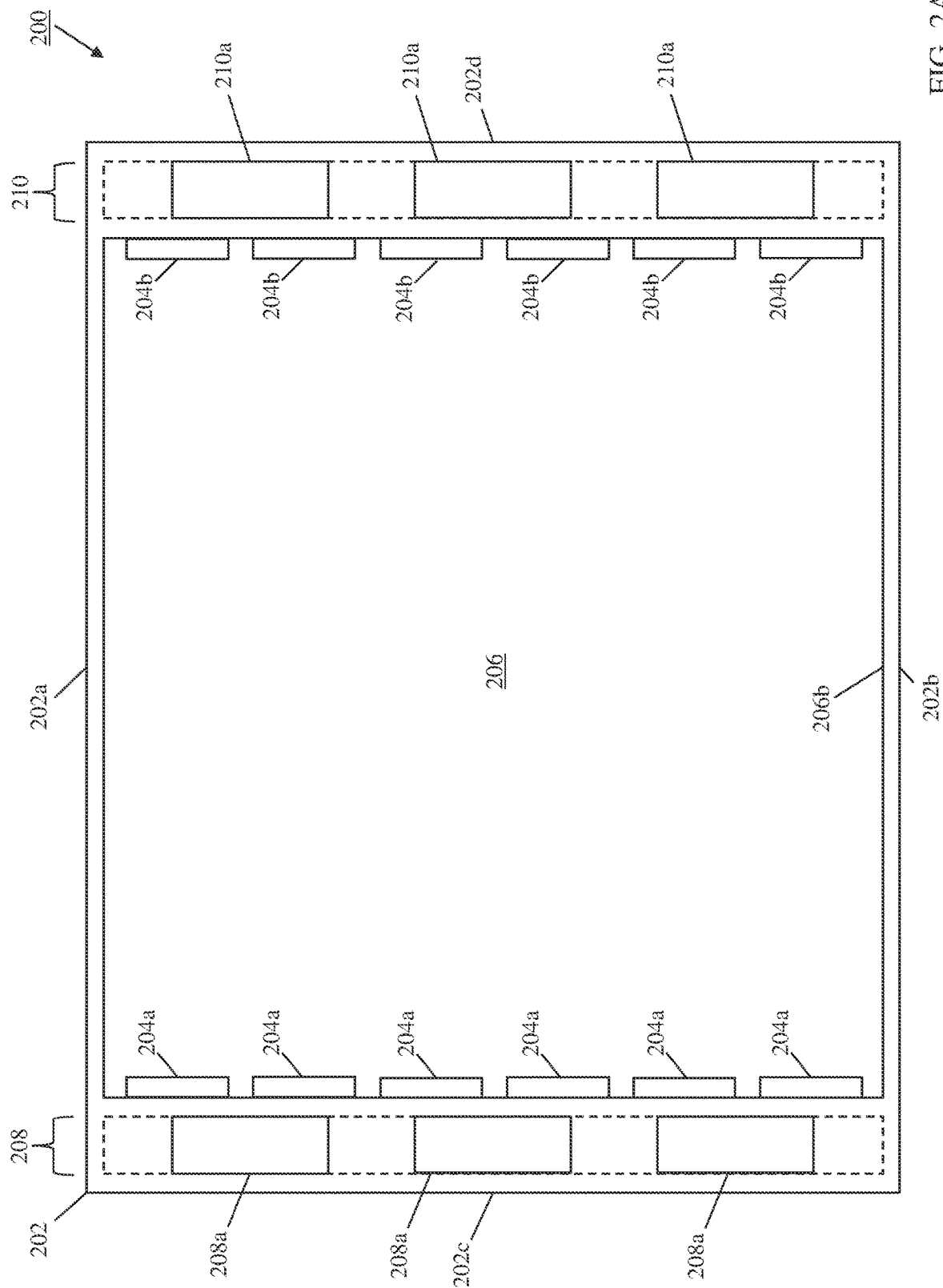
FIG. 2A is a schematic front view illustrating an embodiment of a rack that may include the rack front-to-rear cable routing system of the present disclosure.
Figure 2B:
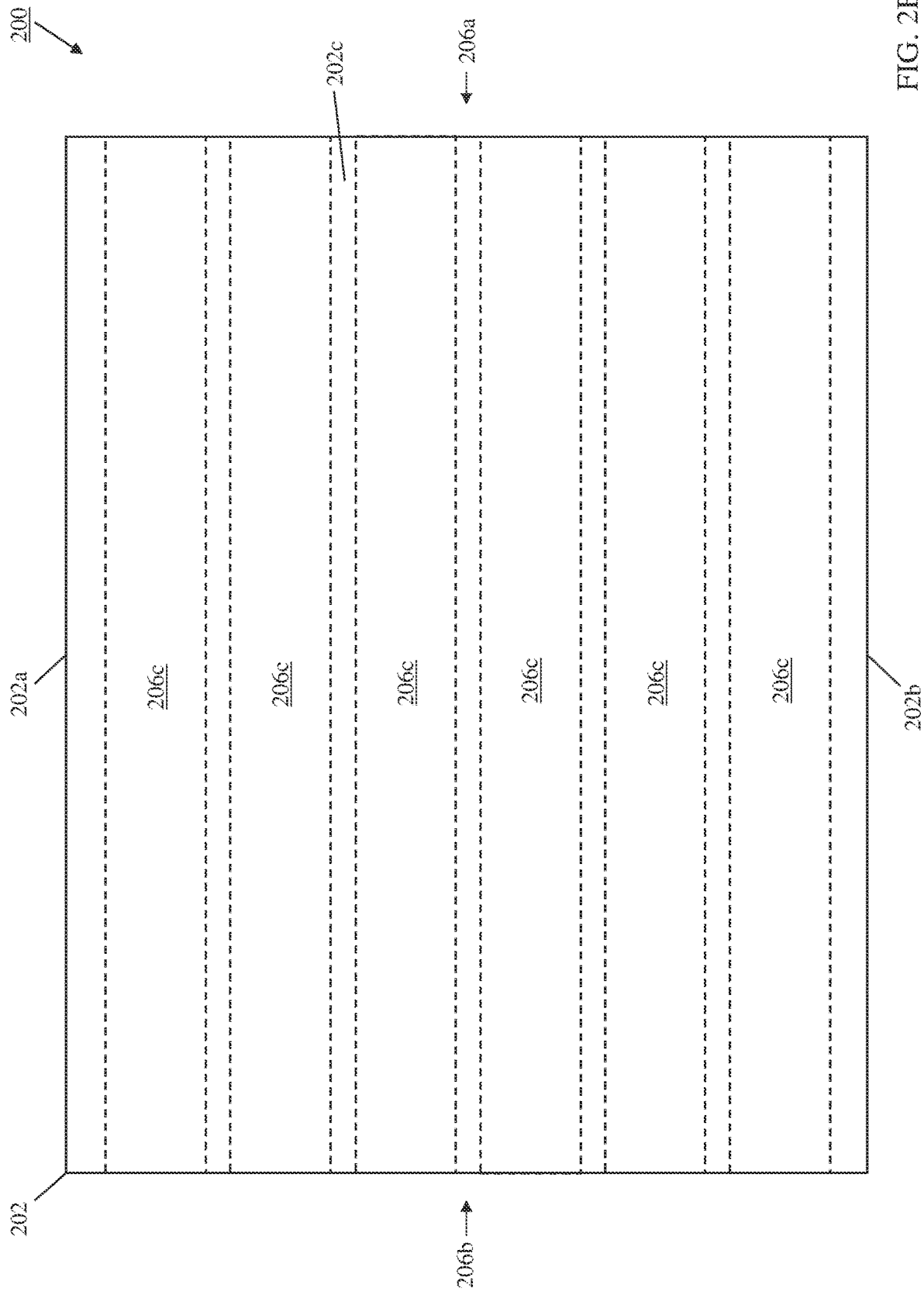
FIG. 2B is a schematic side view illustrating an embodiment of the rack of FIG. 2A.

Referring now to FIGS. 2A and 2B, an embodiment of a rack 200 is illustrated that may provide the rack front-to-rear cable routing system of the present disclosure. The rack 200 includes a rack chassis 202, and in the illustrated embodiment the rack chassis 202 includes a top wall 202a, a bottom wall 202b that is located opposite the rack chassis 202 from the top wall 202a, a pair of opposing side walls 202c and 202d that each extend between the top wall 202a and the bottom wall 202b and that are located opposite the rack chassis 202 from each other. A computing device mounting system is included on the rack chassis 202 and, in the illustrated embodiment, include a plurality of computing device mounting subsystems 204a that are located adjacent to and spaced apart from the side wall 202c of the rack chassis 202, and a plurality of computing device mounting subsystems 204b that are located adjacent to and spaced apart from the side wall 202d of the rack chassis 202.

As will be appreciated by one of skill in the art in possession of the present disclosure and as discussed below, respective pairs of the computing device mounting subsystems 204a and 204b on opposite sides of the rack chassis 202 are configured to couple to a respective computing device to allow that computing device to be positioned in the rack chassis 202, and thus any of the computing device mounting subsystems 204a and 204b may include computing device coupling/securing features for providing such functionality while remaining within the scope of the present disclosure. In a specific example, any or all of the computing device mounting subsystems 204a and 204b may be provided by READYRAIL® computing device mounting subsystems available from DELL® Inc. of Round Rock, Texas, United States, which one of skill in the art in possession of the present disclosure will recognize include a variety of toolless mounting interfaces for mounting both sliding READYRAIL® computing device mounting subsystems (e.g., which allow a computing device coupled thereto to move in and out of a rack) and static READYRAIL® computing device mounting subsystems (e.g., which hold a computing device coupled thereto stationary in a rack) to a rack. In the specific examples provided below, the READYRAIL® computing device mounting subsystems may be adapted to different mounting features (e.g., via a "two-post" mounting interface, a "four-post" toolless mounting interface, etc.) while remaining within the scope of the present disclosure as well.

The rack chassis 202 defines a computing device housing 206 between the top wall 202a, the bottom wall 202b, and the computing device mounting subsystems 204a and 204b. Furthermore, a rack entrance 206a is defined on a first/"front" side of the computing device housing 206 between the top wall 202a, the bottom wall 202b, and the computing device mounting subsystems 204a and 204b, while a rack exit 206b (not visible in FIG. 2A) is defined on a second/"rear" side of the computing device housing 206 between the top wall 202a, the bottom wall 202b, and the computing device mounting subsystems 204a and 204b. Furthermore, FIG. 2B illustrates how the computing device housing 206 includes a plurality of respective computing device housing volumes 206c that are defined between each pair of the computing device mounting subsystems 204a and 204b that are each configured to house a respective computing device as discussed above.

In the illustrated embodiment, the rack chassis 202 also defines a cable routing device housing 208 between the top wall 202a, the bottom wall 202b, the computing device mounting subsystem 204a, and the side wall 202c, with a plurality of cable routing device housing access areas 208a defined by the rack chassis 202 in a spaced apart orientation from each other between the top wall 202a and the bottom wall 202b of the rack chassis 202. The rack chassis 202 also defines a cable routing device housing 210 between the top wall 202a, the bottom wall 202b, the computing device mounting subsystem 204b, and the side wall 202d, with a plurality of cable routing device housing access areas 210a defined by the rack chassis 202 in a spaced apart orientation from each other between the top wall 202a and the bottom wall 202b of the rack chassis 202. In a specific example, the rack 200 illustrated in FIGS. 2A and 2B may be provided by NETSHELTER® SX series rack available from the AMERICAN POWER CONVERSION (APC)® corporation of Oakland, California, United States, which one of skill in the art in possession of the present disclosure will recognize may include a rack chassis that provides increased depth and width relative to conventional racks (e.g., a 1200 mm depth×750 mm width vs. a conventional 1070 mm depth× 600 mm width) that provides for the cable routing device housings discussed above. However, one of skill in the art in possession of the present disclosure will appreciate how other racks including other dimensions will fall within the scope of the present disclosure as well.

As will be appreciated by one of skill in the art in possession of the present disclosure, while many of the embodiments discussed below describe the rack 200 as having cable routing device(s) coupled thereto (i.e., a user may purchase a rack and then couple cable routing device(s) provided according to the teachings of the present disclosure to that rack), in other embodiments cable routing device(s) provided according to the teachings of the present disclosure may be integrated into a rack to provide the benefits described below while remaining within the scope of the present disclosure as well. As such, while a specific rack 200 has been illustrated and described, one of skill in the art in possession of the present disclosure will recognize that racks provided according to the teachings of the present disclosure may include a variety of components and component configurations while remaining within the scope of the present disclosure as well.

Figure 3A:
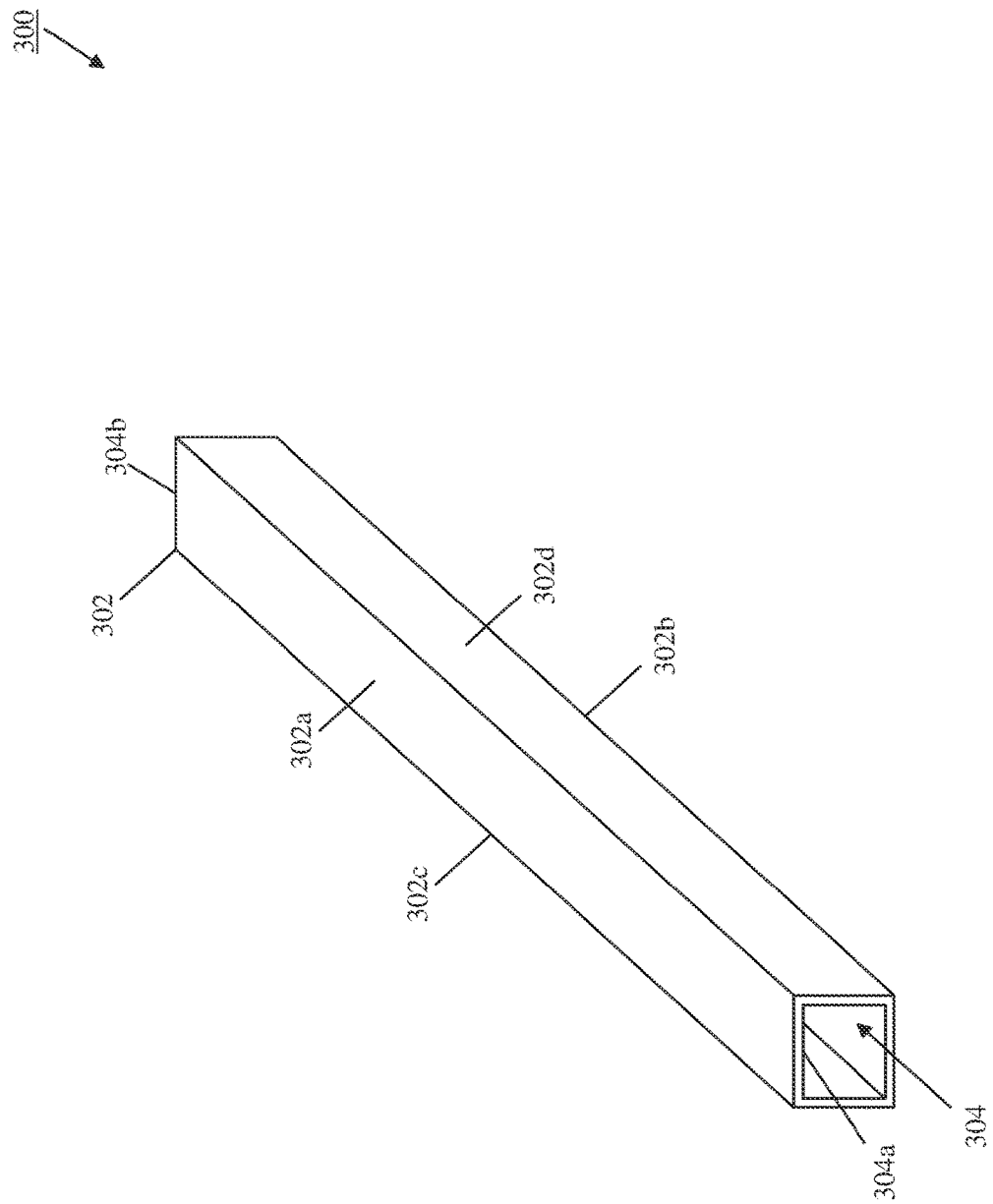
FIG. 3A is a perspective view illustrating an embodiment of a rack front-to-rear cable routing device that may be used to provide the rack front-to-rear cable routing system of the present disclosure.

Referring now to FIG. 3A, an embodiment of a cable routing device 300 is illustrated that may provide the rack front-to-rear cable routing system of the present disclosure. The cable routing device 300 includes a chassis 302 that, in the illustrated embodiment, includes a square cross section, but that as discussed below may include different shapes while remaining within the scope of the present disclosure as well. As discussed below, the chassis 302 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 302 of the cable routing device 300 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 302 includes a top wall 302a, a bottom wall 302b that is located opposite the chassis 302 from the top wall 302a, and a pair of side walls 302c and 302d that each extend between the top wall 302a and the bottom wall 302b and that are located opposite the chassis 302 from each other. The chassis 302 defines a protected cable conduit 304 along its length between the top wall 302a, the bottom wall 302b, and the side walls 302c and 302d, with a protected cable conduit entrance 304a defined by the chassis 302 on a first end of the cable routing device 300 immediately adjacent the protected cable conduit 304, and a protected cable conduit exit 304b defined by the chassis 302 on a second end of the cable routing device 300 that is opposite the first end of the cable routing device 300 and immediately adjacent the protected cable conduit 304. While the protected cable conduit exit 304b is identified but not visible in FIG. 3A, one of skill in the art in possession of the present disclosure will appreciate how the protected cable conduit exit 304b may be substantially similar to the protected cable conduit entrance 304a that is visible in FIG. 3A.

In an embodiment, the "protection" provided by the protected cable conduit 304 may result from the protected cable conduit 304 being defined on all sides by the top wall 302a, the bottom wall 302b, and the side walls 302c and 302d of the chassis 302 of the cable routing device 300 such that any portion of a cable positioned in the protected cable conduit 304 is surrounded by the chassis 302. However, in other embodiments, the top wall 302a, the bottom wall 302b, and the side walls 302c and 302d of the chassis 302 may define holes, gaps, perforations, and/or chassis portions such that the protected cable conduit 304 is not completely "surrounded" by the chassis 302 while still providing protection for any portion of a cable positioned therein. As such, while a specific cable routing device 300 has been illustrated and described, one of skill in the art in possession of the present disclosure will appreciate how the cable routing devices of the present disclosure may include a variety of components and/or component configurations while remaining within the scope of the present disclosure as well.

In some embodiments, the cable routing device 300 illustrated in FIG. 3A may be positioned in a rack (e.g., the rack 200 discussed above with reference to FIG. 2 in the examples below) without the need for rack mounting features like those described in some of the examples provided below. For example, the cable routing device 300 may be configured to be positioned on elements of the rack chassis 202 (e.g., a ledge, shelf, crossbar, and/or other rack element in the rack chassis 202) and utilized as described below without the need for the rack mounting features discussed below that are configured to mount the cable routing device 300 to the rack chassis 202. However, other embodiments of the present disclosure may provide rack mounting features on the cable routing device 300 that are configured to mount the cable routing device 300 to the rack chassis 202.

Figure 3B:
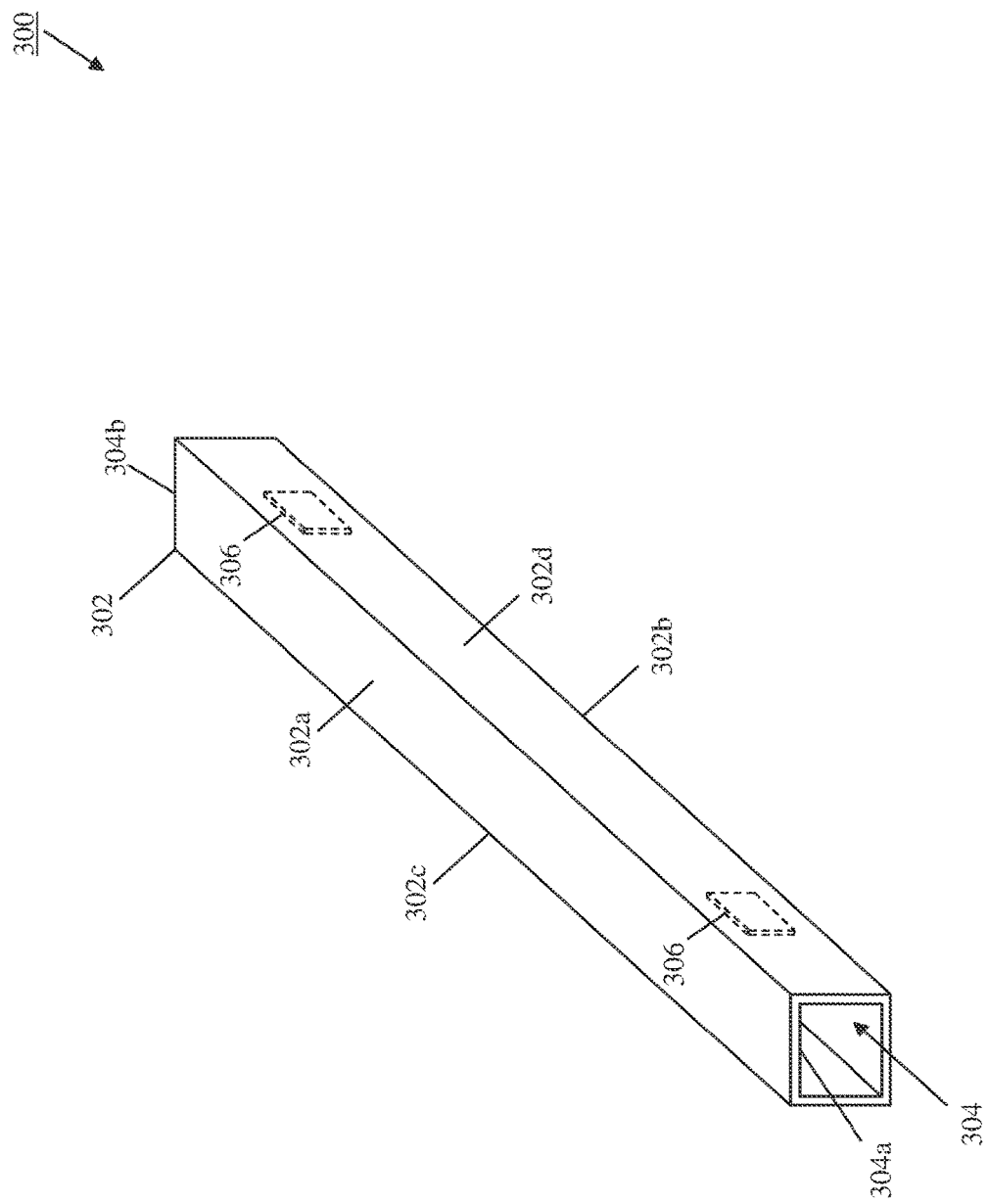
FIG. 3B is a perspective view illustrating an embodiment of the rack front-to-rear cable routing device of FIG. 3A.

For example, with reference to FIG. 3B, the chassis 302 of the cable routing device 300 may include a plurality of rack mounting features that, in the embodiment illustrated in FIG. 3B, may be provided by a pair of magnetic rack mounting features 306 that may be located in the side wall 302d of the chassis 302 (e.g., as indicated by the dashed lines used to illustrate the magnetic rack mounting features 306) in a spaced apart orientation and adjacent opposite ends of the cable routing device 300. As will be appreciated by one of skill in the art in possession of the present disclosure, each of the magnetic rack mounting features 306 may be fabricated from a magnetic material that is configured to be magnetically attracted to a portion of (e.g., a metallic element included on) a rack. However, while the magnetic rack mounting features 306 are illustrated and described as only being provided on one of the side walls of the chassis 302, one of skill in the art in possession of the present disclosure will appreciate how similar magnetic rack mounting features may be provided on any or all of the top wall 302a, the bottom wall 302b, and/or the side wall 302c of the chassis 302 while remaining within the scope of the present disclosure as well. Furthermore, while illustrated and described as being provided by magnetic rack mounting features in FIG. 3B, one of skill in the art in possession of the present disclosure will appreciate how the magnetic rack mounting features 306 may be replaced by adhesive rack mounting features on a surface of the side wall 302d of the chassis 302 (or other portions of the chassis 302) that are configured to adhere to a portion of a rack while remaining within the scope of the present disclosure as well.

Figure 3C:
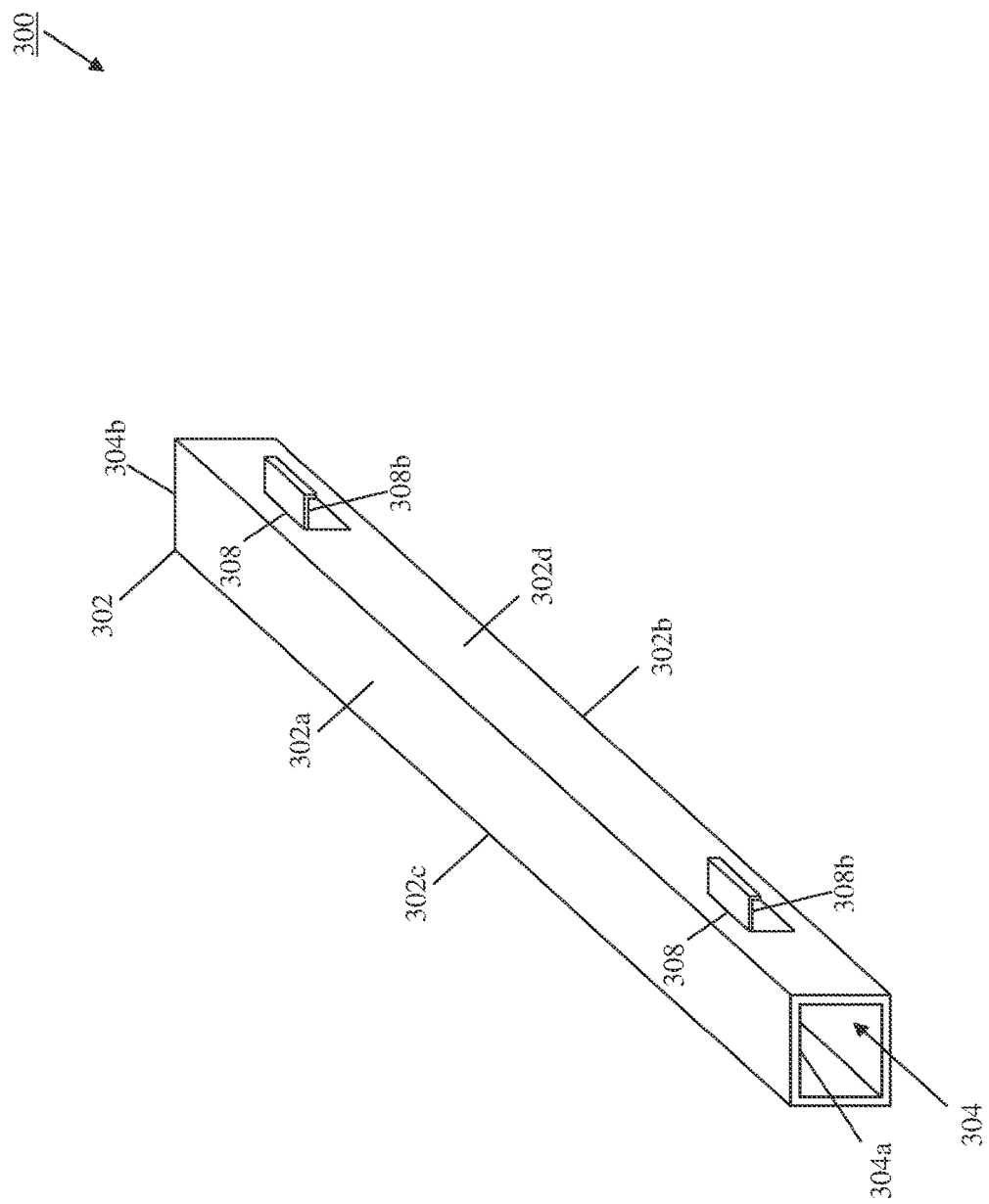
FIG. 3C is a perspective view illustrating an embodiment of the rack front-to-rear cable routing device of FIG. 3A.

In another example, with reference to FIG. 3C, the chassis 302 of the cable routing device 300 may include a plurality of rack mounting features that, in the embodiment illustrated in FIG. 3C, may be provided by a pair of hook rack mounting features 308 that may be included on the side wall 302d of the chassis 302 in a spaced apart orientation and adjacent opposite ends of the cable routing device 300. As can be seen in FIG. 3C, each of the hook rack mounting features 308 extend from the side wall 302d of the chassis 302 and define a rack engagement channel 308a that is configured to engage a portion of a rack to couple the cable routing device 300 to the rack. However, while the hook rack mounting features 308 are illustrated and described as only being provided on one of the side walls of the chassis 302, one of skill in the art in possession of the present disclosure will appreciate how similar hook rack mounting features may be provided on any or all of the top wall 302a, the bottom wall 302b, and/or the side wall 302c of the chassis 302 while remaining within the scope of the present disclosure as well.

Figure 3D:
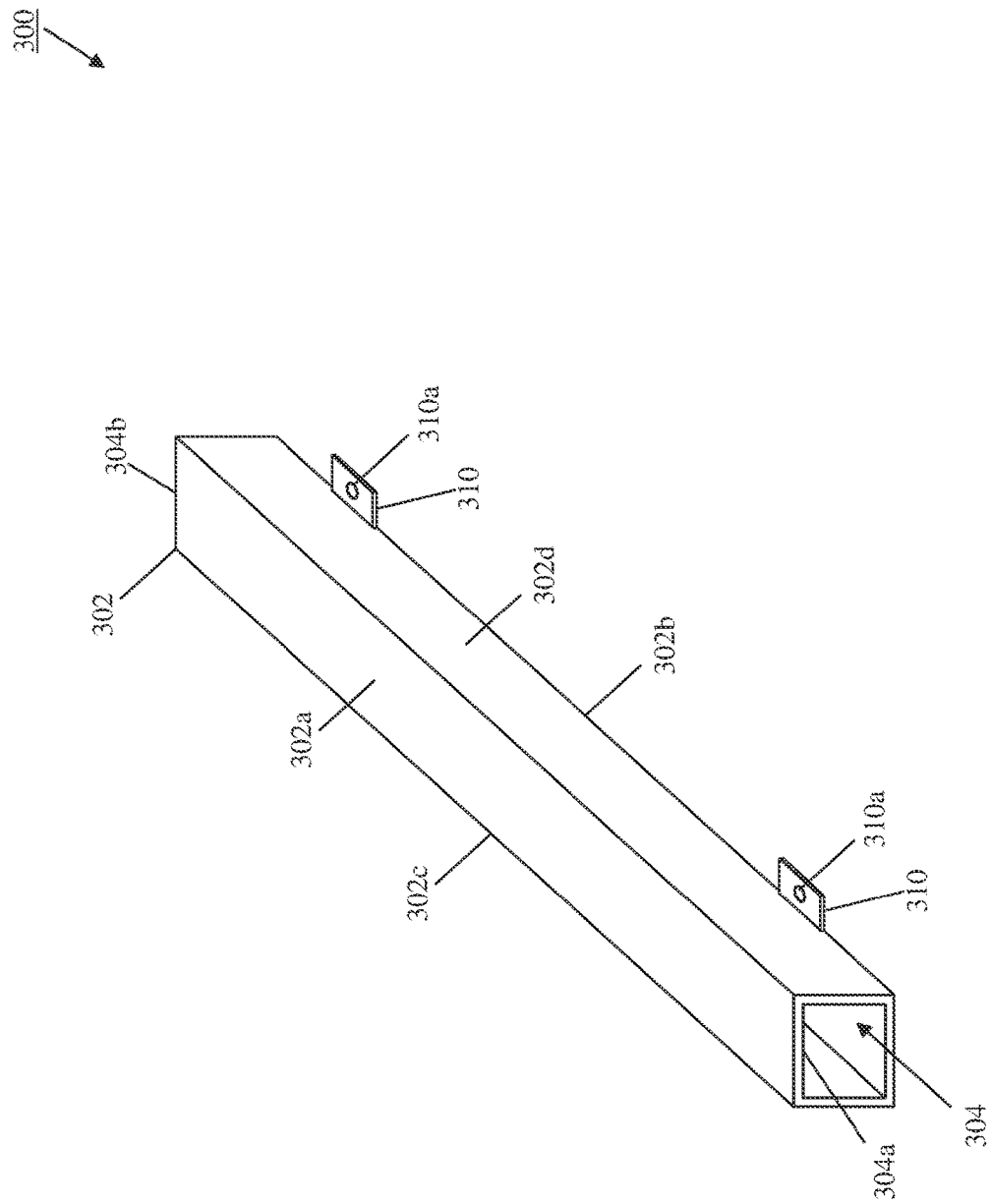
FIG. 3D is a perspective view illustrating an embodiment of the rack front-to-rear cable routing device of FIG. 3A.

In another example, with reference to FIG. 3D, the chassis 302 of the cable routing device 300 may include a plurality of rack mounting features that, in the embodiment illustrated in FIG. 3D, may be provided by a pair of rack-based bracket rack mounting features 310 that may be included on the side wall 302d of the chassis 302 in a spaced apart orientation and adjacent opposite ends of the cable routing device 300. As can be seen in FIG. 3D, each of the rack-based bracket rack mounting features 310 extend from the side wall 302d of the chassis 302 adjacent the bottom wall 302b and define a mounting aperture 310a that is configured to receive a fastener that also engages a similar aperture on a rack to couple the cable routing device 300 to the rack. However, while the rack-based bracket rack mounting features 310 are illustrated and described as only being provided on one of the side walls of the chassis 302, one of skill in the art in possession of the present disclosure will appreciate how similar rack-based bracket rack mounting features may be provided on any or all of the top wall 302a, the bottom wall 302b, and/or the side wall 302c of the chassis 302 while remaining within the scope of the present disclosure as well.

Figure 3E:
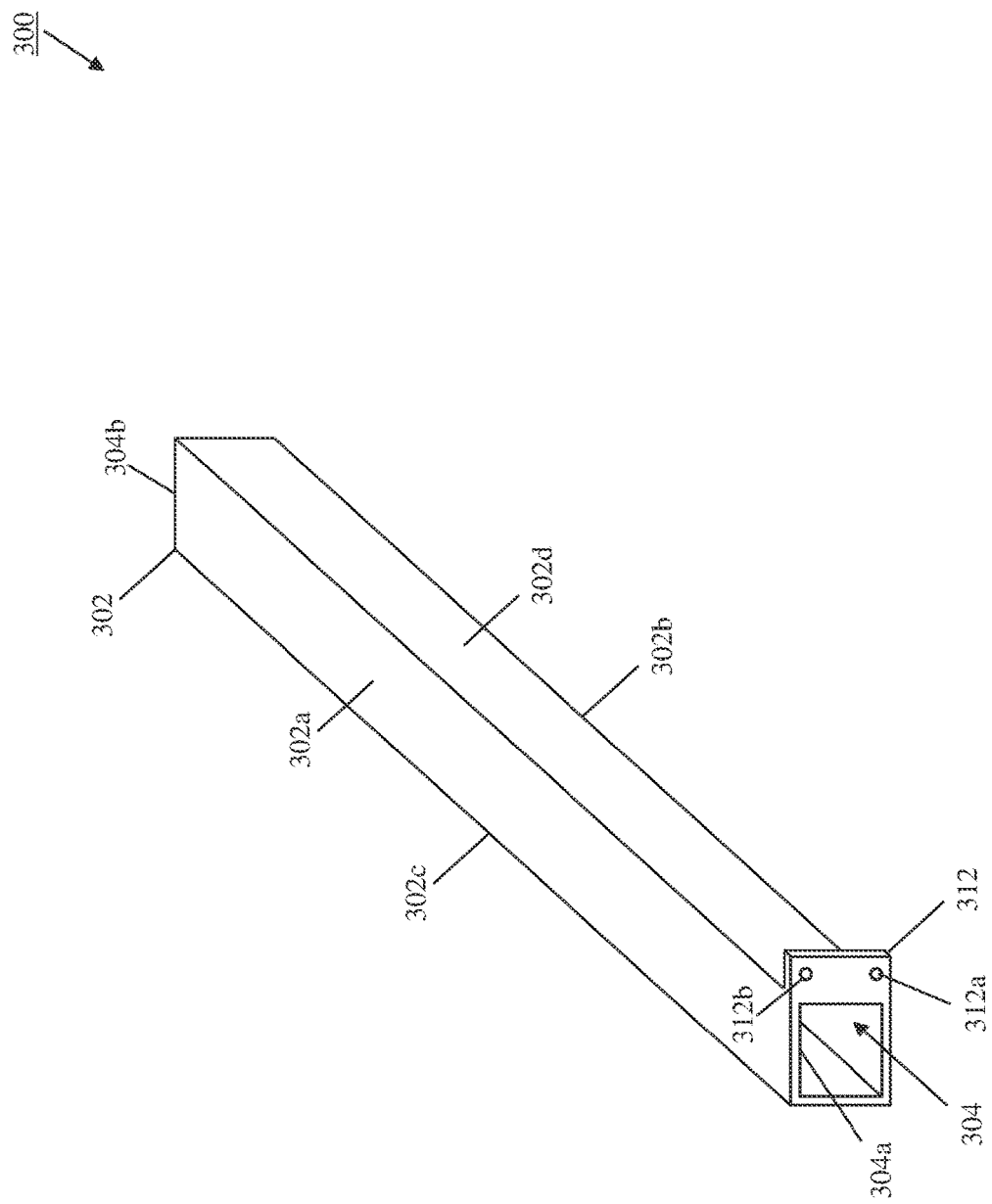
FIG. 3E is a perspective view illustrating an embodiment of the rack front-to-rear cable routing device of FIG. 3A.

In another example, with reference to FIG. 3E, the chassis 302 of the cable routing device 300 may include a rack mounting feature that, in the embodiment illustrated in FIG. 3E, may be provided by a computing-device-mounting-subsystem-based bracket rack mounting feature 312 that may be included on the side wall 302d of the chassis 302 immediately adjacent the protected cable conduit entrance 304a. As can be seen in FIG. 3E, the computing-device-mounting-subsystem-based bracket rack mounting feature 312 extends from the side wall 302d of the chassis 302 immediately adjacent the protected cable conduit entrance 304a and defines mounting apertures 312a that are configured to engage computing device mounting subsystems (e.g., any of the computing device mounting subsystems 204a or 204b) to couple the cable routing device 300 to the rack. Continuing with the specific example provided above, the mounting apertures 312a on the computing-device-mounting-subsystem-based bracket rack mounting feature 312 may engage the "two-post" toolless mounting interface on one of the READYRAIL® computing device mounting subsystems discussed above during its toolless coupling to the rack 200 to couple the cable routing device 300 to the rack 200. However, while only one computing-device-mounting-subsystem-based bracket rack mounting feature 312 is illustrated and described as being included on the chassis 302, one of skill in the art in possession of the present disclosure will appreciate how similar computing-device-mounting-subsystem-based bracket rack mounting feature may be provided on the chassis 302 immediately adjacent the protected cable conduit exit 304b (and may couple to the rack 200 via the READYRAIL® computing device mounting subsystem similarly as described above) while remaining within the scope of the present disclosure as well.

However, while several specific examples of rack mounting features have been described, one of skill in the art in possession of the present disclosure will appreciate how the cable routing device 300 may be mounted to a rack using other techniques while remaining within the scope of the present disclosure. Furthermore, one of skill in the art in possession of the present disclosure will appreciate how combinations of any of the rack mounting features illustrated and described above with reference to FIGS. 3B-3E may be provided on the same cable routing device 300 and used to mount the cable routing device 300 to a rack while remaining within the scope of the present disclosure as well.

Referring now to FIG. 4, an embodiment of a cable routing device 400 is illustrated that may provide the rack front-to-rear cable routing system of the present disclosure. The cable routing device 400 includes a chassis 402 that, in the illustrated embodiment, includes a rectangular cross section, but that may include different shapes while remaining within the scope of the present disclosure as well. As discussed below, the chassis 402 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 402 of the cable routing device 400 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 402 includes a top wall 402a, a bottom wall 402b that is located opposite the chassis 402 from the top wall 402a, and a pair of side walls 402c and 402d that each extend between the top wall 402a and the bottom wall 402b and that are located opposite the chassis 402 from each other. In the illustrated embodiment, the chassis 402 defines a plurality of protected cable conduits in a 3×1 orientation. For example, a first protected cable conduit 404 is defined along with the length of the chassis 402 between the bottom wall 402b, the side walls 402c and 402d, and an intermediate wall 406 that extends between the side walls 402c and 402, with a protected cable conduit entrance 404a defined by the chassis 402 on a first end of the cable routing device 400 immediately adjacent the first protected cable conduit 404, and a protected cable conduit exit 404b defined by the chassis 402 on a second end of the cable routing device 400 that is opposite the first end of the cable routing device 400 and immediately adjacent the first protected cable conduit 404. While the protected cable conduit exit 404b is identified but not visible in FIG. 4A, one of skill in the art in possession of the present disclosure will appreciate how the protected cable conduit exit 404b may be substantially similar to the protected cable conduit entrance 404a that is visible in FIG. 4A.

The chassis 402 also defines a second protected cable conduit 408 along its length between the intermediate wall 406, the side walls 402c and 402d, and an intermediate wall 410 that extends between the side walls 402c and 402, with a protected cable conduit entrance 408a defined by the chassis 402 on a first end of the cable routing device 400 immediately adjacent the second protected cable conduit 408, and a protected cable conduit exit 408b defined by the chassis 402 on a second end of the cable routing device 400 that is opposite the first end of the cable routing device 400 and immediately adjacent the second protected cable conduit 408. While the protected cable conduit exit 408b is identified but not visible in FIG. 4, one of skill in the art in possession of the present disclosure will appreciate how the protected cable conduit exit 408b may be substantially similar to the protected cable conduit entrance 408a that is visible in FIG. 4.

The chassis 402 also defines a third protected cable conduit 412 along its length between the intermediate wall 410, the top wall 402a, and the side walls 402c and 402d, with a protected cable conduit entrance 412a defined by the chassis 402 on a first end of the cable routing device 400 immediately adjacent the third protected cable conduit 412, and a protected cable conduit exit 412b defined by the chassis 402 on a second end of the cable routing device 400 that is opposite the first end of the cable routing device 400 and immediately adjacent the third protected cable conduit 412. While the protected cable conduit exit 412b is identified but not visible in FIG. 4, one of skill in the art in possession of the present disclosure will appreciate how the protected cable conduit exit 412b may be substantially similar to the protected cable conduit entrance 412a that is visible in FIG. 4.

In an embodiment, the "protection" provided by the first protected cable conduit 404, the second protected cable conduit 408, and the third protected cable conduit 412 may result from the first protected cable conduit 404 being defined on all sides by the intermediate wall 406, the bottom wall 402b, and the side walls 402c and 402d of the chassis 402 of the cable routing device 400 such that any portion of a cable positioned in the first protected cable conduit 404 is surrounded by the chassis 402; the second protected cable conduit 408 being defined on all sides by the intermediate wall 410, the intermediate wall 406, and the side walls 402c and 402d of the chassis 402 of the cable routing device 400 such that any portion of a cable positioned in the second protected cable conduit 408 is surrounded by the chassis 402; and the third protected cable conduit 412 being defined on all sides by the intermediate wall 410, the top wall 402a, and the side walls 402c and 402d of the chassis 402 of the cable routing device 400 such that any portion of a cable positioned in the third protected cable conduit 412 is surrounded by the chassis 402.

However, in other embodiments, the top wall 402a, the bottom wall 402b, the side walls 402c and 402d, and/or the intermediate walls 406 and 410 of the chassis 402 may define holes, gaps, perforations, and/or chassis portions such that any of the first protected cable conduit 404, the second protected cable conduit 408, and/or the third protected cable conduit 412 are not completely "surrounded" by the chassis 402 while still providing protection for any portion of a cable positioned therein. In the illustrated embodiment, a protected cable conduit identification element 414 extends from the side wall 402c of the chassis 402 adjacent each of the protected cable conduit entrances 404a, 408a, and 412a of the first cable conduit 404, the second cable conduit 408, and the third cable conduit 412, respectively. As can be seen in FIG. 4, the protected cable conduit identification element 414 includes a first cable conduit identifier (e.g., "1") located adjacent the protected cable conduit entrance 404a of the first cable conduit 404, a second cable conduit identifier (e.g., "2") located adjacent the protected cable conduit entrance 408a of the second cable conduit 408, and a third cable conduit identifier (e.g., "3") located adjacent the protected cable conduit entrance 412a of the third cable conduit 412.

Furthermore, a protected cable conduit identification element 416 extends from the side wall 402c of the chassis 402 adjacent each of the protected cable conduit exits 404b, 408b, and 412b of the first cable conduit 404, the second cable conduit 408, and the third cable conduit 412, respectively. While not visible in FIG. 4, one of skill in the art in possession of the present disclosure will appreciate how the protected cable conduit identification element 416 may be similar to the protected cable conduit identification element 414, and thus may include a first cable conduit identifier (e.g., "1") located adjacent the protected cable conduit exit 404b of the first cable conduit 404, a second cable conduit identifier (e.g., "2") located adjacent the protected cable conduit exit 408b of the second cable conduit 408, and a third cable conduit identifier (e.g., "3") located adjacent the protected cable conduit exit 412b of the third cable conduit 412.

While not illustrated or described in detail herein, similar to the cable routing device 300, the cable routing device 400 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. However, while a specific cable routing device 400 has been illustrated and described, one of skill in the art in possession of the present disclosure will appreciate how the cable routing devices of the present disclosure may include a variety of components and/or component configurations while remaining within the scope of the present disclosure as well.

Figure 5:
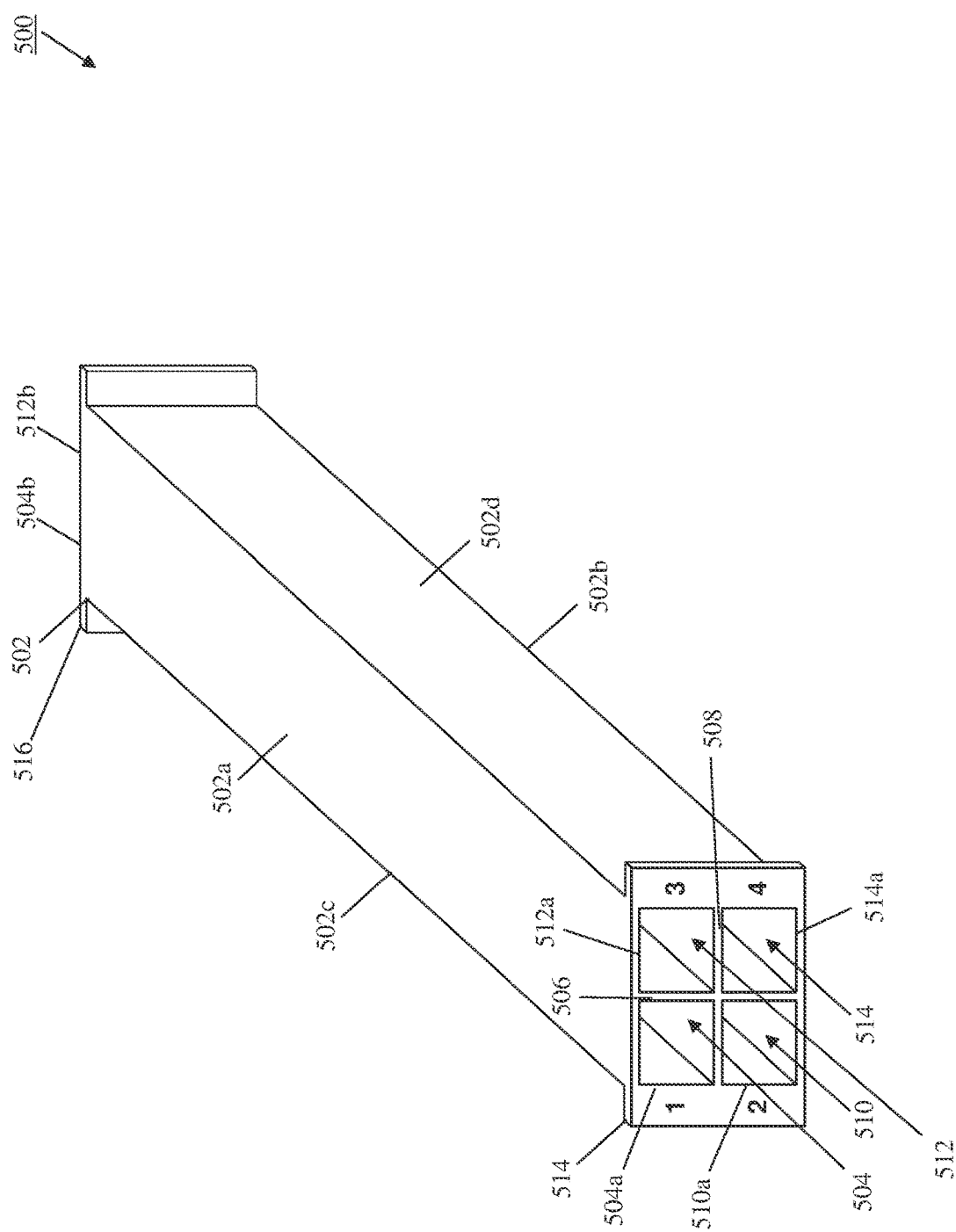
FIG. 5 is a perspective view illustrating an embodiment of a rack front-to-rear cable routing device that may be used to provide the rack front-to-rear cable routing system of the present disclosure.

Referring now to FIG. 5, an embodiment of a cable routing device 500 is illustrated that may provide the rack front-to-rear cable routing system of the present disclosure. The cable routing device 500 includes a chassis 502 that, in the illustrated embodiment, includes a square cross section, but that as discussed below may include different shapes while remaining within the scope of the present disclosure as well. As discussed below, the chassis 502 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 502 of the cable routing device 500 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 502 includes a top wall 502a, a bottom wall 502b that is located opposite the chassis 502 from the top wall 502a, and a pair of side walls 502c and 502d that each extend between the top wall 502a and the bottom wall 502b and that are located opposite the chassis 502 from each other. In the illustrated embodiment, the chassis 502 defines a plurality of protected cable conduits in a 2×2 orientation. For example, a first protected cable conduit 504 is defined along with the length of the chassis 502 between the side wall 502c, the top wall 502a, a first intermediate wall 506 that extends between the top walls 502a and the bottom wall 502b, and a second intermediate wall 508 that extends between the side walls 502c and 502d, and with a protected cable conduit entrance 504a defined by the chassis 502 on a first end of the cable routing device 500 immediately adjacent the first protected cable conduit 504, and a protected cable conduit exit 504b defined by the chassis 502 on a second end of the cable routing device 500 that is opposite the first end of the cable routing device 500 and immediately adjacent the first protected cable conduit 504. While the protected cable conduit exit 504b is identified but not visible in FIG. 5, one of skill in the art in possession of the present disclosure will appreciate how the protected cable conduit exit 504b may be substantially similar to the protected cable conduit entrance 504a that is visible in FIG. 5.

The chassis 502 also defines a second protected cable conduit 510 along its length between the intermediate wall 506, the intermediate wall 508, the bottom wall 502b, and the side wall 502c, with a protected cable conduit entrance 510a defined by the chassis 502 on a first end of the cable routing device 500 immediately adjacent the second protected cable conduit 510, and a protected cable conduit exit (not visible) defined by the chassis 502 on a second end of the cable routing device 500 that is opposite the first end of the cable routing device 500 and immediately adjacent the second protected cable conduit 508. While the protected cable conduit exit for the second protected cable conduit 510 is not visible in FIG. 5, one of skill in the art in possession of the present disclosure will appreciate how the protected cable conduit exit for the second protected cable conduit 510 may be substantially similar to the protected cable conduit entrance 510a that is visible in FIG. 5.

The chassis 502 also defines a third protected cable conduit 512 along its length between the intermediate wall 506, the intermediate wall 508, the top wall 502a, and the side wall 502d, with a protected cable conduit entrance 512a defined by the chassis 402 on a first end of the cable routing device 500 immediately adjacent the third protected cable conduit 512, and a protected cable conduit exit 512b defined by the chassis 502 on a second end of the cable routing device 500 that is opposite the first end of the cable routing device 500 and immediately adjacent the third protected cable conduit 512. While the protected cable conduit exit 512b is identified but not visible in FIG. 5, one of skill in the art in possession of the present disclosure will appreciate how the protected cable conduit exit 512b may be substantially similar to the protected cable conduit entrance 512a that is visible in FIG. 5.

The chassis 502 also defines a fourth protected cable conduit 514 along its length between the intermediate wall 506, the intermediate wall 508, the bottom wall 502b, and the side wall 502d, with a protected cable conduit entrance 514a defined by the chassis 502 on a first end of the cable routing device 500 immediately adjacent the fourth protected cable conduit 514, and a protected cable conduit exit (not visible) defined by the chassis 502 on a second end of the cable routing device 500 that is opposite the first end of the cable routing device 500 and immediately adjacent the fourth protected cable conduit 514. While the protected cable conduit exit for the fourth protected cable conduit 514 is not visible in FIG. 5, one of skill in the art in possession of the present disclosure will appreciate how the protected cable conduit exit for the fourth protected cable conduit 514 may be substantially similar to the protected cable conduit entrance 514a that is visible in FIG. 5.

In an embodiment, the "protection" provided by the first protected cable conduit 404, the second protected cable conduit 510, and the third protected cable conduit 512, and the fourth protected cable conduit 514 may result from the first protected cable conduit 504 being defined on all sides by the intermediate walls 506 and 508, the top wall 502a, and the side wall 502c of the chassis 502 of the cable routing device 500 such that any portion of a cable positioned in the first protected cable conduit 504 is surrounded by the chassis 502; the second protected cable conduit 510 being defined on all sides by the intermediate walls 506 and 508, the bottom wall 502b, and the side wall 502c of the chassis 502 of the cable routing device 500 such that any portion of a cable positioned in the second protected cable conduit 510 is surrounded by the chassis 502; the third protected cable conduit 512 being defined on all sides by the intermediate walls 506 and 508, the top wall 502a, and the side wall 502d of the chassis 502 of the cable routing device 500 such that any portion of a cable positioned in the third protected cable conduit 512 is surrounded by the chassis 502; and the fourth protected cable conduit 514 being defined on all sides by the intermediate walls 506 and 508, the bottom wall 502b, and the side wall 502d of the chassis 502 of the cable routing device 500 such that any portion of a cable positioned in the fourth protected cable conduit 514 is surrounded by the chassis 502.

However, in other embodiments, the top wall 502a, the bottom wall 502b, the side walls 502c and 502d, and/or the intermediate walls 506 and 508 of the chassis 502 may define holes, gaps, perforations, and/or chassis portions such that any of the first protected cable conduit 504, the second protected cable conduit 510, the third protected cable conduit 512, and/or the fourth protected cable conduit 514 are not completely "surrounded" by the chassis 502 while still providing protection for any portion of a cable positioned therein. In the illustrated embodiment, a protected cable conduit identification element 514 extends from each of the side walls 502c and 502d of the chassis 502 adjacent each of the protected cable conduit entrances 504a, 510a, 512a, and 514a of the first cable conduit 504, the second cable conduit 510, the third cable conduit 512, and the fourth cable conduit 514. As can be seen in FIG. 5, the protected cable conduit identification element 514 includes a first cable conduit identifier (e.g., "1") located adjacent the protected cable conduit entrance 504a of the first cable conduit 504, a second cable conduit identifier (e.g., "2") located adjacent the protected cable conduit entrance 510a of the second cable conduit 510, a third cable conduit identifier (e.g., "3") located adjacent the protected cable conduit entrance 512a of the third cable conduit 512, and a fourth cable conduit identifier (e.g., "4") located adjacent the protected cable conduit entrance 514a of the fourth cable conduit 514.

Furthermore, a protected cable conduit identification element 516 extends from the side walls 502c and 502d of the chassis 502 adjacent each of the protected cable conduit exits (e.g., 504b and 512b) of the first cable conduit 504, the second cable conduit 510, the third cable conduit 512, and the fourth cable conduit 514. While not visible in FIG. 5, one of skill in the art in possession of the present disclosure will appreciate how the protected cable conduit identification element 516 may be similar to the protected cable conduit identification element 514, and thus may include a first cable conduit identifier (e.g., "1") located adjacent the protected cable conduit exit 504b of the first cable conduit 504, a second cable conduit identifier (e.g., "2") located adjacent the protected cable conduit exit of the second cable conduit 510, a third cable conduit identifier (e.g., "3") located adjacent the protected cable conduit exit 512b of the third cable conduit 412, and a fourth cable conduit identifier (e.g., "4") located adjacent the protected cable conduit exit of the fourth cable conduit 514.

While not illustrated or described in detail herein, similar to the cable routing device 300, the cable routing device 500 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. However, while a specific cable routing device 500 has been illustrated and described, one of skill in the art in possession of the present disclosure will appreciate how the cable routing devices of the present disclosure may include a variety of components and/or component configurations while remaining within the scope of the present disclosure as well.

Figure 6:
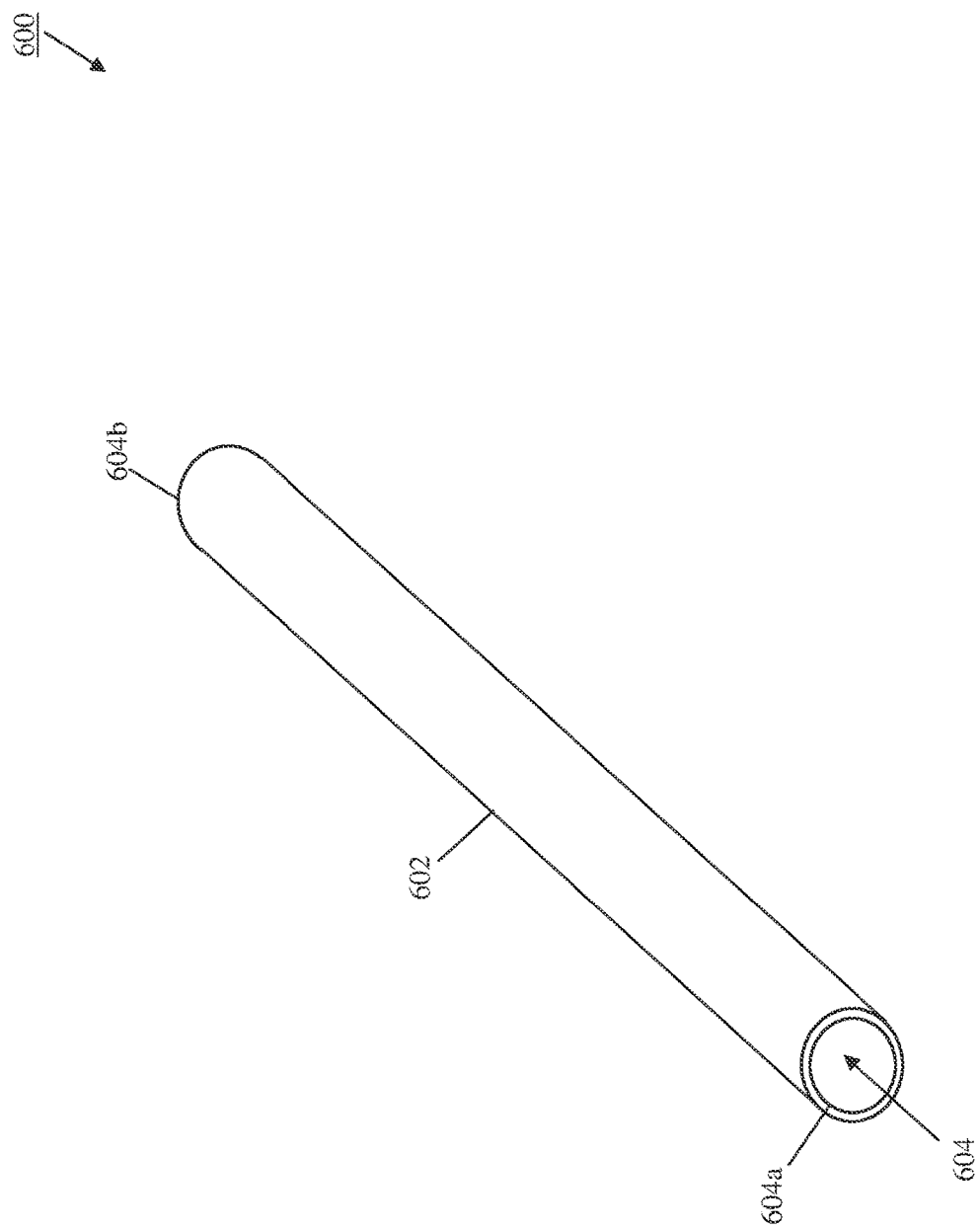
FIG. 6 is a perspective view illustrating an embodiment of a rack front-to-rear cable routing device that may be used to provide the rack front-to-rear cable routing system of the present disclosure.

Referring now to FIG. 6, an embodiment of a cable routing device 600 is illustrated that may provide the rack front-to-rear cable routing system of the present disclosure. The cable routing device 600 includes a chassis 602 that, in the illustrated embodiment, is tubular with a first diameter, but that as discussed below may include different shapes while remaining within the scope of the present disclosure as well. As discussed below, the chassis 602 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 602 of the cable routing device 600 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 602 defines a protected cable conduit 604 along its length, with a protected cable conduit entrance 604a defined by the chassis 602 on a first end of the cable routing device 600 immediately adjacent the protected cable conduit 604, and a protected cable conduit exit 604b defined by the chassis 602 on a second end of the cable routing device 600 that is opposite the first end of the cable routing device 600 and immediately adjacent the protected cable conduit 604. While the protected cable conduit exit 604b is identified but not visible in FIG. 6, one of skill in the art in possession of the present disclosure will appreciate how the protected cable conduit exit 604b may be substantially similar to the protected cable conduit entrance 604a that is visible in FIG. 6. In an embodiment, the "protection" provided by the protected cable conduit 604 may result from the protected cable conduit 604 being defined on all sides by the chassis 602 of the cable routing device 600 such that any portion of a cable positioned in the protected cable conduit 604 is surrounded by the chassis 602. However, in other embodiments, the chassis 602 may define holes, gaps, perforations, and/or chassis portions such that the protected cable conduit 604 is not completely "surrounded" by the chassis 602 while still providing protection for any portion of a cable positioned therein.

While not illustrated or described in detail herein, similar to the cable routing device 300, the cable routing device 600 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. As such, while a specific cable routing device 600 has been illustrated and described, one of skill in the art in possession of the present disclosure will appreciate how the cable routing devices of the present disclosure may include a variety of components and/or component configurations while remaining within the scope of the present disclosure as well.

Figure 7:
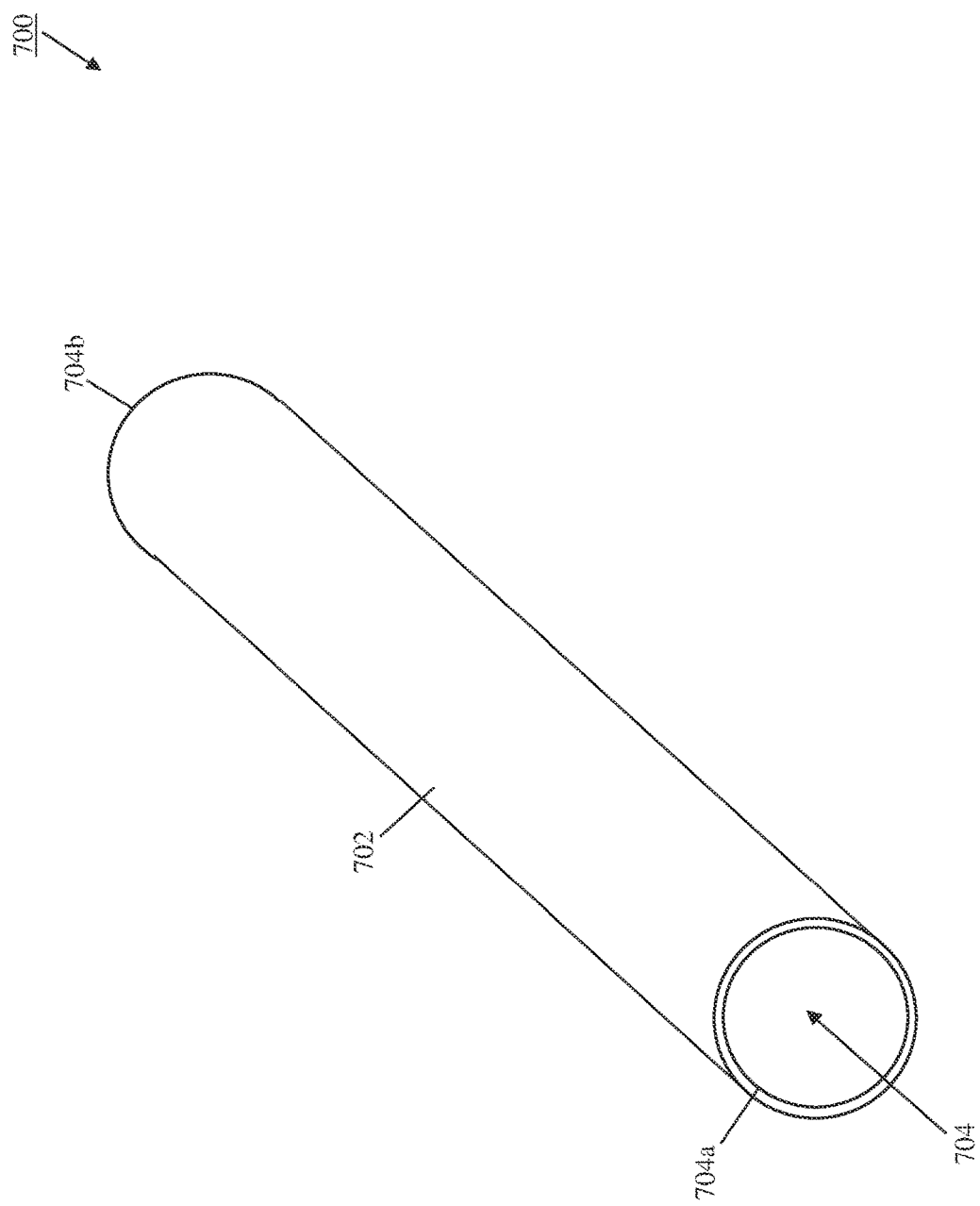
FIG. 7 is a perspective view illustrating an embodiment of a rack front-to-rear cable routing device that may be used to provide the rack front-to-rear cable routing system of the present disclosure.

Referring now to FIG. 7, an embodiment of a cable routing device 700 is illustrated that may provide the rack front-to-rear cable routing system of the present disclosure. The cable routing device 700 includes a chassis 702 that, in the illustrated embodiment, is tubular with a second diameter that is larger than the first diameter of the tubular chassis 602 on the cable routing device 600 discussed above with reference to FIG. 6, but that as discussed below may include different shapes while remaining within the scope of the present disclosure as well. As discussed below, the chassis 702 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 702 of the cable routing device 700 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 702 defines a protected cable conduit 704 along its length, with a protected cable conduit entrance 704a defined by the chassis 702 on a first end of the cable routing device 700 immediately adjacent the protected cable conduit 704, and a protected cable conduit exit 704b defined by the chassis 702 on a second end of the cable routing device 700 that is opposite the first end of the cable routing device 700 and immediately adjacent the protected cable conduit 704. While the protected cable conduit exit 704b is identified but not visible in FIG. 7, one of skill in the art in possession of the present disclosure will appreciate how the protected cable conduit exit 704b may be substantially similar to the protected cable conduit entrance 704a that is visible in FIG. 7. In an embodiment, the "protection" provided by the protected cable conduit 704 may result from the protected cable conduit 704 being defined on all sides by the chassis 702 of the cable routing device 700 such that any portion of a cable positioned in the protected cable conduit 704 is surrounded by the chassis 702. However, in other embodiments, the chassis 702 may define holes, gaps, perforations, and/or chassis portions such that the protected cable conduit 704 is not completely "surrounded" by the chassis 702 while still providing protection for any portion of a cable positioned therein.

While not illustrated or described in detail herein, similar to the cable routing device 300, the cable routing device 700 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. As such, while a specific cable routing device 700 has been illustrated and described, one of skill in the art in possession of the present disclosure will appreciate how the cable routing devices of the present disclosure may include a variety of components and/or component configurations while remaining within the scope of the present disclosure as well.

Figure 8:
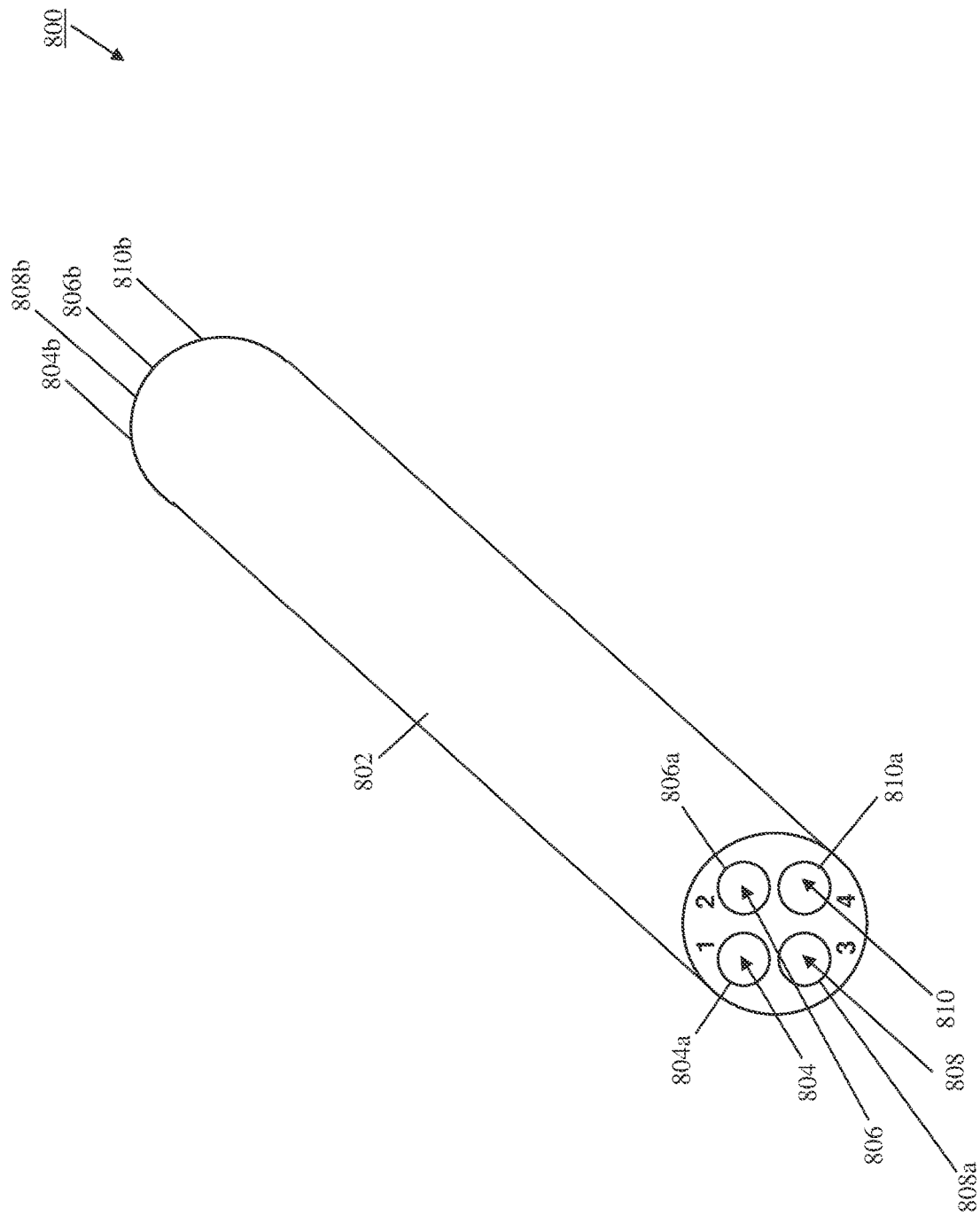
FIG. 8 is a perspective view illustrating an embodiment of a rack front-to-rear cable routing device that may be used to provide the rack front-to-rear cable routing system of the present disclosure.

Referring now to FIG. 8, an embodiment of a cable routing device 800 is illustrated that may provide the rack front-to-rear cable routing system of the present disclosure. The cable routing device 800 includes a chassis 802 that, in the illustrated embodiment, is cylindrical, but that as discussed below may include different shapes while remaining within the scope of the present disclosure as well. As discussed below, the chassis 802 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 802 of the cable routing device 800 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 802 defines a first protected cable conduit 804 along its length, with a protected cable conduit entrance 804a defined by the chassis 802 on a first end of the cable routing device 800 immediately adjacent the first protected cable conduit 804, and a protected cable conduit exit 804b defined by the chassis 802 on a second end of the cable routing device 800 that is opposite the first end of the cable routing device 800 and immediately adjacent the first protected cable conduit 804. The chassis 802 also defines a second protected cable conduit 806 along its length, with a protected cable conduit entrance 806a defined by the chassis 802 on a first end of the cable routing device 800 immediately adjacent the second protected cable conduit 806, and a protected cable conduit exit 806b defined by the chassis 802 on a second end of the cable routing device 800 that is opposite the first end of the cable routing device 800 and immediately adjacent the second protected cable conduit 806.

The chassis 802 also defines a third protected cable conduit 808 along its length, with a protected cable conduit entrance 808a defined by the chassis 802 on a first end of the cable routing device 800 immediately adjacent the third protected cable conduit 808, and a protected cable conduit exit 808b defined by the chassis 802 on a second end of the cable routing device 800 that is opposite the first end of the cable routing device 800 and immediately adjacent the third protected cable conduit 808. The chassis 802 also defines a fourth protected cable conduit 810 along its length, with a protected cable conduit entrance 810a defined by the chassis 802 on a first end of the cable routing device 800 immediately adjacent the fourth protected cable conduit 810, and a protected cable conduit exit 810b defined by the chassis 802 on a second end of the cable routing device 800 that is opposite the first end of the cable routing device 800 and immediately adjacent the fourth protected cable conduit 810.

While the protected cable conduit exits 804b, 806b, 808b, and 810b are identified but not visible in FIG. 8, one of skill in the art in possession of the present disclosure will appreciate how the protected cable conduit exits 804b, 806b, 808b, and 810b may be substantially similar to the protected cable conduit entrances 804a, 806a, 808a, and 810a that are visible in FIG. 8. In an embodiment, the "protection" provided by the protected cable conduits 804, 806, 808, and 810 may result from the protected cable conduits 804, 806, 808, and 810 being defined on all sides by the chassis 802 of the cable routing device 800 such that any portion of a cable positioned in the protected cable conduits 804, 806, 808, and 810 is surrounded by the chassis 802. However, in other embodiments, the chassis 802 may define holes, gaps, perforations, and/or chassis portions such that the protected cable conduits 804, 806, 808, and 810 are not completely "surrounded" by the chassis 802 while still providing protection for any portion of a cable positioned therein.

While not illustrated or described in detail herein, similar to the cable routing device 300, the cable routing device 800 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. As such, while a specific cable routing device 800 has been illustrated and described, one of skill in the art in possession of the present disclosure will appreciate how the cable routing devices of the present disclosure may include a variety of components and/or component configurations while remaining within the scope of the present disclosure as well.

Figure 9:
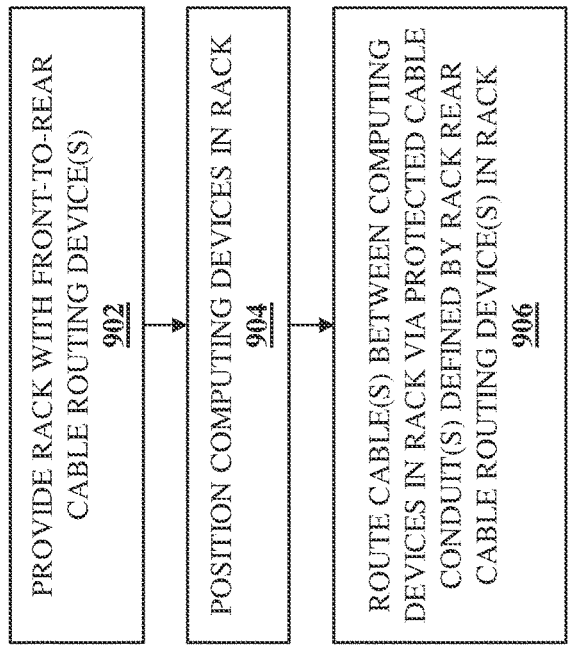
FIG. 9 is a flow chart illustrating an embodiment of a method for rack front-to-rear cable routing.

Referring now to FIG. 9, an embodiment of a method 900 for rack front-to-rear cable routing is illustrated. As discussed below, the systems and methods of the present disclosure provide racks with front-to-rear cable routing devices defining protected cable conduits through which cables may be routed between ports on computing devices that are accessible via a "front" side of the rack, and ports on computing devices that are accessible via a "rear" side of the rack. For example, the rack front-to-rear cable routing system of the present disclosure may include a rack chassis having a first rack wall, a second rack wall opposite the first rack wall, a first rack entrance defined between the first and second rack walls, and a second rack entrance defined between the first and second rack walls and opposite the first rack entrance. A computing device housing is defined by the rack chassis. A rack front-to-rear cable routing device is located between the computing device housing and the first rack wall, and defines a protected cable conduit extending between the first and second rack entrances. The protected cable conduit houses a first cable connected to each of a first port on a first computing device in the computing device housing located adjacent the first rack entrance, and a second port on a second computing device in the computing device housing located adjacent the second rack entrance. As such, cables may be routed from front-to-rear in a rack in a protected manner that eliminate the issues with conventional front-to-rear rack cable routing discussed above.

Figure 10:
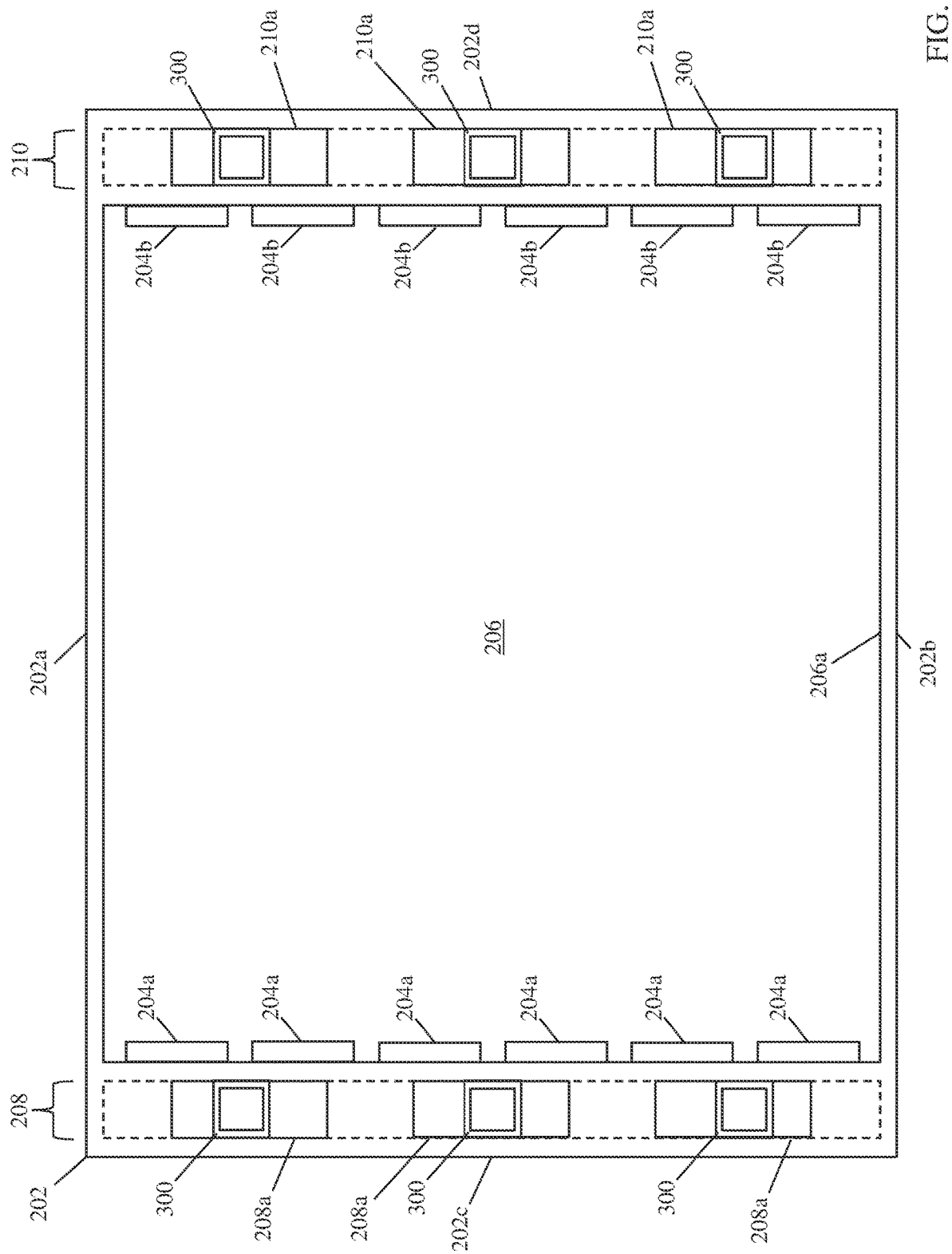
FIG. 10 is a schematic view illustrating an embodiment of the rack front-to-rear cable routing device of FIG. 3A provided in the rack of FIGS. 2A and 2B during the method of FIG. 9.

The method 900 begins at block 902 where rack is provided with one or more front-to-rear cable routing devices. With reference to FIG. 10, in an embodiment of block 902, a plurality of cable routing devices 300 may be provided in the cable routing device housing 208 defined by the rack chassis 202 between the side wall 202c and the computing device mounting subsystems 204a, and a plurality of cable routing devices 300 may be provided in the cable routing device housing 210 defined by the rack chassis 202 between the side wall 202d and the computing device mounting subsystems 204b. However, while the rack 200 is described as being provided at block 902 of the method 900 with the cable mounting devices 300 discussed above with reference to FIG. 3, one of skill in the art in possession of the present disclosure will appreciate how the rack 200 may be provided with any of (and/or any combination of) the rack mounting devices 400 of FIG. 4, the rack mounting devices 500 of FIG. 5, the rack mounting devices 600 of FIG. 6, the rack mounting devices 700 of FIG. 7, the rack mounting devices 800 of FIG. 8, and/or other rack mounting devices provided according to the teachings of the present disclosure based on the requirements of the cable routing, user, and/or benefits provided by the different embodiments of cable routing devices described herein.

As discussed above, in some embodiments, the rack 200 may be manufactured such that the cable routing devices 300 discussed above are integrated in the rack chassis 202. However, in other embodiments, the cable routing devices 300 may be provided in the rack 200 by, for example, a network technician, datacenter administrator, and/or other user of the rack. As such, in different examples any of the cable routing devices 300 may be positioned in the rack chassis 202 without the use of rack mounting features, coupled to the rack chassis 202 with the magnetic rack mounting features 306 (or adhesive rack mounting features) discussed above with reference to FIG. 3B, coupled to the rack chassis 202 with the hook rack mounting features 308 discussed above with reference to FIG. 3C, coupled to the rack chassis 202 with the rack-based bracket rack mounting features 310 discussed above with reference to FIG. 3D, coupled to the rack chassis 202 with the computing-device-mounting-subsystem-based bracket rack mounting feature 312 discussed above with reference to FIG. 3E, and/or coupled to the rack chassis 202 using other rack mounting features that would be apparent to one of skill in the art in possession of the present disclosure. As such, one of skill in the art in possession of the present disclosure will appreciate how the rack chassis 202 may be configured with plurality of different rack locations that are each configured to mount to a cable routing device 300, thus allowing any particular cable routing device 300 to mount multiple different locations on the rack 200.

Figure 11:
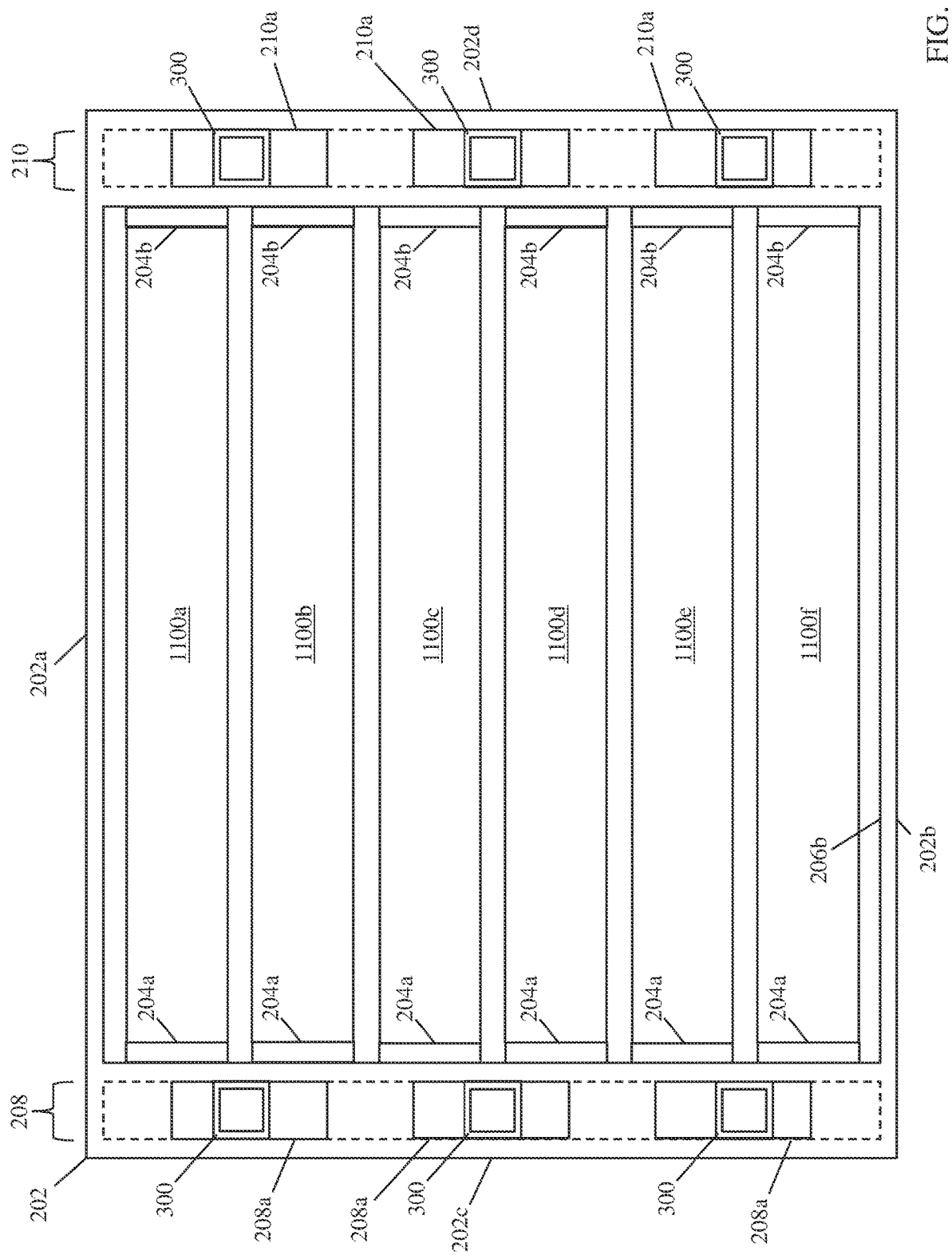
FIG. 11 is a schematic view illustrating an embodiment of computing devices provided in the rack of FIG. 10 during the method of FIG. 9.

The method 900 then proceeds to block 904 where computing devices are provided in the rack. With reference to FIG. 11, in an embodiment of block 904, a plurality of computing devices 1100a, 1100b, 1100c, 1100d, 1100e, and 1100f may be positioned in the computing device housing 206 by coupling each of those computing devices to a respective pair of computing device mounting subsystems 204a/204b using techniques that would be apparent to one of skill in the art in possession of the present disclosure (e.g., by coupling each computing device 1100a-f to a respective pair of the READYRAIL® computing device mounting subsystems 204a/204b described above). For example, the computing device 1100a may be provided by a switch device that, as discussed above, includes ports or other connectors on its "front" surface that are located adjacent the "front" rack entrance 206a of the rack 200 when that switch device is positioned in the rack chassis 202, while the computing devices 1100b-1100f may be provided by server devices and/or storage systems that, as discussed above, include ports or other connectors on their "rear" surface that are located adjacent the "rear" rack entrance 206b of the rack 200 when those server devices and storage systems are positioned in the rack chassis 202.

Figure 12A:
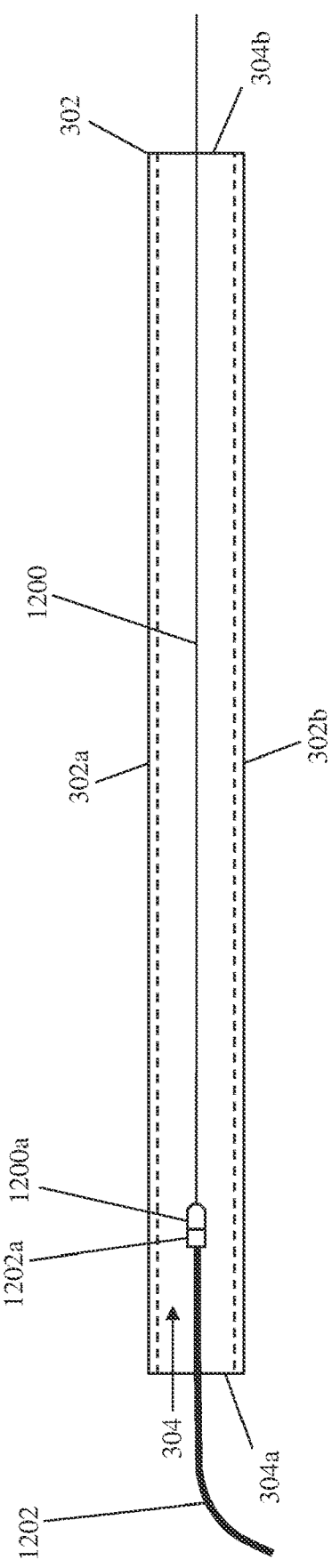
FIG. 12A is a schematic view illustrating an embodiment of a cable being positioned in the rack front-to-rear cable routing device in the rack of FIG. 10 during the method of FIG. 9.
Figure 12B:
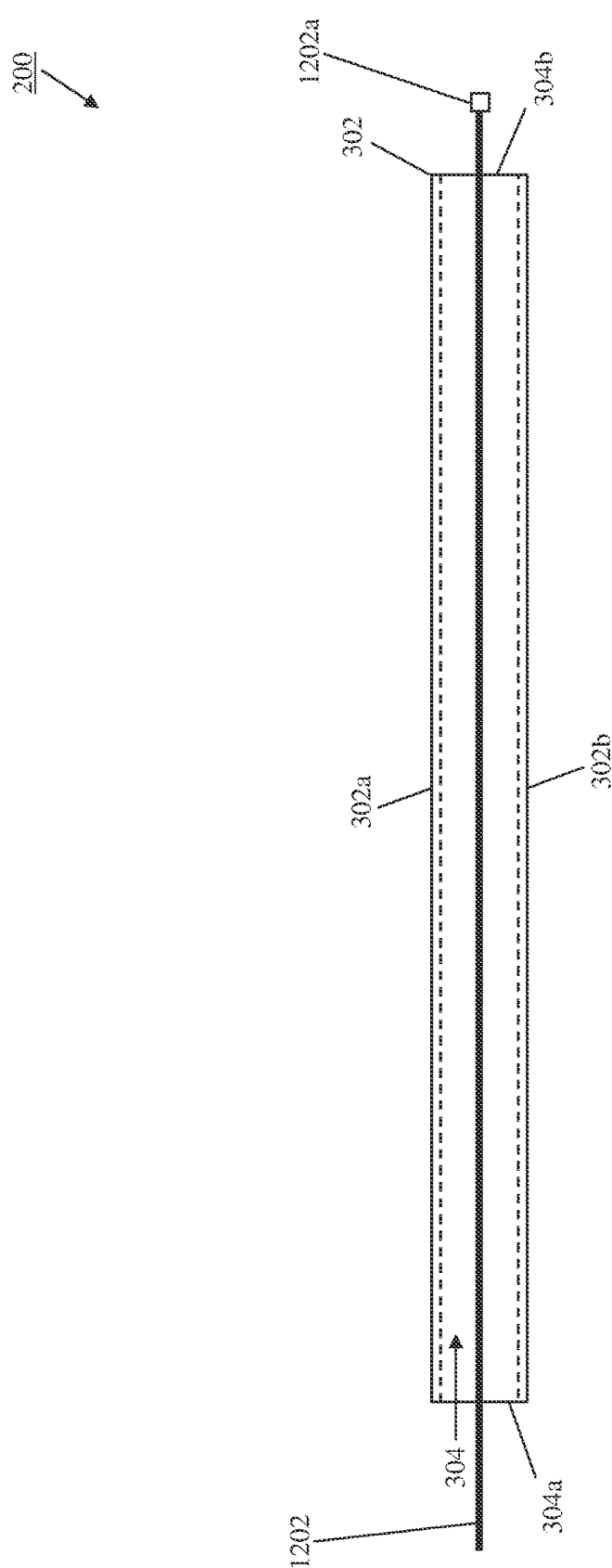
FIG. 12B is a schematic view illustrating an embodiment of a cable being positioned in the rack front-to-rear cable routing device in the rack of FIG. 10 during the method of FIG. 9.

The method 900 then proceeds to block 906 where one or more cables are routed between computing devices in the rack via protected cable conduit(s) defined by the rack front-to-rear cable routing device(s). With reference to FIGS. 12A and 12B, in an embodiment of block 906, a cable "pulling" device 1200 may be provided that includes a cable coupling connector 1200a on one end. Furthermore, in this example, a cable 1200 including a connector 1202a may extend from a computing device 1100a-1100f in the rack 200 (e.g., as an integrated cable on that computing device, or following its connection to a port on that computing device via a connector that is opposite the cable 1202 from the connector 1202a), and a network technician, datacenter administrator, or other user may couple the cable coupling connector 1200a on the cable pulling device 1200 to the connector 1202a on the cable 1202. The network technician, datacenter administrator, or other user may then move the portion of the cable pulling device 1200 opposite its cable coupling connector 1200a through the protected cable conduit entrance 304a of the protected cable conduit 304 on the cable routing device 300 until that portion of the cable pulling device 1200 moves through the protected cable conduit exit 304b on the protected cable conduit 304, as illustrated in FIG. 12A. As such, the end of the cable pulling device 1200 opposite the cable coupling connector 1200a may be rounded or otherwise configured to move past other cables that may be located in the protected cable conduit 304 without "catching" or otherwise damaging those cables.

The network technician, datacenter administrator, or other user may then grasp the cable pulling device 1200 and continue to move it through the protected cable conduit exit 304b on the protected cable conduit 304 until the connector 1202a on the cable 1202 moves out of the protected cable conduit exit 304b on the protected cable conduit 304 as illustrated in FIG. 12B, which allows that cable 1200 to be connected to another computing device 1100a-1100f in the rack 200. However, while a specific technique for providing a cable in the protected cable conduit defined by the cable routing devices of the present disclosure has been described, one of skill in the art in possession of the present disclosure will appreciate how cables may be provided in the protected cable conduit defined by the cable routing devices of the present disclosure using other techniques that will fall within the scope of the present disclosure as well.

Figure 13A:
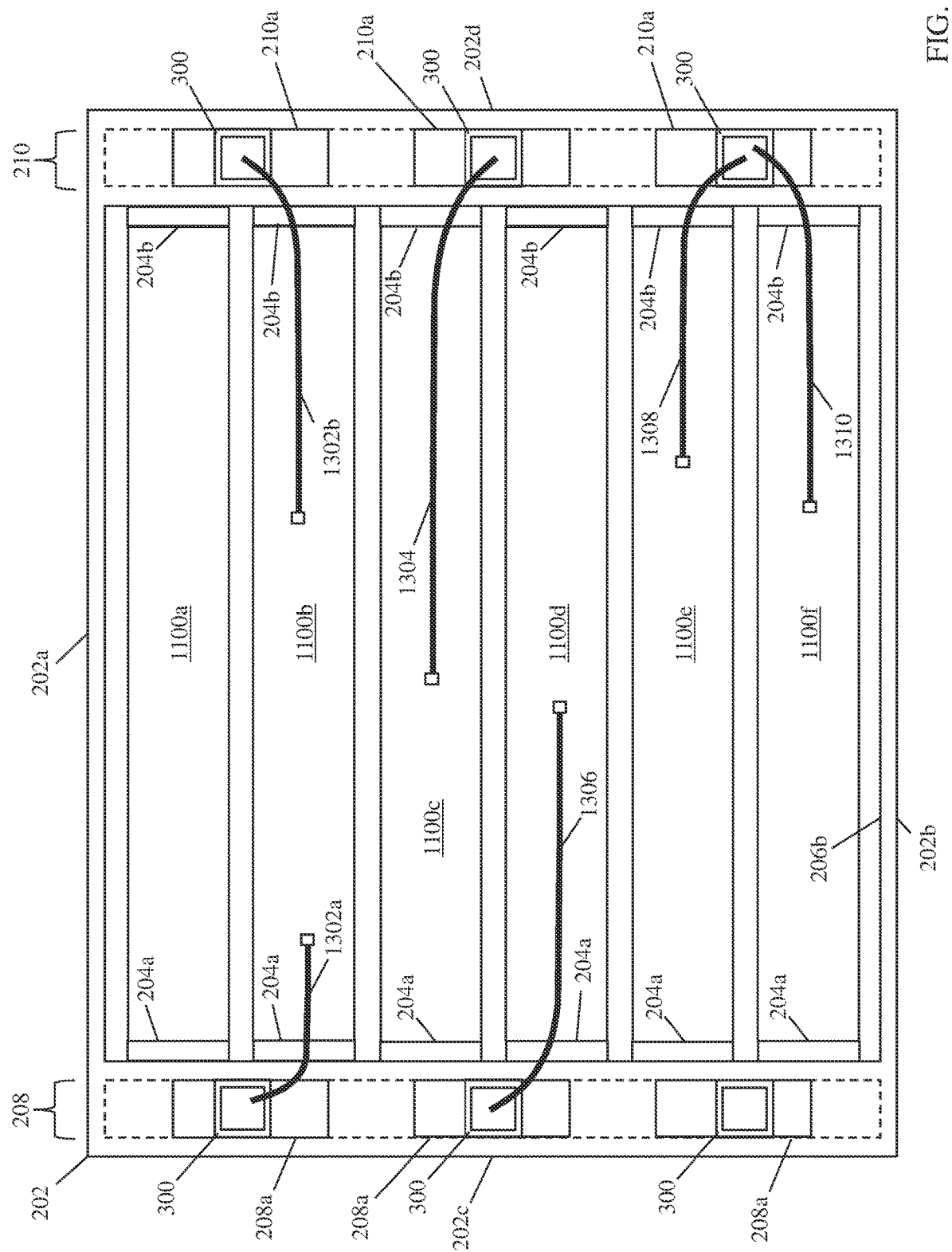
FIG. 13A is a schematic view illustrating an embodiment of cables routed between the computing devices and through the rack front-to-rear cable routing device in the rack of FIG. 10 during the method of FIG. 9.

As such, with reference to FIGS. 13A and 13B, the computing devices 1100a-1100f may be cabled together by routing cables "front-to-rear" on the rack 200 between ports on computing device adjacent the "front" rack entrance 206a and ports on computing devices adjacent the "rear" rack entrance 206b via the cable routing devices. For example, FIG. 13A illustrates how a pair of cables 1302a and 1302b that extend from the computing device 1100b are routed from the "rear" rack entrance 206b of the rack 200 and via respective cable routing devices 300 to the "front" rack entrance 206a, a cable 1304 that extends from the computing device 1100c is routed from the "rear" rack entrance 206b of the rack 200 and via a cable routing device 300 to the "front" rack entrance 206a, a cable 1306 that extends from the computing device 1100d is routed from the "rear" rack entrance 206b of the rack 200 and via a cable routing device 300 to the "front" rack entrance 206a, a cable 1308 that extends from the computing device 1100e is routed from the "rear" rack entrance 206b of the rack 200 and via a cable routing device 300 to the "front" rack entrance 206a, and a cable 1310 that extends from the computing device 1100f is routed from the "rear" rack entrance 206b of the rack 200 and via a cable routing device 300 to the "front" rack entrance 206a.

Furthermore, FIG. 13B illustrates how the cable 1302b routed via the cable routing device 300 to the "front" rack entrance 206a may be connected to the computing device 1100a, the cable 1304 routed via the cable routing device 300 to the "front" rack entrance 206a may be connected to the computing device 1100a, and the cables 1308 and 1310 routed via the cable routing device 300 to the "front" rack entrance 206a may be connected to the computing device 1100a. However, while one of skill in the art in possession of the present disclosure will recognize that FIGS. 13A and 13B illustrate an example of server devices and/or storage systems connected to a switch device, one of skill in the art in possession of the present disclosure will appreciate how other device may be connected in other configurations via the cable routing devices of the present disclosure while remaining within the scope of the present disclosure as well.

As will be appreciated by one of skill in the art in possession of the present disclosure, once the computing devices 1100a-1100f have been cabled together as described above, the protected cable conduit identifiers like those described above with reference to the cable routing devices 400, 500, and 800 in FIGS. 4, 5, and 8, respectively, may be used to allow any cable that connects computing devices in the front-to-rear manner described above to be identified both at the "front" rack entrance 206a and the "rear" rack entrance 206b of the rack chassis 202 by, for example, identifying the protected cable conduit identifier for a protected cable conduit that houses a cable at the "rear" rack entrance 206b of the rack chassis 202, and then finding that protected cable conduit identifier for that protected cable conduit that houses that cable at the "front" rack entrance 206b of the rack chassis 202, which one of skill in the art in possession of the present disclosure will appreciate assures a network technician, datacenter administrator, or other user that the cable included in that protected cable conduit is the cable of interest.

Thus, systems and methods have been described that provide racks with front-to-rear cable routing devices defining protected cable conduits through which cables may be routed between ports on computing devices that are accessible via a "front" side of the rack, and ports on computing devices that are accessible via a "rear" side of the rack. For example, the rack front-to-rear cable routing system of the present disclosure may include a rack chassis having a first rack wall, a second rack wall opposite the first rack wall, a first rack entrance defined between the first and second rack walls, and a second rack entrance defined between the first and second rack walls and opposite the first rack entrance. A computing device housing is defined by the rack chassis. A rack front-to-rear cable routing device is located between the computing device housing and the first rack wall, and defines a protected cable conduit extending between the first and second rack entrances. The protected cable conduit houses a first cable connected to each of a first port on a first computing device in the computing device housing located adjacent the first rack entrance, and a second port on a second computing device in the computing device housing located adjacent the second rack entrance. As such, cables may be routed from front-to-rear in a rack in a protected manner that eliminates the issues with conventional front-to-rear rack cable routing discussed above.

While the rack front-to-rear cable routing system described above addresses issues that can occur in conventional cable management while also preventing cable damage (e.g., via entanglement with other cables, "pinching" between equipment/rack rails, etc., and/or other cable damage scenarios known in the art), dangling cables that can cause unnecessary stress on cable connectors, and difficulties associated with adding or removing cables when cabling has been routed in the manners described above), the inventors of the present disclosure have identified some issues with the implementation of such rack front-to-rear cable routing systems. As will be appreciated by one of skill in the art in possession of the present disclosure, the rack front-to-rear cable routing system discussed above utilizes relatively larger racks with additional space on the sides of the rack (e.g., the NETSHELTER® SX series rack discussed above that includes a rack chassis that provides increased depth and width relative to conventional racks) that define the cable routing device housings in which the cable routing devices are provided. The inventors of the present disclosure have recognized that a relatively significant number of the racks used in data centers are conventional size racks that do not include the additional space utilized for the routing of cables via the rack front-to-rear cable routing system discussed above. As such, it would be desirable to provide a rack cable routing system that provides the benefits discussed above with conventional rack systems.

Figure 14A:
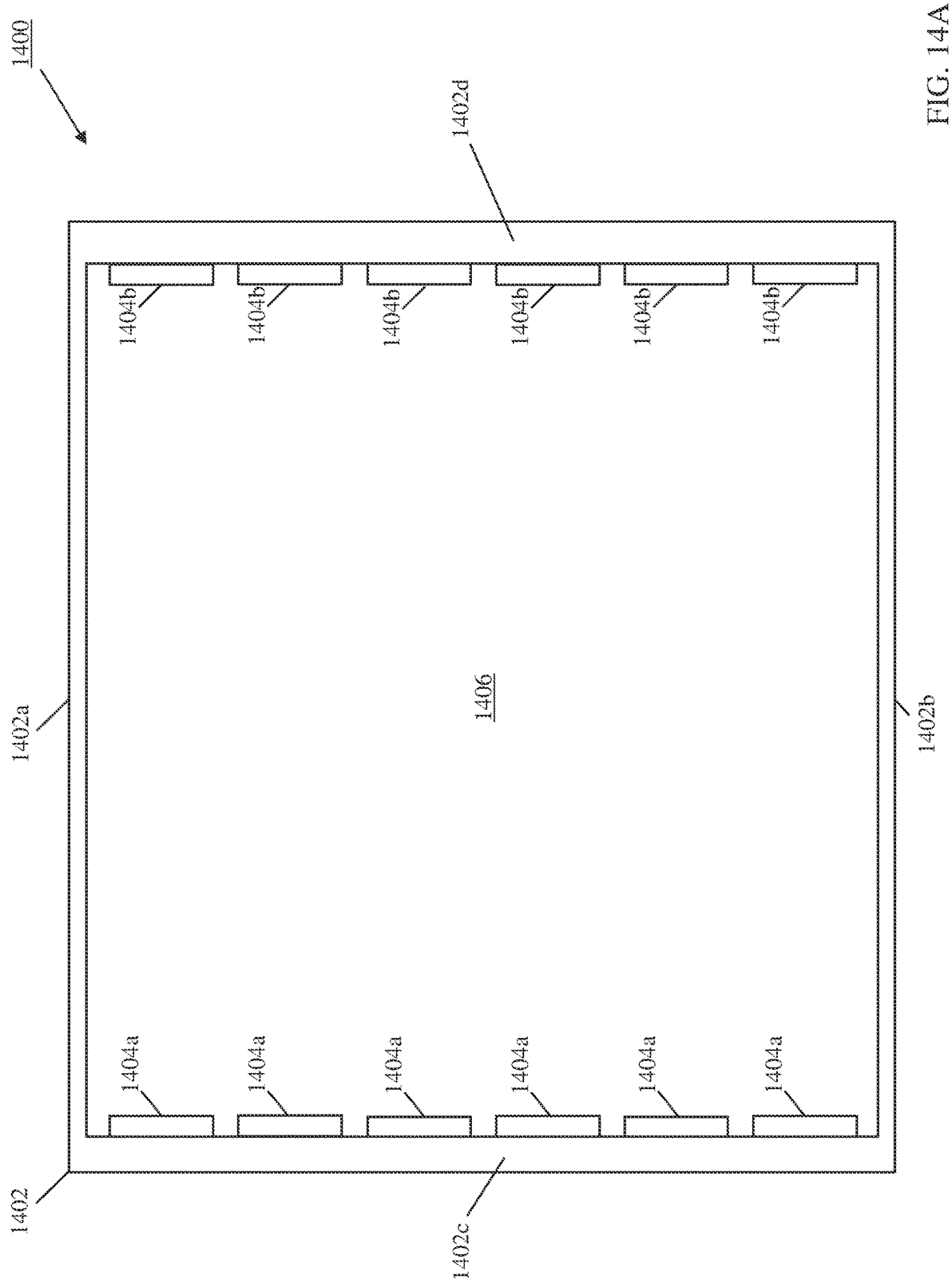
FIG. 14A is a schematic front view illustrating an embodiment of a rack that may provide the rack front-to-rear cable routing system of the present disclosure.
Figure 14B:
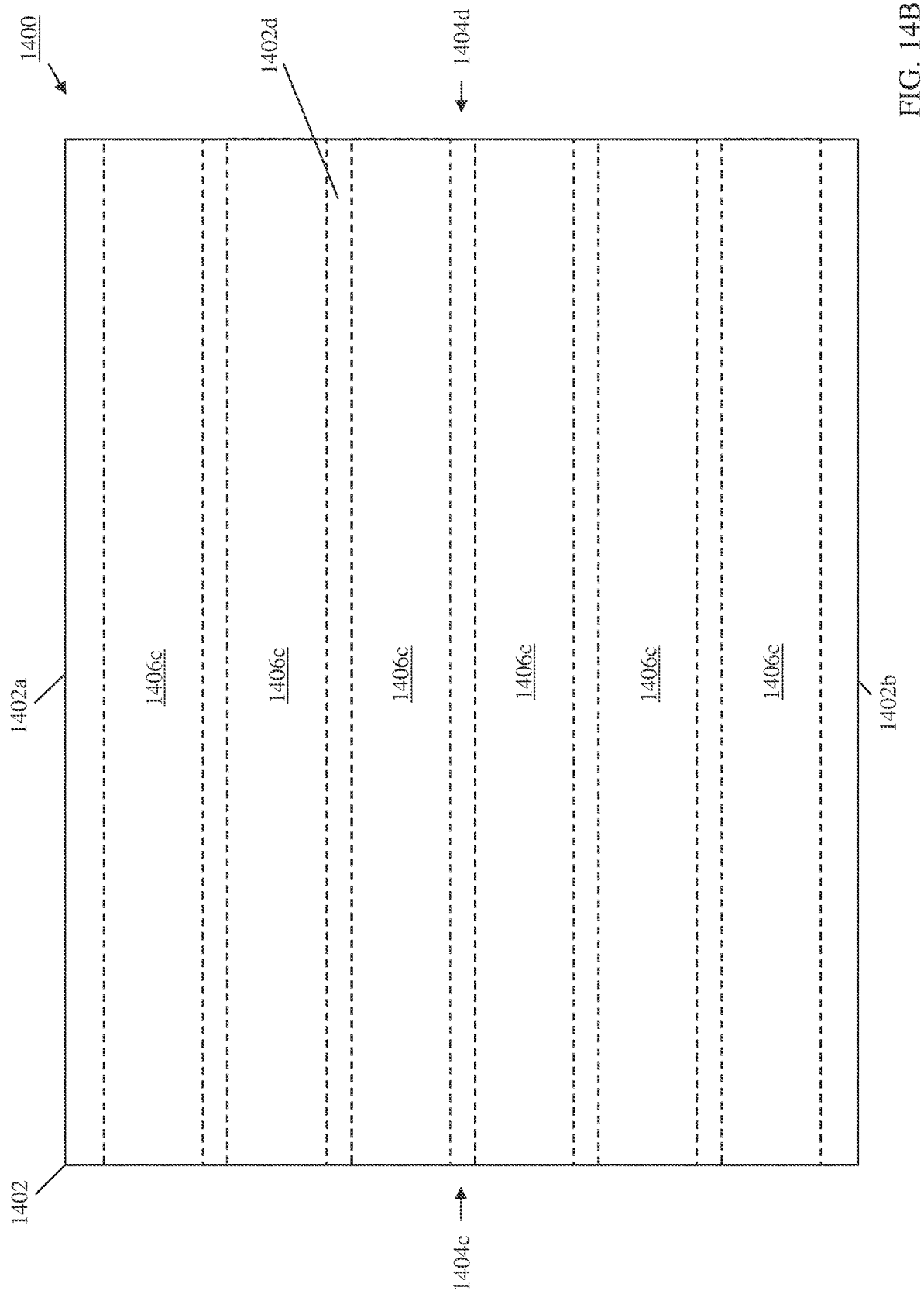
FIG. 14B is a schematic side view illustrating an embodiment of the rack of FIG. 14A.

Referring now to FIGS. 14A and 14B, an embodiment of a rack 1400 is illustrated that may provide the rack front-to-rear cable routing system of the present disclosure. The rack 1400 includes a rack chassis 1402, and in the illustrated embodiment the rack chassis 1402 includes a top wall 1402a, a bottom wall 1402b that is located opposite the rack chassis 1402 from the top wall 1402a, and a pair of opposing side walls 1402c and 1402d that each extend between the top wall 1402a and the bottom wall 1402b and that are located opposite the rack chassis 1402 from each other. A computing device mounting system is included on the rack chassis 1402 and, in the illustrated embodiment, include a plurality of computing device mounting subsystems 1404a that are positioned on the side wall 1402c of the rack chassis 1402, and a plurality of computing device mounting subsystems 1404b that are positioned on the side wall 1402d of the rack chassis 1402.

As will appreciated by one of skill in the art in possession of the present disclosure and as discussed below, respective pairs of the computing device mounting subsystems 1404a and 1404b on opposite sides of the rack chassis 1402 are configured to couple to a respective computing device to allow that computing device to be positioned in the rack chassis 1402, and thus any of the computing device mounting subsystems 1404a and 1404b may include computing device coupling/securing features for providing such functionality while remaining within the scope of the present disclosure. In a specific example, any or all of the computing device mounting subsystems 1404a and 1404b may be provided by READYRAIL® computing device mounting subsystems available from DELL® Inc. of Round Rock, Texas, United States, which one of skill in the art in possession of the present disclosure will recognize include a variety of toolless mounting interfaces for mounting both sliding READYRAIL® computing device mounting subsystems (e.g., which allow a computing device coupled thereto to move in and out of a rack) and static READYRAIL® computing device mounting subsystems (e.g., which hold a computing device coupled thereto stationary in a rack) to a rack.

The rack chassis 1402 defines a computing device housing 1406 between the top wall 1402a, the bottom wall 1402b, and the side walls 1402c and 1402d/computing device mounting subsystems 1404a and 1404b. One of skill in the art in possession of the present disclosure will appreciate how the computing device housing 1406 may define a plurality of respective computing device housing volumes 1406c between each pair of the computing device mounting subsystems 1404a and 1404b that are each configured to house a respective computing device. A rack entrance 1404c is defined on a first/"front" side of the computing device housing 1406 between the top wall 1402a, the bottom wall 1402b, and the side walls 1402c and 1402d/computing device mounting subsystems 1404a and 1404b, while a rack exit 1404d is defined on a second/"rear" side of the computing device housing 1406 between the top wall 1402a, the bottom wall 1402b, and the side walls 1402c and 1402d/computing device mounting subsystems 1404a and 1404b. As will be appreciated by one of skill in the art in possession of the present disclosure, the rack 1400 may be provided by a conventional rack such as, for example, a rack with a width of 24 inches/600 mm (e.g., as measured between the side walls 1402c and 1402d), a depth of 42 inches/1066.80 mm (e.g., as measured between the rack entrance 1404c and the rack exit 1404d), and a height of 73.6 inches/1866.90 mm (e.g., as measured between the top wall 1402a and the bottom wall 1402b). However, while specific dimensions of a conventional rack have been described, one of skill in the art in possession of the present disclosure will appreciate how conventional racks having other conventional dimensions will fall within the scope of the present disclosure as well.

Figure 15A:
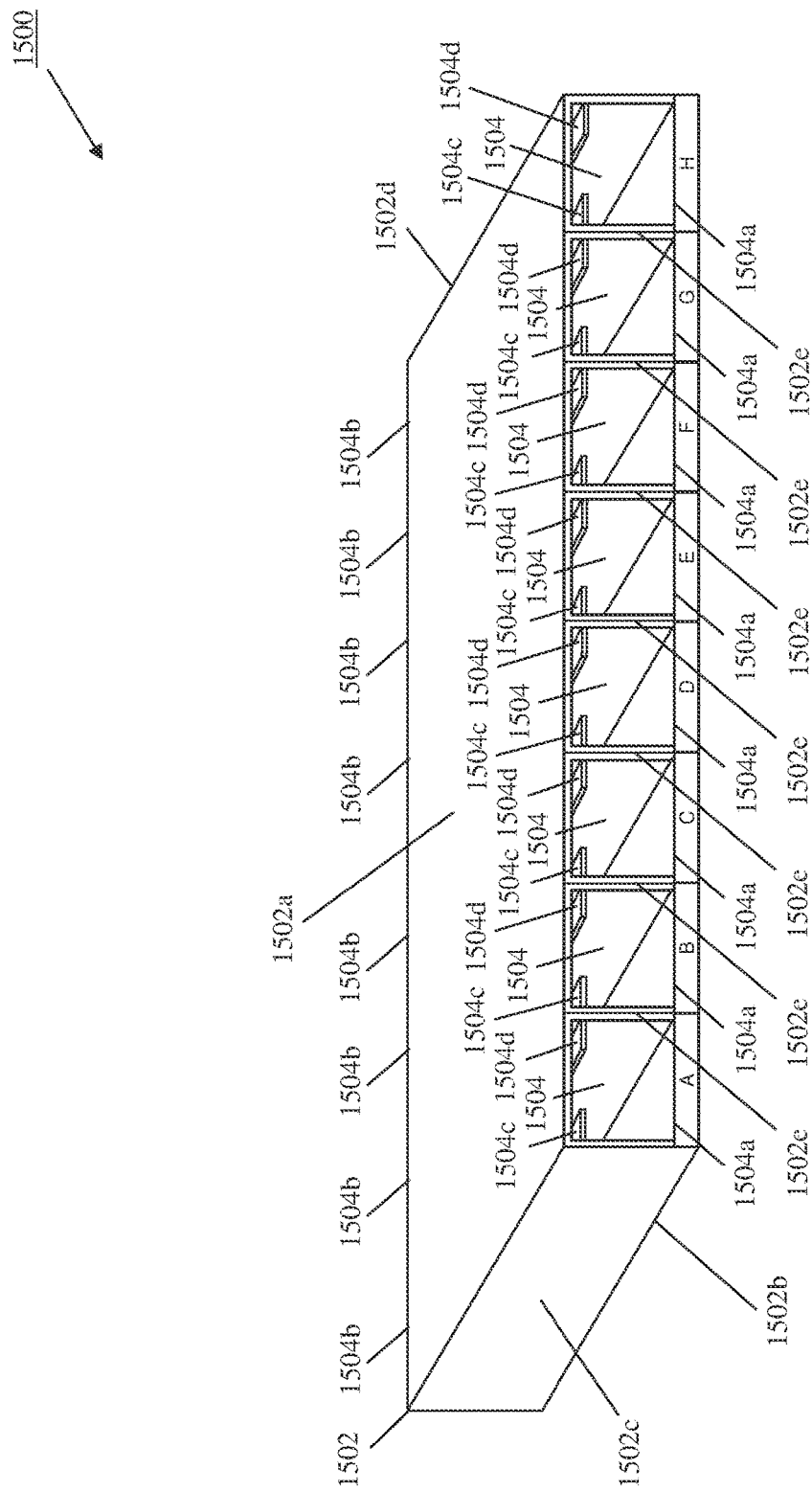
FIG. 15A is a perspective view illustrating an embodiment of a rack front-to-rear cable routing device that may provide the rack front-to-rear cable routing system of the present disclosure.
Figure 15B:
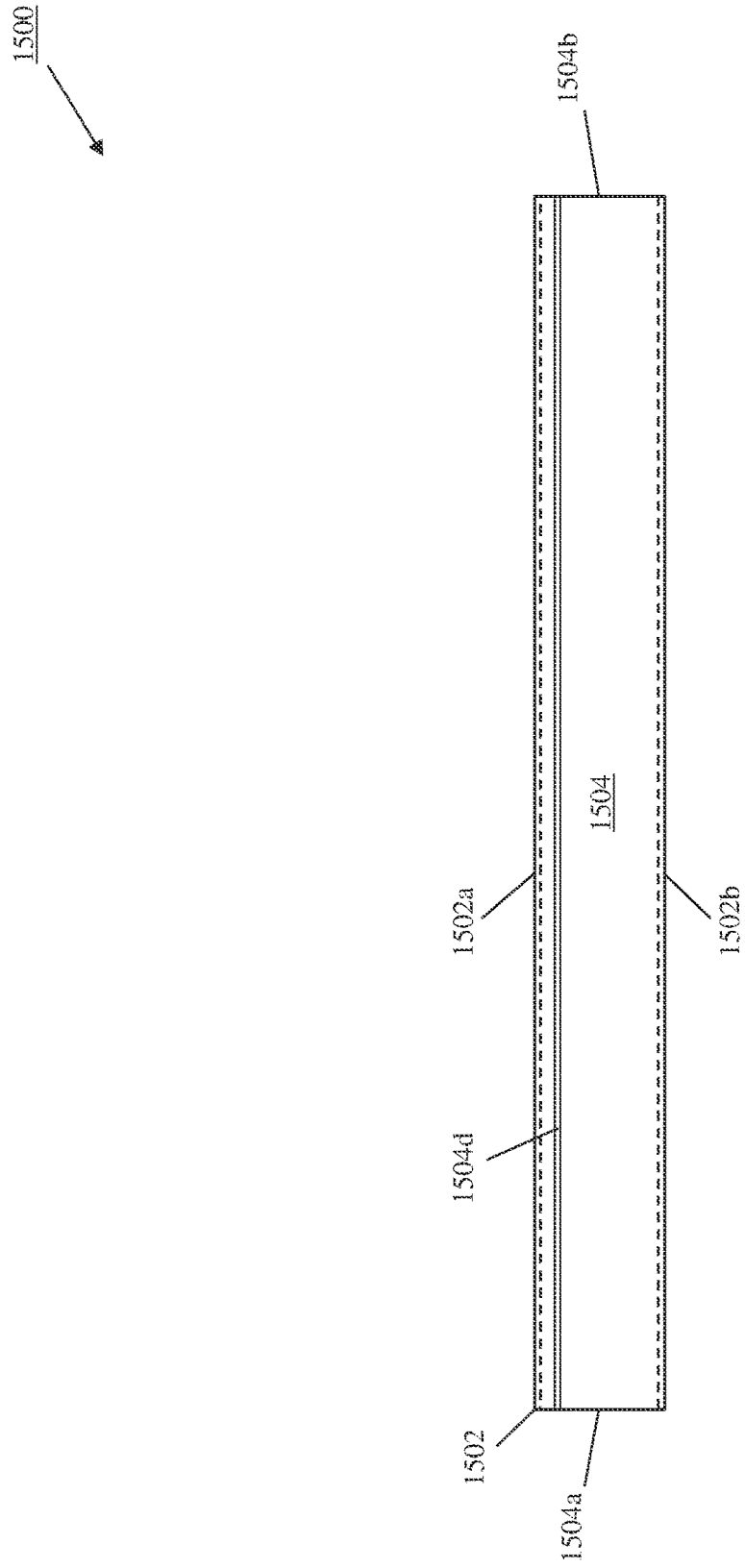
FIG. 15B is a schematic side view illustrating an embodiment of the rack front-to-rear cable routing device of FIG. 15A.

Now referring to FIGS. 15A and 15B, an embodiment of a rack front-to-rear cable routing device 1500 is illustrated that may provide the rack front-to-rear cable routing system of the present disclosure. The rack front-to-rear cable routing device 1500 includes a chassis 1502 that may be configured to fit in a conventional rack (e.g., the rack 1400 illustrated and discussed above with reference to FIGS. 14A and 14B). For example, the chassis 1502 may be dimensioned to fit in a "one rack unit" (1RU) housing (i.e., one of the computing device housings 1406c discussed above with reference to FIGS. 14A and 14B, which one of skill in the art in possession of the present disclosure will appreciate may occupy 1.75 inches/44.45 mm of the height of the rack 1400). However, while specific dimensions for the chassis 1502 have been discussed, one of skill in the art in possession of the present disclosure will appreciate how other dimensions for the chassis 1502 (e.g., a 2RU chassis) will fall within the scope of the present disclosure as well.

In the illustrated embodiment, the chassis 1502 includes a top wall 1502a, a bottom wall 1502b that is located opposite the chassis 1502 from the top wall 1502a, and a pair of side walls 1502c and 1502d that each extend between the top wall 1502a and the bottom wall 1502b and that are located opposite the chassis 1502 from each other. A plurality of intermediate walls 1502e extend between the top wall 1502a and the bottom wall 1502b in a spaced apart orientation to define a plurality of protected cable conduits 1504 between the top wall 1502a, the bottom wall 1502b, and each of: 1) the side wall 1502c and one of the intermediate walls 1502e, 2) the side wall 1502d and one of the intermediate walls 1502e, and 3) pairs of adjacent intermediate walls 1502e. As can be seen in FIG. 15B, each of the protected cable conduits 1504 include a protected cable conduit entrance 1504a and a protected cable conduit exit 1504b that is located opposite the protected cable conduit 1504 from the protected cable conduit entrance 1504a.

In an embodiment, the "protection" provided by the plurality of protected cable conduits 1504 may result from the plurality of protected cable conduits 1504 being defined on all sides by the top wall 1502a, the bottom wall 1502b, and either a pair of the intermediate walls 1502e, the side wall 1502c and the one of the intermediate walls 1502e, or the side wall 1502d and the one of the intermediate walls 1502e, such that any portion of a cable positioned in any one of the protected cable conduits 1504 is surrounded by the chassis 1502. However, in other embodiments, the top wall 1502a, the bottom wall 1502b, the side walls 1502c and 1502d, and/or the intermediate walls 1502e of each of the plurality of protected cable conduits 1504 may define holes, gaps, perforations, and/or chassis portions such that the plurality of protected cable conduits 1504 are not completely "surrounded" by the chassis 1502 while still providing protection for any portion of a cable positioned therein.

In the illustrated embodiment, a cable routing device guide subsystem is located in each of the protected cable conduits 1504. In the specific examples provided below, the cable routing device guide subsystems each include cable routing device guide elements 1504c and 1504d. As can be seen in FIG. 15A, the cable routing device guide elements 1504c and 1504d are located adjacent and spaced apart from the top wall 1502a, and extend from opposing adjacent intermediate walls 1502e, the side wall 1502c and its opposing adjacent intermediate wall 1502e, and the side wall 1502d and its opposing adjacent intermediate wall 1502e. As can be seen in FIG. 15B, the cable routing device guide elements 1504c (not visible in FIG. 15B) and 1504d may extend through their protected cable conduit 1504 from the protected cable conduit entrance 1504a to the protected cable conduit exit 1504b.

In the illustrated embodiment, a respective protected cable conduit identifier is included on the chassis 1502 adjacent each of the plurality of protected cable conduits entrances 1504a and operates to identify a corresponding protected cable conduit 1504. In the specific example illustrated in FIG. 15A, each of the protected cable conduit identifiers (e.g., "A", "B", "C", "D", "E", "F", "G", and "H") are located adjacent the respective protected cable conduit entrance 1504a of the corresponding protected cable conduit 1504 that it uniquely identifies. Furthermore, while not visible or illustrated in FIG. 15A, one of skill in the art in possession of the present disclosure will appreciate how each of the protected cable conduit identifiers may also be included on the chassis 1502 adjacent a respective protected cable conduit exit 1504b to identify a corresponding protected cable conduit 1504 (i.e., so that the protected cable conduit identifier "A" is provided adjacent the protected cable conduit entrance 1504a and the protected cable conduit exit 1504b of the same protected cable conduit 1504, the protected cable conduit identifier "B" is provided adjacent the protected cable conduit entrance 1504a and the protected cable conduit exit 1504b of the same protected cable conduit, and so on).

Figure 15C:
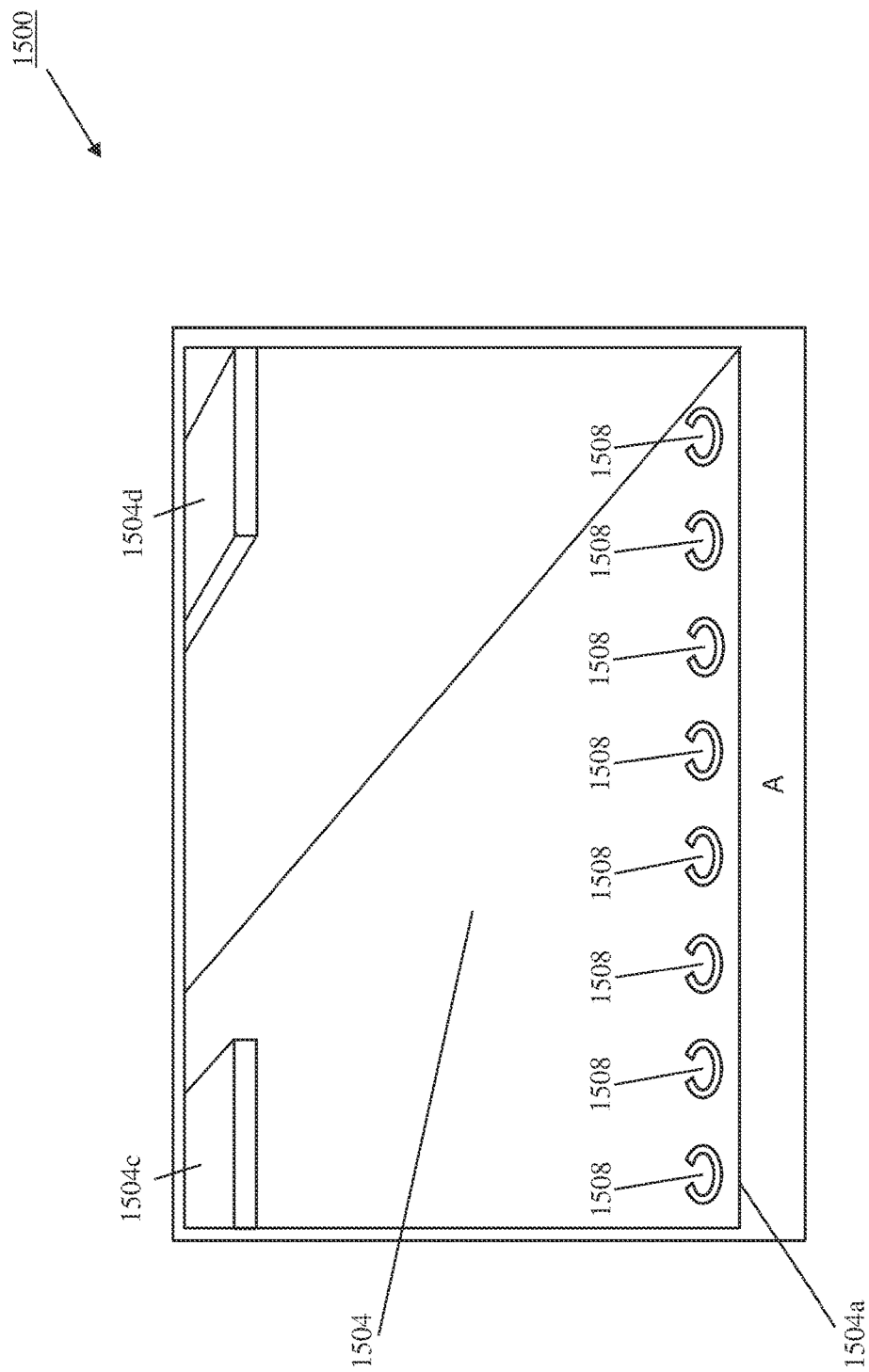
FIG. 15C is a perspective view illustrating an embodiment of a protected cable conduit defined by a rack front-to-rear cable routing device of FIGS. 15A and 15B.

Referring now to FIG. 15C, an embodiment of the protected cable conduit identified by the protected cable conduit identifier "A" is illustrated, and one of skill in the art in possession of the present disclosure will appreciate how any of the other protected cable conduits 1504 may include features similar to the protected cable conduit 1504 illustrated in FIG. 15C. As can be seen in FIG. 15C, protected cable conduits 1504 may include a cable securing subsystem that, in the illustrated example, includes a plurality of cable securing elements 1508 that are each configured to secure a respective cable in the protected cable conduit 1504. As will be appreciated by one of skill in the art in possession of the present disclosure, the cable securing subsystem in the protected cable conduit 1504 illustrated in FIG. 15C may also include an additional set of cable securing elements located adjacent the protected cable conduit exit 1504b, as well as at different locations along the length of the protected cable conduit 1504 (e.g., to secure cables at different locations along the length of the protected cable conduit 1504). In a specific example, the cable securing elements 1508 may be provided by plastic clasps with an opening that may be manipulated by a user to allow the user to secure a cable to the plastic clasps, a VELCRO® tie-down system, and/or other cable securing subsystems that would be apparent to one of skill in the art in possession of the present disclosure. However, while a specific example of a cable securing subsystem has been discussed, one of skill in the art in possession of the present disclosure will appreciate how cable may be secured in the protected cable conduits of the present disclosure in a variety of manners while remaining within the scope of the present disclosure as well.

Figure 15D:
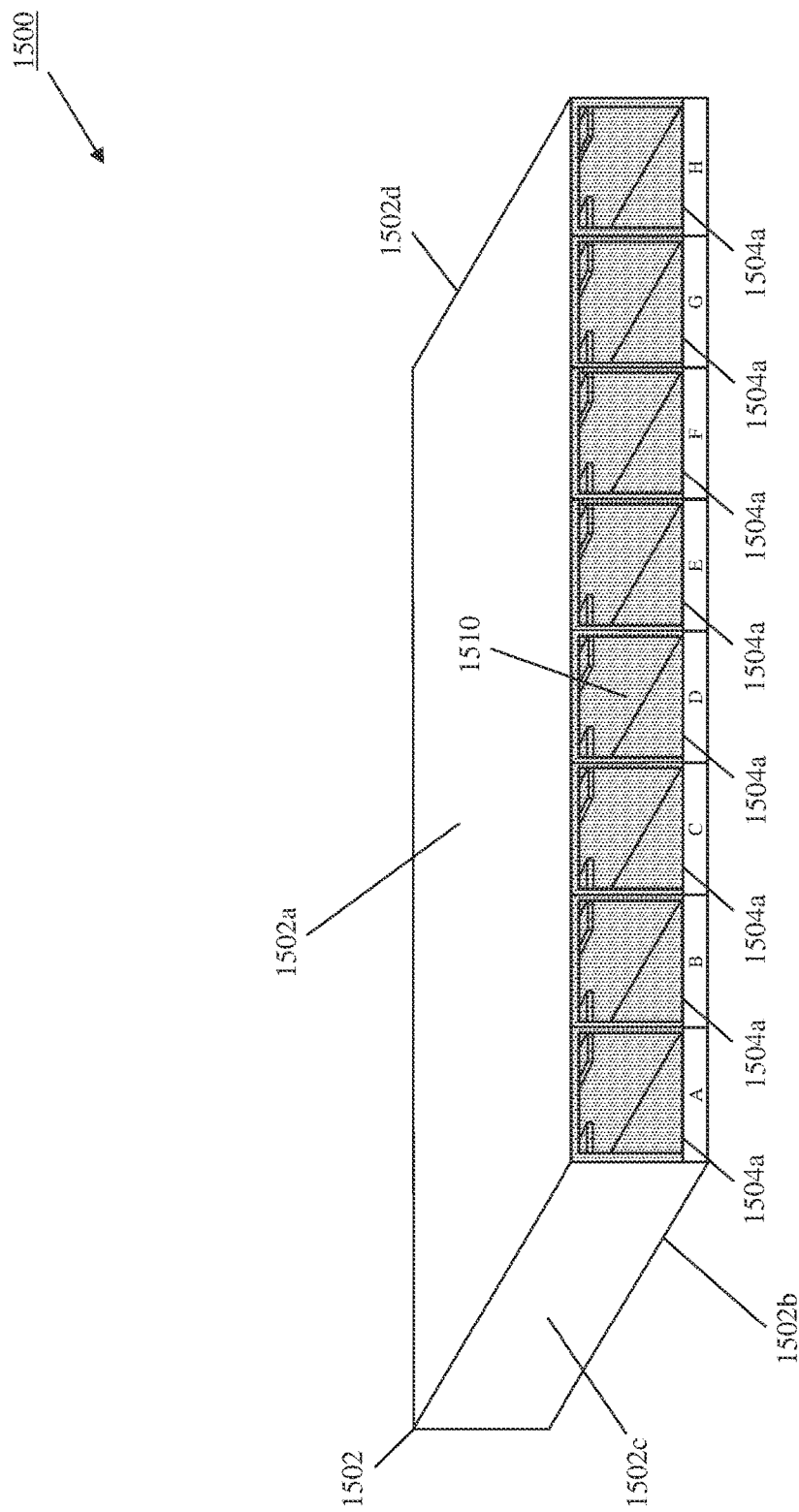
FIG. 15D is a perspective view illustrating an embodiment of the rack front-to-rear cable routing device of FIGS. 15A and 15B including an air-flow blocking system.

Referring now to FIG. 15D, in an embodiment, the chassis 1502 may include an air-flow blocking system 1510 that may be provided adjacent the protected cable conduit entrances 1504a (e.g., on the "front") of the rack front-to-rear cable routing device 1500, and one of skill in the art in possession of the present disclosure will recognize how the air-flow blocking system 1510 may be provided adjacent the protected cable conduit exits 1504b (e.g., on the "rear" of the rack front-to-rear cable routing device 1500), anywhere along the length of the protected cable conduits 1504, and/or combinations thereof. As will be appreciated by one of skill in the art in possession of the present disclosure, the air-flow blocking system 1510 is configured to block air flow through the protected cable conduits 1504 in order to, for example, prevent hot air expelled from computing devices to a "hot" side of a rack to flow back to the "cold" side of the rack. In specific examples, the air-flow blocking system 1510 may be provided by brushes, foam, a door mechanism, and/or other materials/structures that are configured to block air-flow while also permitting a cable to pass through the air-flow blocking system 1504 and into the protected cable conduit 1504 when required. However, while specific air-flow blocking materials/structures have been described, one of skill in the art in possession of the present disclosure will appreciate how other air-flow blocking materials/structures may be utilized while still remaining within the scope of the present disclosure as well.

In some embodiments, the air-flow blocking system 1510 may be configured as a single continuous segment/unit that extends across the width of the chassis 1502, but one of skill in the art in possession of the present disclosure will recognize how the air-flow blocking system 1510 may also be configured with multiple segments/units that are each configured to block air-flow through subsets of the protected cable conduits 1502 (and in some cases that are each configured to block air-flow through a respective individual protected cable conduit 1504). The air-flow blocking system 1510 may be coupled to the chassis 1502 by a hinge device, an adhesive system, a "snap-on" mounting frame, and/or other coupling subsystems that would be apparent to one of skill in the art in possession of the present disclosure. However, while specific examples of an air-flow blocking system have been illustrated and described, one of skill in the art in possession of the present disclosure will appreciate how air-flow through the protected cable conduits 1504 may be blocked in a variety of manners while remaining within the scope of the present disclosure as well. As such, while a specific rack front-to-rear cable routing device 1500 has been illustrated and described, one of skill in the art in possession of the present disclosure will appreciate how the rack front-to-rear cable routing device 1500 of the present disclosure may include a variety of components and/or component configurations while remaining within the scope of the present disclosure as well.

Figure 16:
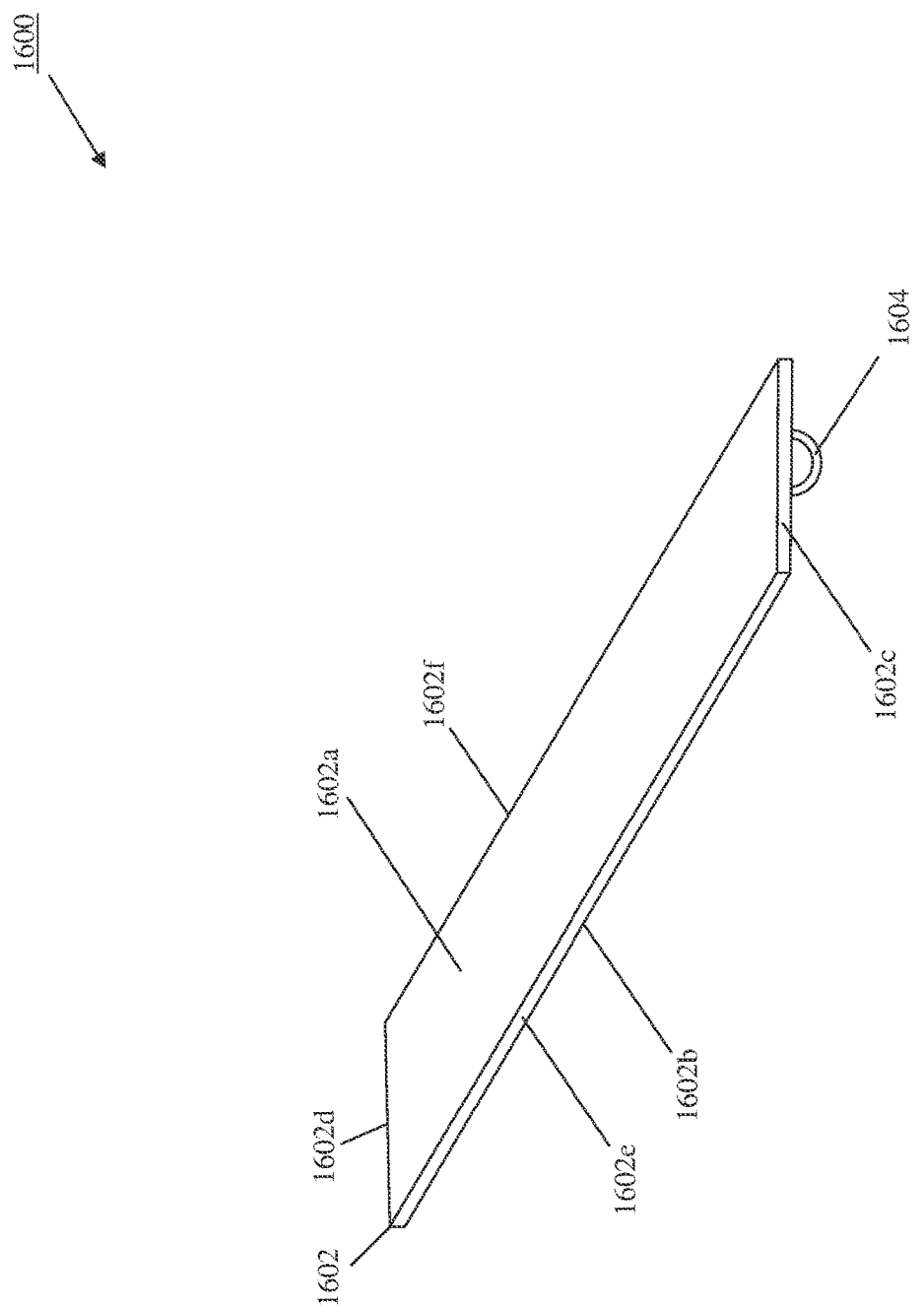
FIG. 16 is a perspective view illustrating an embodiment of a cable routing device that may be utilized with the rack front-to-rear cable routing device of FIGS. 15A and 15B.

Referring now to FIG. 16, an embodiment of a cable routing device 1600 is illustrated that may be utilized with the rack front-to-rear cable routing system of the present disclosure. As discussed below, the cable routing device 1600 may be configured to be guided via any of the cable routing device guide subsystems provided by the cable routing device guide elements 1504*c* and 1504*d* in order to move a cable through any of the plurality of protected cable conduits 1504. The cable routing device 1600 includes a base 1602. The base 1602 includes a top surface 1602*a*, a bottom surface 1602*b* that is located opposite the base 1602 from the top surface 1602*a*, a front surface 1602*c* that extends between the top surface 1602*a* and the bottom surface 1602*b*, a rear surface 1602*d* that extends between the top surface 1602*a* and the bottom surface 1602*b* that is located opposite the base 1602 from the front surface 1602*c*, and a pair of side surfaces 1602*e* and 1602*f* that are located opposite one another on the base 1602 and that each extend between the top surface 1602*a*, the bottom surface 1602*b*, the front surface 1602*c*, and the rear surface 1602*d*. In some embodiments, the cable routing device 1600 may be constructed of rigid plastic, metal, and/or other materials that one of skill in the art in possession of the present disclosure would recognize as providing the strength necessary for the cable routing functionality described below.

As illustrated, the base 1602 may include a cable securing element 1604 that is located on the bottom surface 1602*b* adjacent the front surface 1602*c*, and that is configured to secure a cable to the cable routing device 1600 as discussed in further detail below. In some embodiments, the base 1602 may be configured to include cable securing elements similar to the cable securing element 1604 on both ends of the cable routing device 1600, as well as at position(s) along the length of the base 1602. The cable securing element 1604 may be provided by a plastic tab, Velcro® straps, elastic bands, and/or other similar types of materials that one of skill in the art in possession of the present disclosure would recognize as providing the cable securing a functionality described below. However, while a specific example of a cable securing element has been described, one of skill in the art in possession of the present disclosure will appreciate how the cable securing element 1604 may be provided in a variety of manners while remaining within the scope of the present disclosure as well.

Figure 17A:
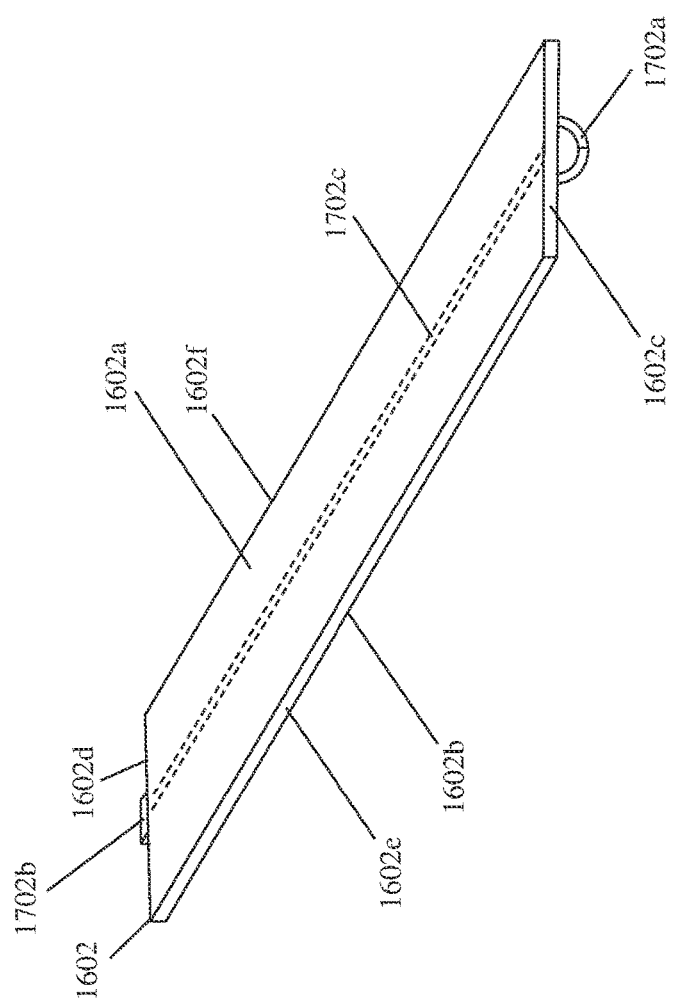
FIG. 17A is a perspective view illustrating an embodiment of the cable routing device of FIG. 16.
Figure 17B:
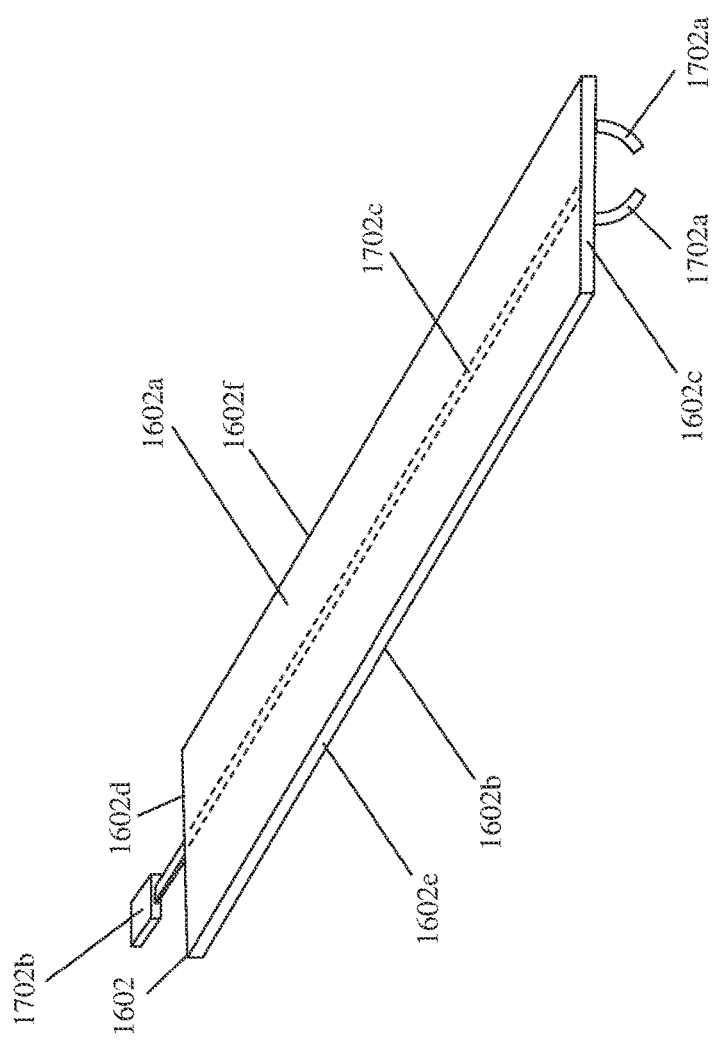
FIG. 17B is a perspective view illustrating an embodiment of the operation of the cable routing device of FIG. 17A.

Referring now to FIGS. 17A and 17B, an embodiment of a cable routing device 1700 is illustrated that is similar to the cable routing device 1600 discussed above, and thus similar components are provided with the same element numbers. Similarly as discussed above, the cable routing device 1700 may be utilized with the rack front-to-rear cable routing system of the present disclosure. In the illustrated embodiment, the base 1602 includes a cable release system that is configured to allow a user to secure a cable to, and remotely release that cable from, the cable routing device 1700. In the illustrated example, the base 1602 includes cable securing/release element 1702*a* that is located on the bottom surface 1602*b* of the base 1602 adjacent the front surface 1602*c*. In the specific example provided below, the cable securing/release element 1702*c* includes two sub-elements that define a cable securing housing, with the two sub-elements configured to move relative to each other and separate in order allow access to the cable securing housing.

The base 1602 includes a cable securing/release actuator 1702*b* that is located on the rear surface 1602*d* of the base 1602 and opposite the base 1602 from the cable securing/release element 1702*a*, and that is coupled to the cable securing/release element 1702*a* via a linkage 1702*c*. As can be seen in FIGS. 17A and 17B, the cable securing/release actuator 1702*b* may be configured to be grasped by a user and pulled away from the base 1602 to actuate the cable securing/release element 1702*a* via the linkage 1702*c* in order to cause the sub-elements on the cable securing/release element 1702*a* to move relative to each other and separate (as illustrated in FIG. 17B) in order allow a cable to be positioned in the cable securing housing, and the cable securing/release actuator 1702*b* may then be moved towards the base 1602 to actuate the cable securing/release element 1702*a* via the linkage 1702*c* in order to cause the sub-elements on the cable securing/release element 1702*a* to move relative to and adjacent each other (as illustrated in FIG. 17A) in order secure the cable in the cable securing housing. In a specific example, the linkage 1702*c* may include springs or other resilient members that are configured to bias the sub-elements on the cable securing/release element 1702*a* into the orientation illustrated in FIG. 17A. However, while a specific example of a cable routing device has been described, one of skill in the art in possession of the present disclosure will appreciate how other devices that can route cables through a cable guide system may be utilized with the front-to-rear cable routing system of the present disclosure while remaining within the scope of the present disclosure.

Figure 18:
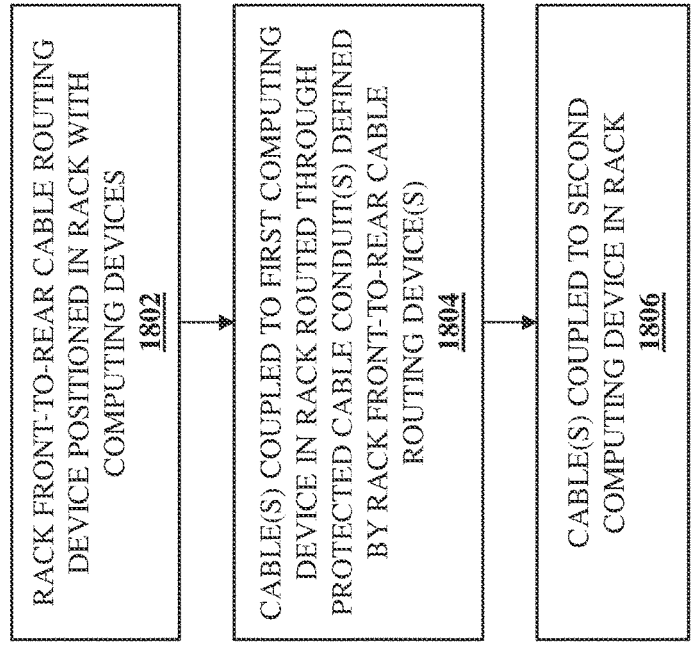
FIG. 18 is a flow chart illustrating an embodiment of a method for rack front-to-rear cable routing.

Referring now to FIG. 18, an embodiment of a method 1800 for rack front-to-rear-cable routing is illustrated. As discussed below, the systems and methods of the present disclosure provide a front-to-rear cable routing device defining protected cable conduits through which cables may be routed between ports on computing devices that are accessible via a "front" side of a rack, and ports on computing devices that are accessible via a "rear" side of the rack. For example, the rack front-to-rear cable routing system of the present disclosure may include a rack that defines a rack entrance and a rack exit, and a plurality of computing device housings between the rack entrance and rack exit. A plurality of computing devices are each positioned in a respective computing device housing. A rack front-to-rear cable routing device is positioned in one of the computing device housings and defines a plurality of protected cable conduits that extend between the rack entrance to the rack exit. A first cable is coupled to each of the plurality of computing devices and extends through a first protected cable conduit. As such, cables may be routed from front-to-rear in a rack in a protected manner that eliminates the issues with conventional front-to-rear cable routing discussed above.

Figure 19:
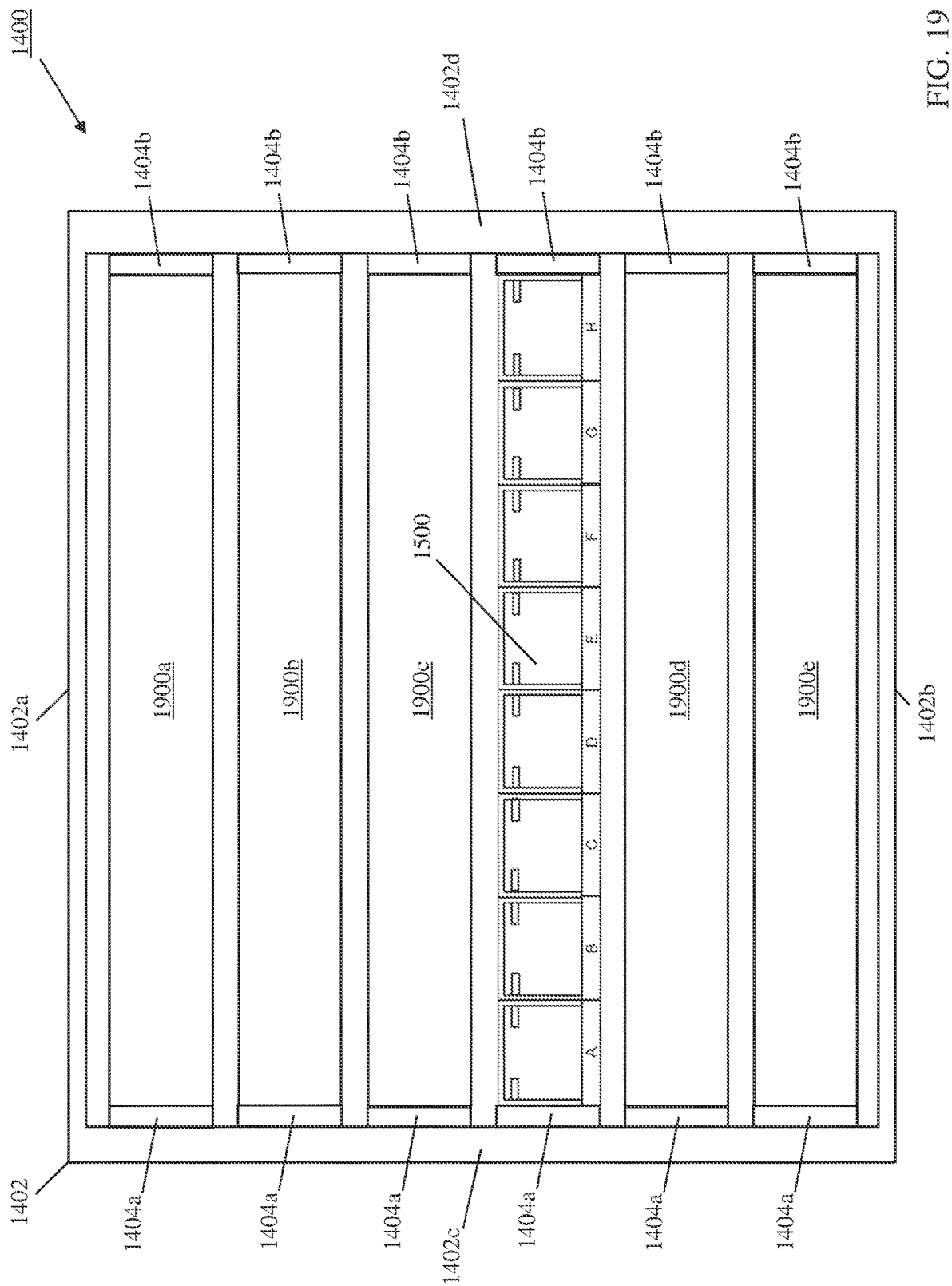
FIG. 19 is a schematic front view illustrating an embodiment of the rack front-to-rear cable routing device of FIGS. 15A and 15B included in the rack of FIG. 14 with a plurality of computing devices to provide the rack front-to-rear cable routing system of the present disclosure during the method of FIG. 18.

The method 1800 begins at block 1802 where a rack front-to-rear cable routing device is positioned in a rack with a plurality of computing devices. With reference to FIG. 19, in an embodiment of block 1802, the rack front-to-rear cable routing device 1500 discussed above with reference to FIGS. 15A and 15B may be positioned in one of the computing device housing volume 1406c in the computer device housing 1406 discussed above with reference to FIG. 14 by coupling the rack front-to-rear cable routing device 1500 to a respective pair of computing device mounting subsystems 1404a and 1404b that define that computing device housing volume 1406c using techniques that would be apparent to one of skill in the art in possession of the present disclosure (e.g., by coupling the rack front-to-rear cable routing device 1500 to a respective pair of the READYRAIL® computing device mounting subsystems 1404a/1404b described above). A plurality of computing devices 1900a, 1900b, 1900c, 1900d, and 1900e may be positioned in respective computing device housing volumes 1406c in the computer device housing 1406 by coupling the plurality of computing devices 1900a-1900e to a respective pair of computing device mounting subsystems 1404a and 1404b in a similar manner as described above.

In the specific examples provided below, the computing device 1900d may be provided by a switch device that includes ports or other connectors on its "front" surface that are located adjacent the rack entrance 1404c of the rack 1400 when that switch device is positioned in the rack chassis 1402, while the computing devices 1900a, 1900b, 1900c, and 1900e may be provided by server devices and/or storage systems that include ports or other connectors on their "rear" surface that are located adjacent the rack exit 1404d of the rack 1400 when those server devices and storage systems are positioned in the rack chassis 1402. However, while specific computing devices have been described as being positioned in the rack, one of skill in the art in possession of the present disclosure will appreciate how other computing devices may be positioned in the rack while remaining within the scope of the present disclosure.

Figure 20A:
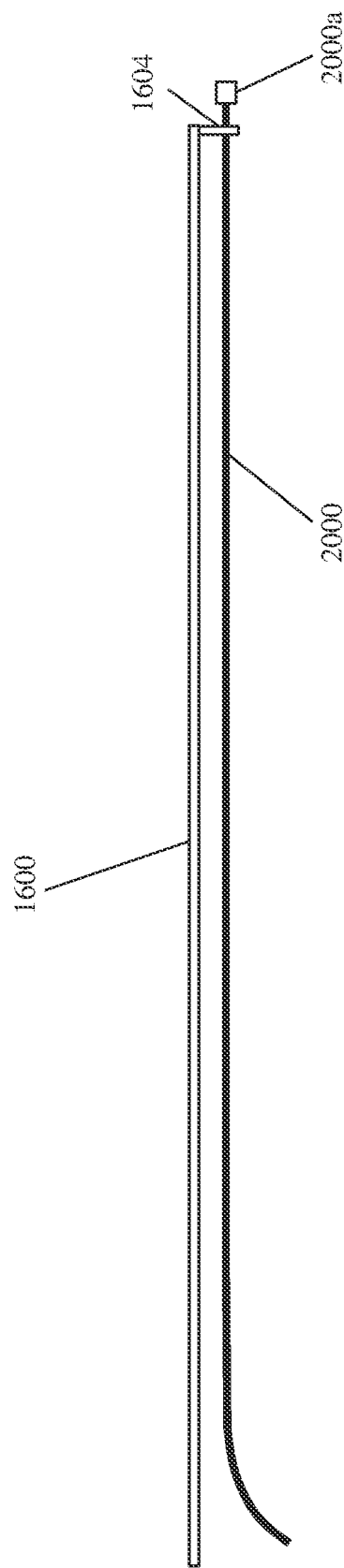
FIG. 20A is a schematic side view illustrating an embodiment of a cable coupled to the cable routing device of FIG. 16 during the method of FIG. 18.

The method 1800 then proceeds to block 1804 where at least one cable is coupled to a first computing device in the rack and routed through at least one protected cable conduit defined by the rack front-to-rear cable routing device. With reference to FIG. 20A, in an embodiment of block 1804, a cable 2000 may be coupled to the cable routing device 1600 discussed above with reference to FIG. 16. For example, a network technician, datacenter administrator, or other user may grasp the cable 2000 including a connector 2000a (e.g., that extends from the computing device 1900d as an integrated cable on that computing device 1900d, following its connection to a port on that computing device 1900d via a connector that is opposite the cable 2000 from the connector 2000a, or prior to its connection to a port on that computing device 1900d via a connector that is opposite the cable 2000 from the connector 2000a), and secure that cable 2000 to the cable securing element 1604 included on the cable routing device 1600 by positioning the connector 2000a in the cable securing element 1604 (e.g., securing the cable 2000 to the cable routing device 1600 with the plastic tab, Velcro® straps, elastic bands, or other securing elements discussed above).

In another example, a network technician, datacenter administrator, or other user may couple the cable 2000 including the connector 2000a to the cable routing device 1700 discussed above with reference to FIG. 17. Similarly as discussed above, the user may move the cable securing/release actuator 1702b that is located on a rear surface 1602d of the base 1602 of the cable routing device 1700 away from the base 1602 to actuate the cable securing/release element 1702a via the linkage 1702c to cause sub-elements on the cable securing/release element 1702a to move relative to each other and separate (an example of which can be seen in FIG. 17B) in order allow the cable 2000 to be positioned in the cable securing housing, and the cable securing/release actuator 1702b may then be moved towards the base 1602 to actuate the cable securing/release element 1702a via the linkage 1702c in order to cause the sub-elements on the cable securing/release element 1702a to move relative to and adjacent each other (an example of which can be seen in FIG. 17A) in order secure the cable in the cable securing housing.

Figure 20B:
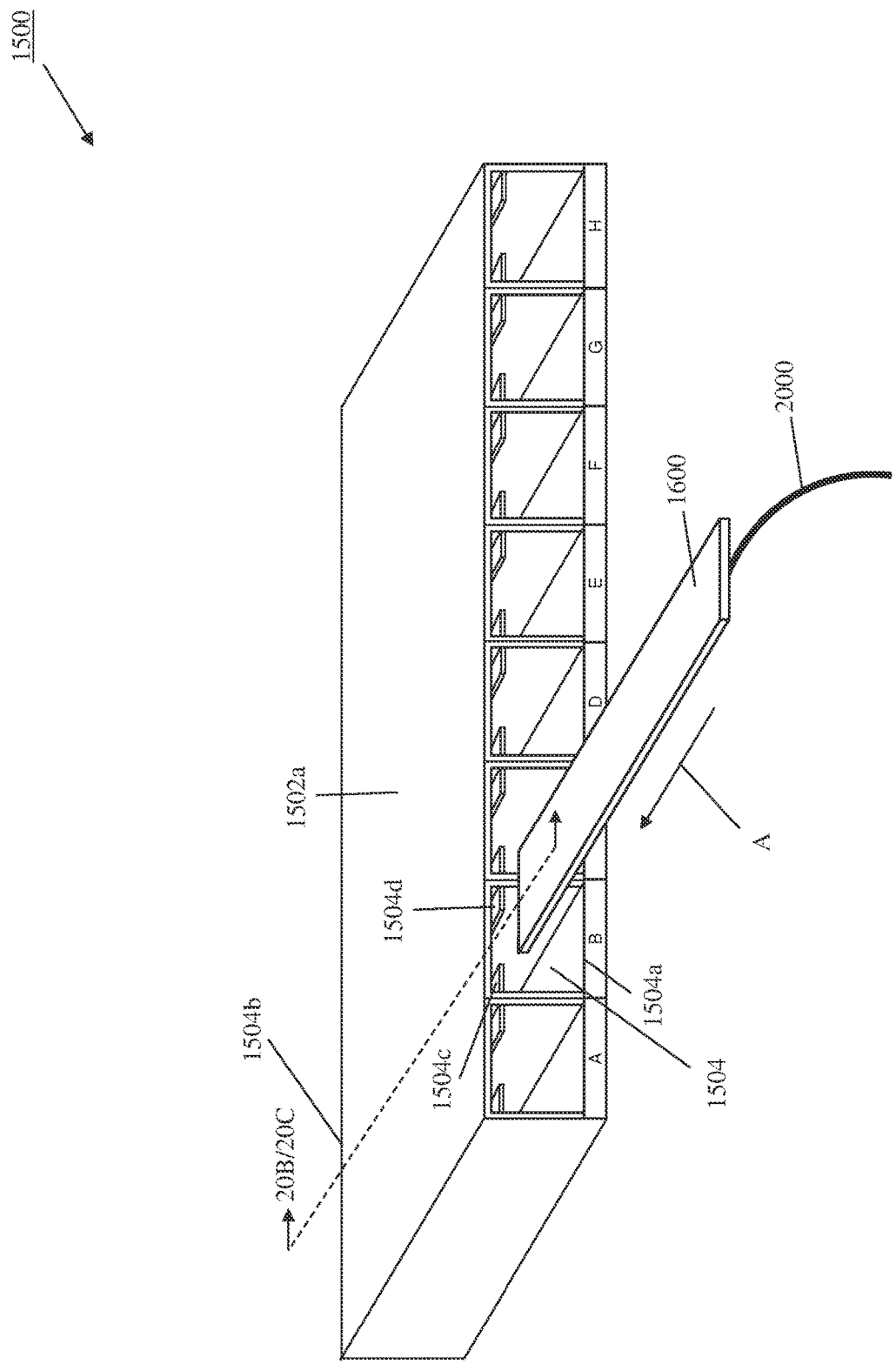
FIG. 20B is a perspective view illustrating an embodiment of the cable routing device of FIG. 20A routing a cable via the rack front-to-rear cable routing system of FIG. 19 during the method of FIG. 18.

With reference to FIG. 20B, in an embodiment of block 1804, the cable routing device 1600 may be positioned in a protected cable conduit 1504 (e.g., from the "front" rack entrance 1404c of the rack 1400 in this example). For example, a network technician, datacenter administrator, or other user may position the cable routing device 1600 including the attached cable 2000 adjacent the protected cable conduit entrance 1504a of one of the protected cable conduits (i.e., the protected cable conduit "B" in the example provided in FIG. 20B) such that the front surface 1602c on the base 1602 of the cable routing device 1600 is aligned with the volume of space between the pair of cable routing device guide elements 1504c and 1504d and the top surface 1502a of the rack front-to-rear cable routing device 1500. The cable routing device 1600 including the attached cable 2000 may then be moved in a direction A (as illustrated in FIG. 20B) such that it extends through the protected cable conduit entrance 1504a and into the protected cable conduit 1504 (i.e., the cable routing device 1600 is "pushed" through the protected cable conduit 1504 by the user) while engaging with the cable routing device guide elements 1504c and 1504d such that the cable routing device 1600 is guided via the volume of space between the cable routing device guide elements 1504c and 1504d and the top surface 1502a of the rack front-to-rear cable routing device 1500 toward the protected cable conduit exit 1504b (as illustrated in FIG. 20C).

As will be appreciated by one of skill in the art in possession of the present disclosure, in some embodiments, as the user moves the cable routing device 1600 with the attached cable 2000 through the protected cable conduit 1504, the user may secure portions of the cable 2000 to any of the plurality of cable securing elements 1508 discussed above with reference to FIG. 15C that may be provided anywhere along the length of the protected cable conduit 1504. However, while a specific example has been described of "pushing" the cable routing device 1600/cable 2000 through the cable conduit 1504, one of skill in the art in possession of the present disclosure will appreciate how the cable routing device 1600/cable 2000 may also be "pulled" through the cable conduit 1504 by a user in a similar manner as described above after, for example, the cable routing device 1600 has been positioned in and moved through the protected cable conduit 1504 (e.g., into via the cable routing device guide subsystem in that protected cable conduit 1504) and then had the cable 2000 attached thereto.

Figure 20D:
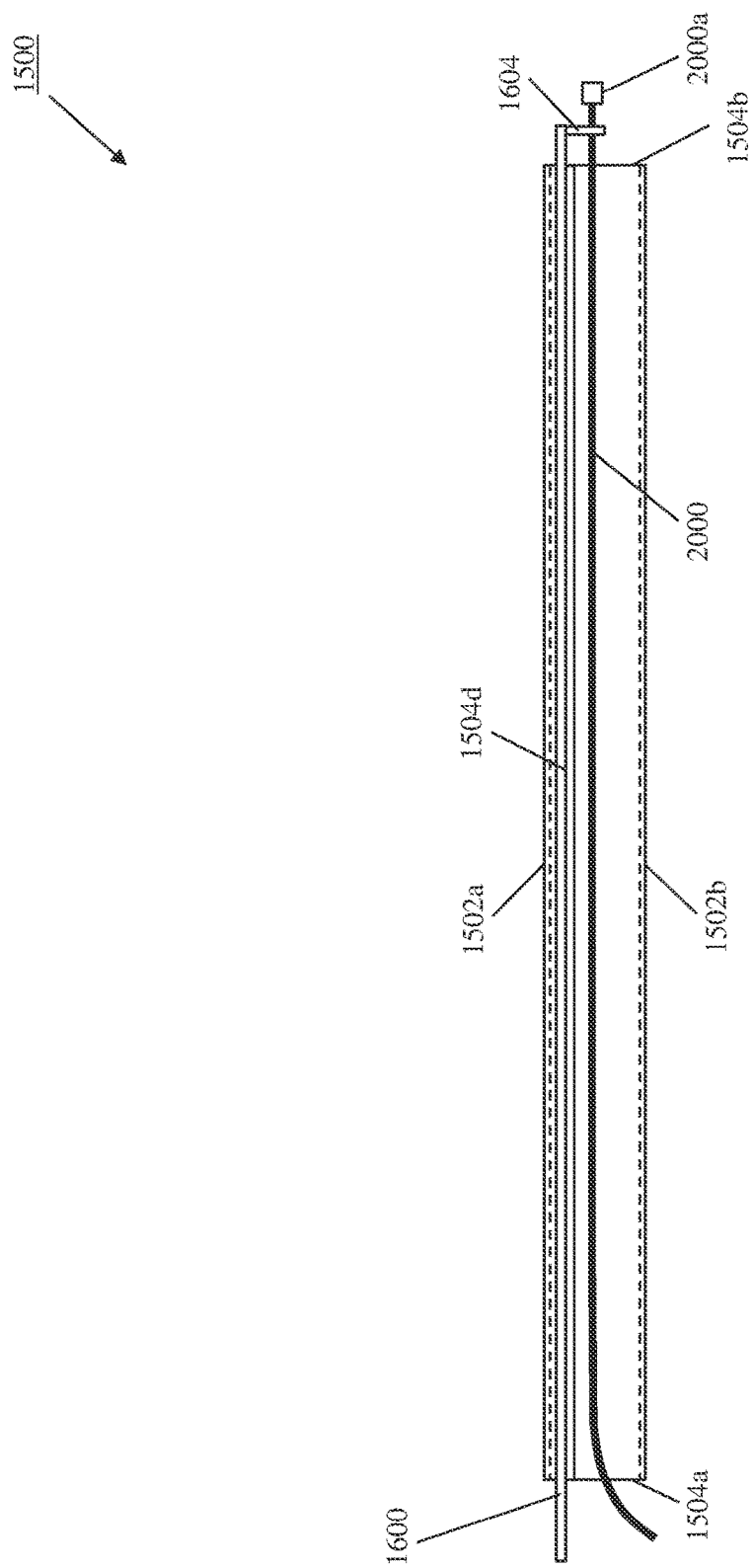
FIG. 20D is a schematic side view illustrating an embodiment of the cable routing device of FIG. 20A routing a cable via the rack front-to-rear cable routing system of FIG. 19 during the method of FIG. 18.
Figure 20E:
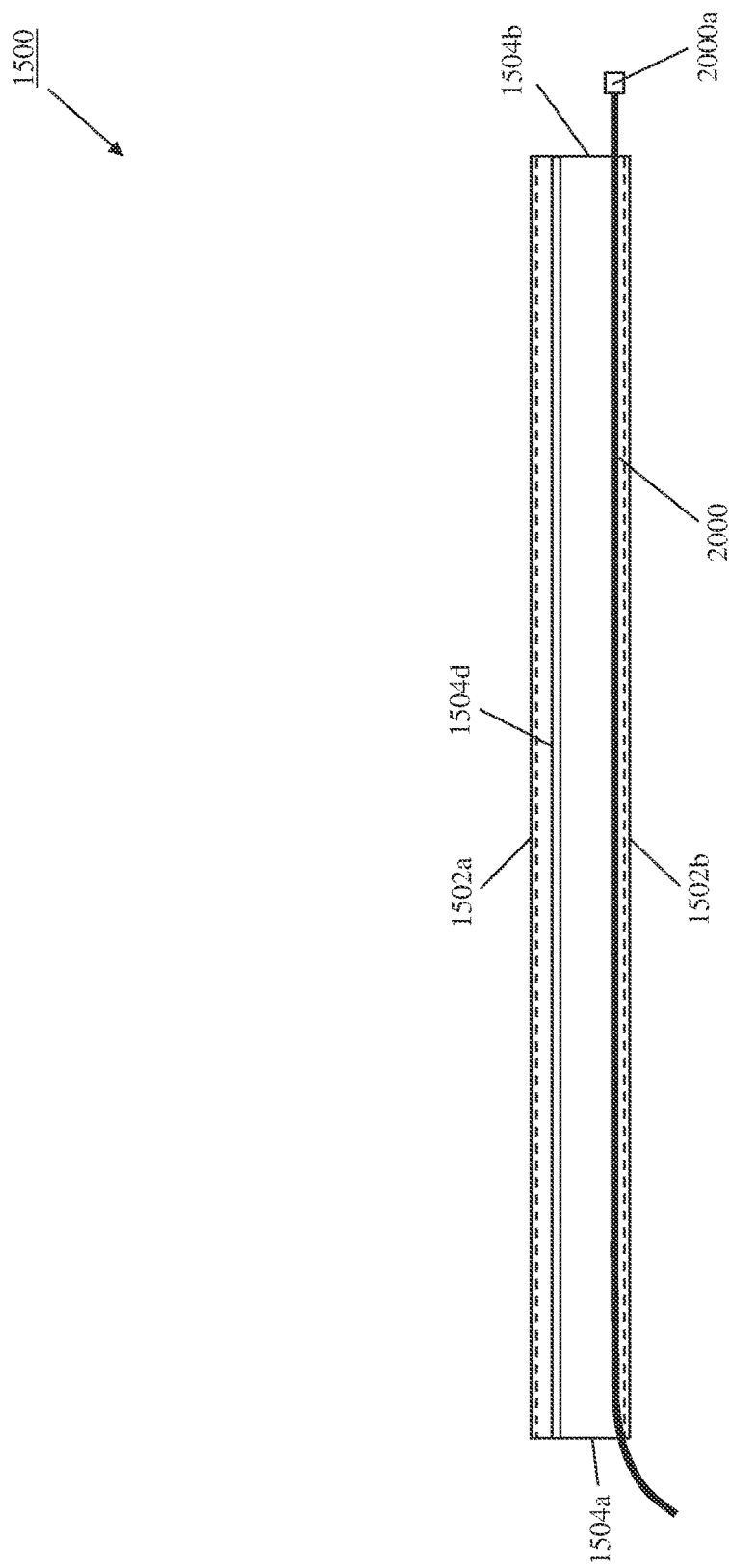
FIG. 20E is a schematic side view illustrating an embodiment of a cable being routed using the rack front-to-rear cable routing system of FIG. 19 during the method of FIG. 18.

With reference to FIGS. 20D and 20E, the network technician, datacenter administrator, or other user may continue to move the cable routing device 1600 through the protected cable conduit 1504 towards the protected cable conduit exit 1504b on the protected cable conduit 1504 until the connector 2000a on the cable 2000 is either located adjacent the protected cable conduit exit 1504b on the protected cable conduit 1504, or moves out of the protected cable conduit exit 1504b on the protected cable conduit 1504 as illustrated in FIG. 20D. In some embodiments, following the cable routing device 1600 and the connector 2000a being located adjacent or moving through the protected cable conduit exit 1504b, the cable 2000 may be unsecured from the cable routing device 1600, as illustrated in FIG. 20E. For example, in situations where a single user is routing cables through the protected cable conduit 1504 and following the connector 2000a being located adjacent or moving through the protected cable conduit exit 1504b, that user may then move to the "rear" rack exit 1404d of the rack 1400 in order to unsecure the cable 2000 from the cable routing device 1600.

In another example, in situations where two users are routing the cable 2000 through the protected cable conduit 1504, the first user may be positioned at the "front" rack entrance 1404c of the rack 1400 to move the cable routing device 1600 through the protected cable conduit 1504 as discussed above, while the second user may be positioned at the "rear" rack exit 1404d of the rack 1400 to unsecure the cable 2000 from the cable routing device 1600 following the cable 2000 and the connector 2000a being located adjacent or moving through the protected cable conduit exit 1504. In yet another example, in situations where only one user is routing the cable 2000 through the protected cable conduit 1504 using the cable routing device 1700, following the user moving the cable 2000 and the connector 2000a through the protected cable conduit exit 1504b, the user may actuate the cable securing/release actuator 1702b as discussed above to cause the sub-elements on the cable securing/release element 1702a to move relative to each other and separate in order allow the cable 2000 to be unsecured from the cable routing device 1700.

As will be appreciated by one of skill in the art in possession of the present disclosure, in situations when the cable routing device 1600 is not being utilized to route cables through the protected cable conduits 1504 by a user, the cable routing device 1600 may be stored in the cable routing device guide subsystem in any of the protected cable conduits 1504 (e.g., in the volume of space between the cable routing device guide elements 1504c and 1504d and the top surface 1502a of the of the rack front-to-rear cable routing device 1500 in that cable routing device guide subsystem). However, while several specific examples have been discussed of routing an individual cable 2000 through the protected cable conduits 1504, one of skill in the art in possession of the present disclosure will appreciate how a plurality of cables may be routed through protected cable conduits in a similar manner while remaining within the scope of the present disclosure.

Figure 21A:
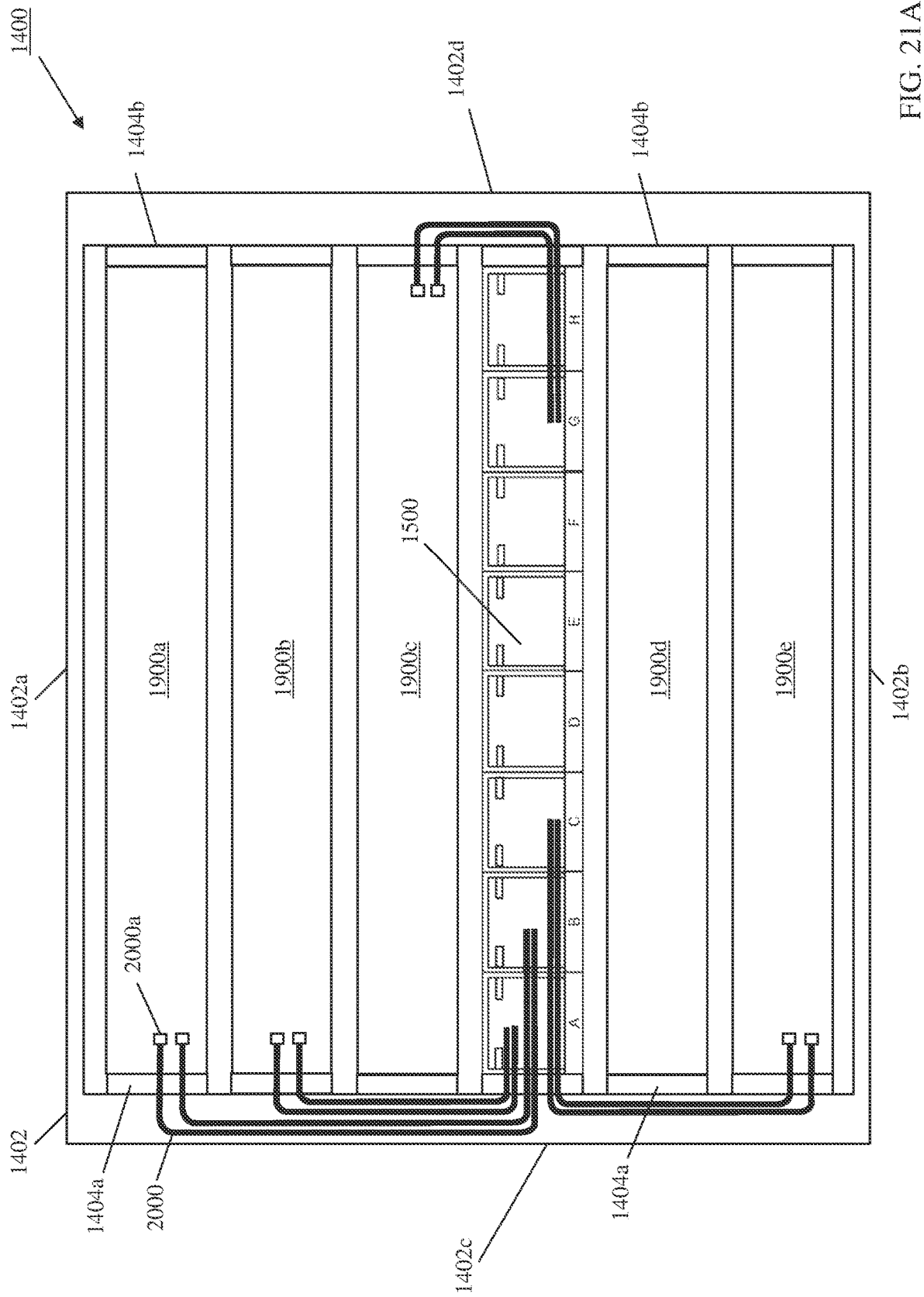
FIG. 21A is a schematic front view illustrating an embodiment of cables routed using the rack front-to-rear cable routing system of FIG. 19 during the method of FIG. 18.
Figure 21B:
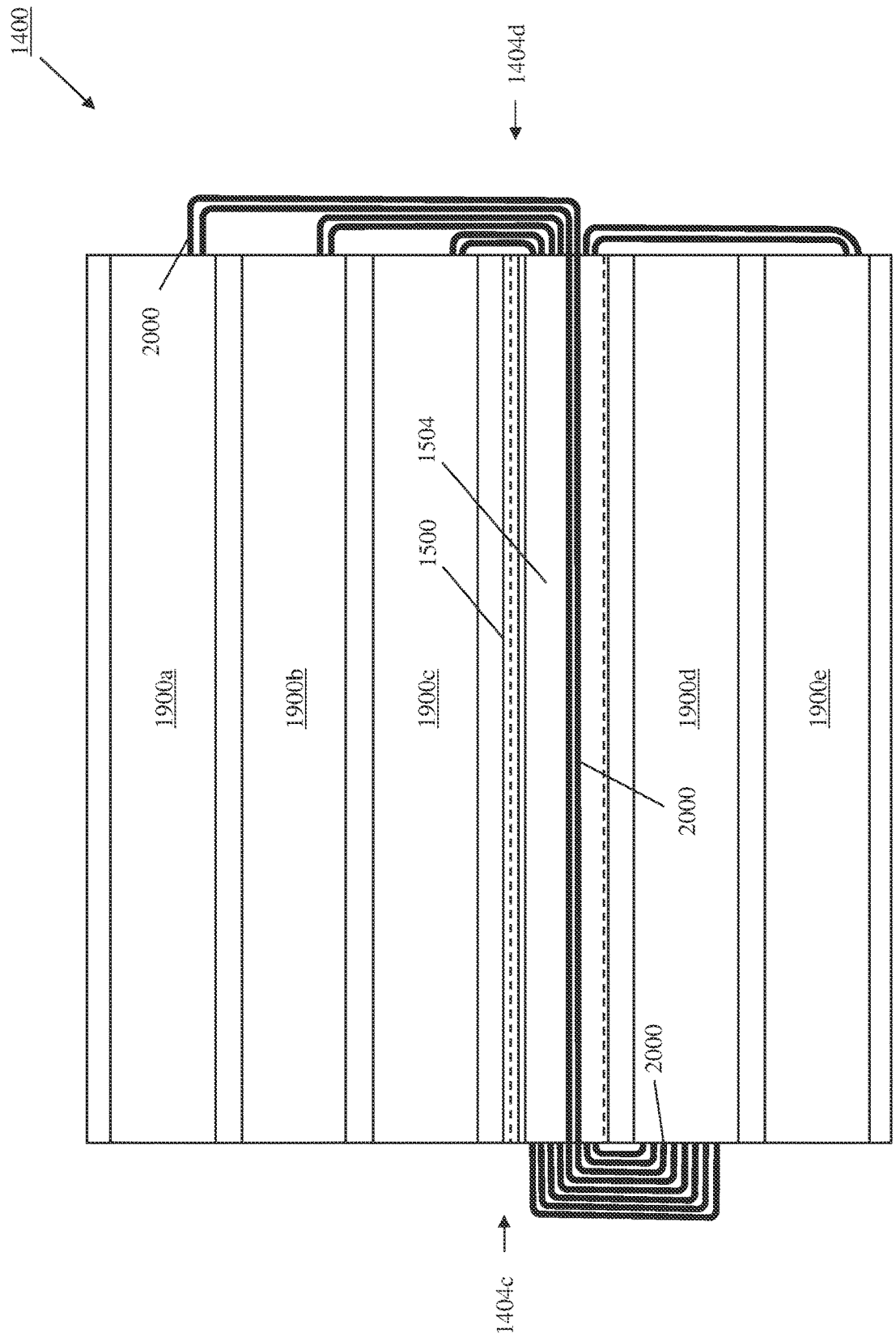
FIG. 21B is a schematic side view illustrating an embodiment of cables routed using the rack front-to-rear cable routing system of FIG. 19 during the method of FIG. 18.

The method 1800 then proceeds to block 1806 where the least one cable is coupled to a second computing device in the rack. With reference to FIGS. 21A and 21B, in an embodiment of block 1806 and following the routing of cables through the protected cable conduits 1504 using the cable routing device 1600 and unsecuring those cables from the cable routing device 1600, the computing devices 1900a-1900c and 1900e may be cabled to the computing device 1900d by the cables that are routed "front-to-rear" on the rack 1400 via the rack front-to-rear cable routing device 1500, with those cables connected to ports on the computing device 1900d adjacent the "front" rack entrance 1404c and ports on computing devices 1900a-1900c and 1900e adjacent the "rear" rack exit 1404d. In a specific example, as illustrated in FIGS. 21A and 21B, the cable 2000 including the connector 2000a that extends from the computing device 1900d (e.g., a switch device) is routed from the "front" rack entrance 1404c via the protected cable conduit 1504 having the protected cable conduit identifier "B" defined by the rack front-to-rear cable routing device 1500 to the "rear" rack exit 1404d and is coupled to the computing device 1900a by securing the connector 2000a to a port on the computing device 1900a. As can be seen in FIGS. 21A and 21B, other cables may be similarly routed from the computing device 1900d to any of the plurality of computing devices 1900a, 1900b, 1900c, and 1900e via other protected cable conduits 1504 (e.g., routed through the protected cable conduits 1504 having the protected cable conduit identifiers "A", "C", "D", "E", "F", "G", and "H") defined by the rack front-to-rear cable routing device 1500.

As will be appreciated by one of skill in the art in possession of the present disclosure, once the computing devices 1900a-1900e have been cabled together as described above, the protected cable conduit identifiers may be used to allow any cable that connects computing devices in the front-to-rear manner described above to be identified both at the "front" rack entrance 1404c and the "rear" rack exit 1404d of the rack chassis 1402 by, for example, identifying the protected cable conduit identifier for a protected cable conduit 1504 that houses a cable at the "rear" rack exit 1404d of the rack chassis 1402, and then finding that protected cable conduit identifier for the protected cable conduit that house that cable at the "front" rack entrance 1404c of the rack chassis 1402, which one of skill in the art in possession of the present disclosure will appreciate assures a network technician, datacenter administrator, or other user that the cable included in that protected cable conduit is the cable of interest. However, while FIGS. 21A and 21B illustrate an example of a single computing device (e.g., a switch device) connected to a plurality of computing devices (e.g., server devices and/or storage systems), one of skill in the art in possession of the present disclosure will appreciate how different combinations of devices may be connected in other configurations via the rack front-to-rear cable routing device 1500 of the present disclosure while remaining within the scope of the present disclosure as well.

Thus, systems and method have been described that provide racks with front-to-rear cable routing devices defining protected cable conduits through which cables may be routed between ports on computing devices that are accessible via a "front" side of the rack, and ports on computing devices that are accessible via a "rear" side of the rack. For example, the rack front-to-rear cable routing system of the present disclosure may include a rack that defines a rack entrance and a rack exit, and a plurality of computing device housings between the rack entrance and rack exit. A plurality of computing devices are each positioned in a respective computing device housing. A rack front-to-rear cable routing device is positioned in one of the computing device housings and defines a plurality of protected cable conduits that extend between the rack entrance to the rack exit. A first cable is coupled to each of the plurality of computing devices and extends through a first protected cable conduit. As such, cables may be routed from front-to-rear in a rack in a protected manner that eliminates the issues with conventional front-to-rear cable routing discussed above.

One of skill in the art in possession of the present disclosure will recognize that the system of the present disclosure provides multiple benefits including efficient cable installations, easier cable identification, avoiding cable bunching, distributed weight of cabling, lessening cable weight stress on cable connectors, easier removal of cables, more efficient cable connection troubleshooting, more efficient tracing of individual cables, logical grouping of cables, and/or other benefits.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A rack front-to-rear cable routing system, comprising:
   a rack that defines a rack entrance and a rack exit;
   a plurality of computing device housings that are defined by the rack between the rack entrance and the rack exit and that each provide an at least one rack unit (1RU) housing adjacent a respective mounting system on the rack that is configured to support a computing device in that computing device housing;
   a rack front-to-rear cable routing device positioned in one of the plurality of computing device housings via the respective mounting system adjacent that computing device housing, wherein the rack front-to-rear cable routing device defines a plurality of protected cable conduits that extend between the rack entrance to the rack exit;
   a plurality of computing devices that are each positioned in a respective computing device housing included in the plurality of computing device housings via the respective mounting system adjacent that computing device housing; and
   a first cable that is coupled to each of the plurality of computing devices and that extends through a first protected cable conduit included in the plurality of protected cable conduits defined by the rack front-to-rear cable routing device.

2. The system of claim 1, wherein the rack front-to-rear cable routing device includes a respective protected cable conduit identifier located adjacent an entrance of each of the plurality of protected cable conduits.

3. The system of claim 1, wherein each of the plurality of protected cable conduits includes at least one cable securing member that is configured to secure a cable in that protected cable conduit.

4. The system of claim 1, wherein the rack front-to-rear cable routing device includes an air-flow blocking system that is configured to block airflow through the plurality of protected cable conduits.

5. The system of claim 1, further comprising:
   a cable routing device that is configured to route a cable through any of the plurality of protected cable conduits.

6. The system of claim 5, wherein the cable routing device includes a cable securing subsystem that is configured to secure a cable to the cable routing device.

7. The system of claim 1, wherein each of the plurality of protected cable conduits includes a cable routing device guide subsystem that is configured to guide the cable routing device through that protected cable conduit.

8. A rack front-to-rear cable routing device, comprising:
   a rack front-to-rear cable routing device chassis that defines a rack front-to-rear cable routing device chassis entrance and a rack front-to-rear cable routing device chassis exit, and that is configured to be positioned in any of a plurality of computing device housings that are defined by a rack and that each provide an at least one rack unit (1RU) housing adjacent a respective mounting system on the rack that is configured to support a computing device in that computing device housing; and
   a plurality of protected cable conduits that are defined by the rack front-to-rear cable routing device chassis and that each extend between the rack front-to-rear cable routing device chassis entrance and the rack front-to-rear cable routing device chassis exit, wherein each of the plurality of protected cable conduits is configured, when the rack front-to-rear cable routing device chassis is positioned in a first computing device housing included in the plurality of computing device housings defined by the rack via the respective mounting system adjacent that first computing device housing, to house a cable that is coupled to a plurality of computing devices that are positioned in respective second computing device housings defined by the rack.

9. The system of claim 8, wherein the rack front-to-rear cable routing device includes a respective protected cable conduit identifier located adjacent an entrance of each of the plurality of protected cable conduits.

10. The system of claim 8, wherein each of the plurality of protected cable conduits includes at least one cable securing member that is configured to secure a cable in that protected cable conduit.

11. The system of claim 8, wherein the rack front-to-rear cable routing device includes an air-flow blocking system that is configured to block air-flow through the plurality of protected cable conduits.

12. The system of claim 8, further comprising:
   a cable routing device that is configured to route a cable through any of the protected cable conduits.

13. The system of claim 8, wherein each of the plurality of protected cable conduits includes a respective cable routing device guide subsystem that is configured to guide the cable routing device through that protected cable conduit.

14. A method for rack front-to-rear cable routing, comprising:
   housing, by a first computing device housing included in a plurality of computing device housings that are defined by a rack and that each provide an at least one rack unit (1RU) housing adjacent a respective mounting system on the rack that is configured to support a computing device in that computing device housing, a rack front-to-rear cable routing device that defines a plurality of protected cable conduits that extend from a rack entrance defined by the rack to a rack exit defined by the rack with the rack front-to-rear cable routing device positioned in the first computing device housing via the respective mounting system adjacent that first computing device housing;

housing, by respective second computing device housings included in the plurality of computing device housings that are defined by the rack, a first computing device and a second computing device;

receiving, at the rack entrance by a first protected cable conduit included in the plurality of protected cable conduits, a first cable that is coupled to the first computing device; and routing, by the first protected cable conduit, the first cable along a length of the first protected cable conduit such that the first cable extends from the rack exit and is coupled to the second computing device.

15. The method of claim 14, wherein the rack front-to-rear cable routing device includes a respective protected cable conduit identifier located adjacent an entrance of each of the plurality of protected cable conduits.

16. The method of claim 14, further comprising:
securing, by at least one cable securing member that is included in the first protected cable conduit, a cable.

17. The method of claim 14, further comprising:
blocking, by an air-flow blocking system that is included in the rack front-to-rear cable routing device, air-flow through the plurality of protected cable conduits.

18. The method of claim 14, wherein the receiving the first cable at the rack entrance by the first protected cable conduit and the routing of the first cable along the length of the first protected cable conduit such that the first cable extends from the rack exit further comprises:
moving, by a cable routing device, the first cable through the rack entrance and the first protected cable conduit.

19. The method of claim 18, further comprising:
securing, by a cable securing subsystem included in the cable routing device, the first cable to the cable routing device.

20. The method of claim 14, further comprising:
guiding, by a cable routing device guide subsystem included in of the first protected cable conduit, the cable routing device through the first protected cable conduit.

* * * * *